(12) United States Patent
Ohuchi et al.

(10) Patent No.: US 8,981,361 B2
(45) Date of Patent: Mar. 17, 2015

(54) ORGANIC ELECTROLUMINESCENCE DISPLAY PANEL WITH TUNGSTEN OXIDE CONTAINING HOLE INJECTION LAYER THAT ELECTRICALLY CONNECTS ELECTRODE TO AUXILIARY WIRING, AND ORGANIC ELECTROLUMINESCENCE DISPLAY DEVICE

(75) Inventors: Satoru Ohuchi, Osaka (JP); Takahiro Komatsu, Osaka (JP); Ryuuta Yamada, Kyoto (JP); Hirofumi Fujita, Ehime (JP); Shinya Fujimura, Osaka (JP); Seiji Nishiyama, Osaka (JP); Kenichi Nendai, Hyogo (JP); Kou Sugano, Osaka (JP); Shuhei Yada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/000,977

(22) PCT Filed: Nov. 18, 2011

(86) PCT No.: PCT/JP2011/006448
§ 371 (c)(1),
(2), (4) Date: Aug. 22, 2013

(87) PCT Pub. No.: WO2012/114403
PCT Pub. Date: Aug. 30, 2012

(65) Prior Publication Data
US 2013/0328039 A1 Dec. 12, 2013

(30) Foreign Application Priority Data
Feb. 25, 2011 (JP) .................. 2011-040760

(51) Int. Cl.
*H01L 27/32* (2006.01)
*H01L 33/36* (2010.01)
(Continued)

(52) U.S. Cl.
CPC ........ *H01L 27/3297* (2013.01); *H01L 27/3244* (2013.01); *H01L 51/5088* (2013.01); *H01L 51/5212* (2013.01); *H01L 51/5228* (2013.01)
USPC .............................................. 257/40; 257/99

(58) Field of Classification Search
CPC .................................................... H01L 27/3297
See application file for complete search history.

(56) References Cited

U.S. PATENT DOCUMENTS

| 5,294,869 A | 3/1994 | Tang et al. |
| 5,443,922 A | 8/1995 | Nishizaki et al. |

(Continued)

FOREIGN PATENT DOCUMENTS

| EP | 2175504 | 4/2010 |
| JP | 05-163488 A | 6/1993 |

(Continued)

OTHER PUBLICATIONS

United States Office Action in U.S. Appl. No. 13/742,575, dated Mar. 14, 2014.

(Continued)

*Primary Examiner* — Stephen W Smoot
(74) *Attorney, Agent, or Firm* — Greenblum & Bernstein, P.L.C.

(57) ABSTRACT

A hole injection layer and a second electrode are both formed to be continuous above a first electrode and above an auxiliary wiring. The hole injection layer contains a tungsten oxide. An UPS spectrum, obtained from a UPS measurement, has a protrusion appearing near a Fermi surface and within a region corresponding to a binding energy range lower than a top of a valence band, and the tungsten oxide satisfies a condition, determined from an XPS measurement, that a ratio in a number density of atoms other than tungsten atoms and oxygen atoms to the tungsten atoms does not exceed 0.83.

26 Claims, 37 Drawing Sheets

(51) Int. Cl.
*H01L 51/52* (2006.01)
*H01L 51/50* (2006.01)

(56) References Cited

U.S. PATENT DOCUMENTS

| | | |
|---|---|---|
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 7,785,718 B2 | 8/2010 | Yatsunami et al. |
| 8,664,669 B2 * | 3/2014 | Ohuchi et al. ............ 257/88 |
| 8,829,510 B2 * | 9/2014 | Komatsu et al. ........... 257/40 |
| 8,884,276 B2 * | 11/2014 | Komatsu et al. ........... 257/40 |
| 8,884,281 B2 * | 11/2014 | Ohuchi et al. ............ 257/40 |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0178414 A1 | 9/2004 | Frey et al. |
| 2005/0064633 A1 | 3/2005 | Mikoshiba |
| 2005/0170208 A1 | 8/2005 | Yatsunami et al. |
| 2005/0208206 A1 | 9/2005 | Yoshikawa |
| 2005/0266763 A1 | 12/2005 | Kimura et al. |
| 2006/0008931 A1 | 1/2006 | Lee et al. |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029524 A1 | 2/2007 | Nakamura et al. |
| 2007/0034864 A1 | 2/2007 | Liu |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0150422 A1 | 6/2008 | Ohara |
| 2008/0231179 A1 | 9/2008 | Abe et al. |
| 2008/0312437 A1 | 12/2008 | Inoue et al. |
| 2009/0115318 A1 | 5/2009 | Gregory et al. |
| 2009/0160325 A1 | 6/2009 | Yatsunami et al. |
| 2009/0200917 A1 | 8/2009 | Yamagata et al. |
| 2009/0243478 A1 | 10/2009 | Shoda et al. |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2010/0102310 A1 | 4/2010 | Komatsu et al. |
| 2010/0181554 A1 | 7/2010 | Yoshida et al. |
| 2010/0213827 A1 | 8/2010 | Yoshida et al. |
| 2010/0258833 A1 | 10/2010 | Okumoto et al. |
| 2010/0302221 A1 | 12/2010 | Okumoto |
| 2011/0042703 A1 | 2/2011 | Okumoto et al. |
| 2011/0140091 A1 | 6/2011 | Friend et al. |
| 2012/0061656 A1 | 3/2012 | Ohuchi et al. |
| 2012/0132935 A1 | 5/2012 | Isobe et al. |
| 2012/0178191 A1 | 7/2012 | Sakanoue et al. |
| 2013/0126846 A1 * | 5/2013 | Harada et al. ............ 257/40 |
| 2013/0140543 A1 * | 6/2013 | Harada et al. ............ 257/40 |

FOREIGN PATENT DOCUMENTS

| | | |
|---|---|---|
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| JP | 2011-044445 | 3/2011 |
| WO | 2008/120714 A1 | 10/2008 |
| WO | 2008/149498 A1 | 12/2008 |
| WO | 2008/149499 A1 | 12/2008 |
| WO | 2009/107323 | 9/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

Meyer et al., "Charge generation layers comprising transition metal-oxide/organic interfaces: Electronic structure and charge generation mechanism", Applied Physics Letters, 96, 193302, pp. 1-3 (May 2010).

Elam et al., "Nucleation and growth during tungsten atomic layer deposition on $SiO_2$ surfaces", Thin Solid Films, 386, pp. 41-52 (2001).

United States Office Action in U.S. Appl. No. 13/746,474, dated Apr. 11, 2014.

United States Office Action in U.S. Appl. No. 13/742,575, dated Jul. 17, 2014.

United States Notice of Allowance in U.S. Appl. No. 13/742,575, dated Sep. 30, 2014.

(56) References Cited

OTHER PUBLICATIONS

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films: a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12, No. 4, pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

United States Office Action in U.S. Appl. No. 13/360,984, dated Mar. 1, 2013.

U.S. Appl. No. 13/360,984 to Satoru Ohuchi et al., which was filed on Jan. 30, 2012.

U.S. Appl. No. 13/736,285 to Seiji Nishiyama et al., which was filed on Jan. 8, 2013.

U.S. Appl. No. 13/742,575 to Kenji Harada et al., which was filed on Jan. 16, 2013.

U.S. Appl. No. 13/746,474 to Kenji Harada et al., which was filed on Jan. 22, 2013.

U.S. Appl. No. 13/995,205 to Takahiro Komatsu et al., which was filed on Jun. 18, 2013.

U.S. Appl. No. 13/660,291 to Takahiro Komatsu et al., which was filed on Oct. 25, 2011.

International Search Report in PCT/JP2010/004212, dated Aug. 3, 2010.

International Search Report in PCT/JP2010/004959, dated Nov. 9, 2010.

International Search Report in PCT/JP2010/004954, dated Sep. 7, 2010.

International Search Report in PCT/JP2010/004960, dated Nov. 9, 2010.

International Search Report in PCT/JP2012/000288, dated Apr. 17, 2012.

International Search Report in PCT/JP2011/006448, dated Feb. 21, 2012.

International Search Report in PCT/JP2012/000963, dated May 15, 2012.

United States Office Action in U.S. Appl. No. 13/360,984, dated Jun. 27, 2013.

United States Office Action in U.S. Appl. No. 13/746,474, dated Aug. 6, 2014.

China Office Action from State Intellectual Property Office (SIPO) in Chinese Patent Application No. 201080025874.2, dated Jan. 16, 2014, together with a partial English language translation.

\* cited by examiner

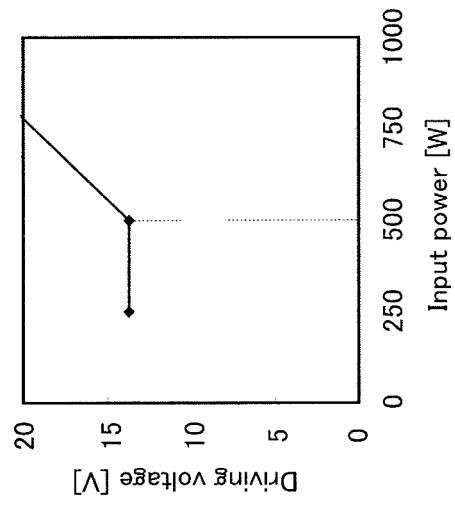
FIG.17A Dependence on total pressure
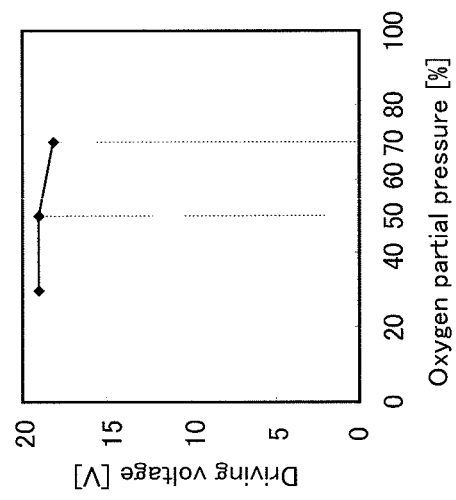
FIG.17B Dependence on oxygen partial pressure
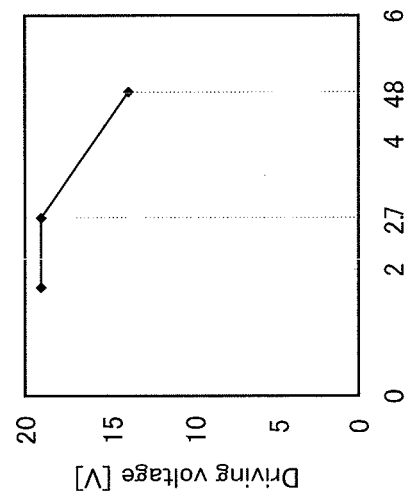
FIG.17C Dependence on input power (A: a case where an appropriate number of injection sites exists in the tungsten oxide layer)

(B, C: a case where there are no injection sites in the tungsten oxide layer and a case where there is a shortage of injection sites in the tungsten oxide layer)

US 8,981,361 B2

ORGANIC ELECTROLUMINESCENCE DISPLAY PANEL WITH TUNGSTEN OXIDE CONTAINING HOLE INJECTION LAYER THAT ELECTRICALLY CONNECTS ELECTRODE TO AUXILIARY WIRING, AND ORGANIC ELECTROLUMINESCENCE DISPLAY DEVICE

TECHNICAL FIELD

The present invention relates to an organic EL (electroluminescence) display panel and an organic EL display apparatus utilizing an organic electric-field light-emitting element (referred to hereinafter as an "organic EL element"), which is an electric light emitter.

BACKGROUND ART

In recent years, progress is being made in research and development of diverse functional elements which involve the use of an organic semiconductor. One typical example of a functional element is an organic EL element. An organic EL element is a current-driven light emitter, and commonly has a pair of electrodes, namely an anode and a cathode, and functional layers layered between the pair of electrodes. The functional layers include a light-emitting layer composed of an organic material. Upon application of voltage across the pair of electrodes, holes injected from the anode to the functional layers recombine with electrons injected from the cathode to the functional layers. The recombination causes the phenomenon of electroluminescence, which involves emission of light. Being self-luminescent, an organic EL element is highly visible. In addition, being completely solid, an organic EL element has excellent impact resistance. Owing to these advantages, more attention is being given to the applications of organic EL elements as a light emitter or a light source for various organic EL display panels and organic EL display apparatuses.

In order to increase the light emission efficiency of an organic EL element, efficient injection of carriers (holes and electrons) from the electrodes to the functional layer is essential. Generally, the provision of injection layers between each of the electrodes and a functional layer is effective in facilitating efficient injection of carriers. This is because an injection layer serves to lower the energy barrier to be overcome in the injection of carriers. An injection layer disposed between a functional layer and the anode is a hole-injection layer composed of an organic material, such as copper phthalocyanine or PEDOT (conductive polymer), or of a metal oxide, such as molybdenum oxide or tungsten oxide. An injection layer disposed between a functional layer and the cathode is an electron injection layer composed of an organic material, such as metal complex or oxadiazole, or of a metal, such as barium.

It has been reported that organic EL elements having a hole injection layer composed of a metal oxide, such as molybdenum oxide or tungsten oxide, exhibit improved hole injection efficiency and longevity (see Patent Literature 1 and Non-Patent Literature 1). It is further reported that the improvement achieved is relevant to the energy level resulting from structures similar to oxygen vacancies of metal oxide on the surface the hole injection layer (see Non-Patent Literature 2).

On the other hand, as organic EL display panels grow in size, it becomes necessary to reduce the resistance of the wiring portion that connects the power source to the electrodes in the organic EL pixels constituting the panel. In particular, in a top emission type active-matrix organic EL display panel, it is necessary to use transparent electrode material, such as ITO or IZO, as the common electrode. As these materials are relatively high resistance, it is desirable to limit their use as a wiring portion.

With respect to this point, for example, Patent Literature 2 discloses a top emission type organic EL element with a wiring portion structured so that the second electrode (common electrode) is connected to auxiliary wiring, thus providing a wiring portion that reduces the use of the relatively high-resistance common electrode. The auxiliary wiring is low-resistance wiring that provides electrons from the power source to the common electrode.

It is desirable to provide the auxiliary wiring in a non-light-emitting cell, so as not to block the light-emitting cell. Furthermore, the auxiliary wiring may be provided either above or below the common electrode in the non-light-emitting cell. A structure in which the auxiliary wiring is provided below can be considered more desirable, as the auxiliary wiring can be formed during the same processes as when forming other components such as the thin-film transistors and pixel electrodes.

CITATION LIST

Patent Literature

[Patent Literature 1] Japanese Patent Application Publication No. 2005-203339
[Patent Literature 2] Japanese Patent Application Publication No. 2002-318556

Non-Patent Literature

[Non-Patent Literature 1] Jingze Li et al., Synthetic Metals 151, 141 (2005)
[Non-Patent Literature 2] Kaname Kanai et al., Organic Electronics 11, 188 (2010)
[Non-Patent Literature 3] J. B. Pedley et al., Journal of Physical and Chemical Reference Data 12, 967 (1984)
[Non-Patent Literature 4] I. N. Yakovkin et al., Surface Science 601, 1481 (2007), 1481 (2007).
[Non-Patent Literature 5] Hiromi Watanabe et al., Yuki EL Tohronkai Dai 7 Kai Reikai Yokoushuu, 17 (2008).
[Non-Patent Literature 6] Hyunbok Lee et al., Applied Physics Letters 93, 043308 (2008).
[Non-Patent Literature 7] Yasuo Nakayama et al., Yuki EL Tohronkai Dai 7 Kai Reikai Yokoushuu, 5 (2008).

SUMMARY OF INVENTION

Technical Problem

In the manufacturing of an organic EL element, problems are presented by adherents, mainly carbon-containing adherents, derived from molecules of carbon dioxide, water, and organic material contained in the atmosphere or from molecules of impurities generated during the manufacturing steps. To be more specific, in a step of laminating the respective layers, such as electrodes and a hole injection layer, of an organic EL element, if a layer with adherents on its surface is topped with another layer, the adherents are embedded between the layers. The presence of adherents involves the risk of increasing the drive voltage of, and/or reducing the longevity of the resulting organic EL element.

On the other hand, in an organic EL element in which the auxiliary wiring is below the common electrode, patterning is typically performed after forming the pixel electrodes (anode) and the auxiliary wiring as one film. The hole injection layer is subsequently layer thereon.

In this context, it is desirable that a hole injection layer made from copper phthalocyanine or PEDOT not be formed on the auxiliary wiring. This is not only because such hole injection layers are typically high resistance, but also because forming such hole injection layers on the auxiliary wiring prevents the supply of electrodes from the auxiliary wiring to the common electrode.

Specifically, such hole injection layers are designed so that the binding energy of the highest occupied molecular orbital is near (approximately equal to) the Fermi level of ITO or the like, which is typically used as the anode. Conversely, the lowest unoccupied molecular orbital is quite far from the Fermi level. As a result, although hole injection into the hole injection layers from the anode is relatively easy, electron injection is difficult. While this is advantageous in the light-emitting unit, it causes an increase in resistance of the wiring portion at the connecting portion between the auxiliary wiring and the common electrode, as electrons cannot be provided to the common electrode through the hole injection layers from the auxiliary wiring which is made from the same material as the anode.

Furthermore, many materials used for the hole injection layer are chemically unstable with respect to electrons and tend to decompose or degrade upon continual reception of electrons over an extended period of time. This may result in degradation of the panel characteristics.

It is therefore necessary that these hole injection layers not be formed by patterning on the auxiliary wiring. Methods for film formation by patterning include 1) a method of selectively forming films on pixel electrodes using mask deposition, screen printing, inkjet printing, or the like, and 2) a method of first forming a film over the entire surface, and then using photolithography, dry etching, or the like to selectively remove only portions above the auxiliary wiring. The increase in the number of processes with both of these methods, however, leads to an increase in manufacturing costs, as well as an increase in particles that lowers the yield. Furthermore, resist residue and the like from the patterning may remain on the auxiliary wiring, acting as a resistance component and further increasing the resistance of the wiring portion.

In view of such problems, the present disclosure provides an organic EL display panel and an organic EL display apparatus that can be driven at a low voltage and that exhibit excellent light-emitting efficiency.

Solution to Problem

To achieve the aim, an organic EL display panel pertaining to one aspect of the present invention includes: a substrate; a first electrode on or in the substrate; auxiliary wiring on or in the substrate at a distance from the first electrode; a functional layer, including at least a light-emitting layer, above the first electrode; a hole injection layer for injecting holes to the functional layer, the hole injection layer being between the first electrode and the functional layer; and a second electrode, above the functional layer, wherein the hole injection layer and the second electrode are both formed to be continuous above the first electrode and above the auxiliary wiring, the second electrode and the auxiliary wiring are electrically connected by the hole injection layer, and the hole injection layer contains a tungsten oxide, an UPS spectrum, obtained from a UPS measurement, having a protrusion appearing near a Fermi surface and within a region corresponding to a binding energy range lower than a top of a valence band, the tungsten oxide contained in the hole injection layer satisfying a condition, determined from an XPS measurement, that a ratio in a number density of atoms other than tungsten atoms and oxygen atoms to the tungsten atoms does not exceed 0.83.

Advantageous Effects of Invention

In an organic EL display panel and an organic EL display apparatus pertaining to one aspect of the present invention, the hole injection layer contains a tungsten oxide, and an UPS spectrum, obtained from a UPS measurement, has a protrusion appearing near a Fermi surface and within a region corresponding to a binding energy range lower than a top of a valence band, and the tungsten oxide contained in the hole injection layer satisfies a condition, determined from an XPS measurement, that a ratio in a number density of atoms other than tungsten atoms and oxygen atoms to the tungsten atoms does not exceed 0.83. Therefore, the organic EL display panel and the organic EL display apparatus can be driven at a low voltage with excellent light-emitting efficiency.

Providing the protrusion appearing near the Fermi surface allows for reduction in the hole injection barrier between the hole injection layer and the functional layer in the light-emitting cell, while also allowing for the exchange of carriers with almost no barrier between the pixel electrode in the light-emitting cell and the hole injection layer, between the auxiliary wiring in the wiring portion and the hole injection layer, and between the hole injection layer and the common electrode. Furthermore, since the ratio in the number density does not exceed 0.83, adherents on the surface of the hole injection layer have been removed. In sum, the above aspect of the present invention achieves low driving voltage and excellent light-emitting efficiency.

BRIEF DESCRIPTION OF DRAWINGS

FIGS. 17A through 17C are graphs illustrating a dependence of driving voltage of hole-only devices on film forming conditions of a hole injection layer.

DESCRIPTION OF EMBODIMENTS

Figure 1A:
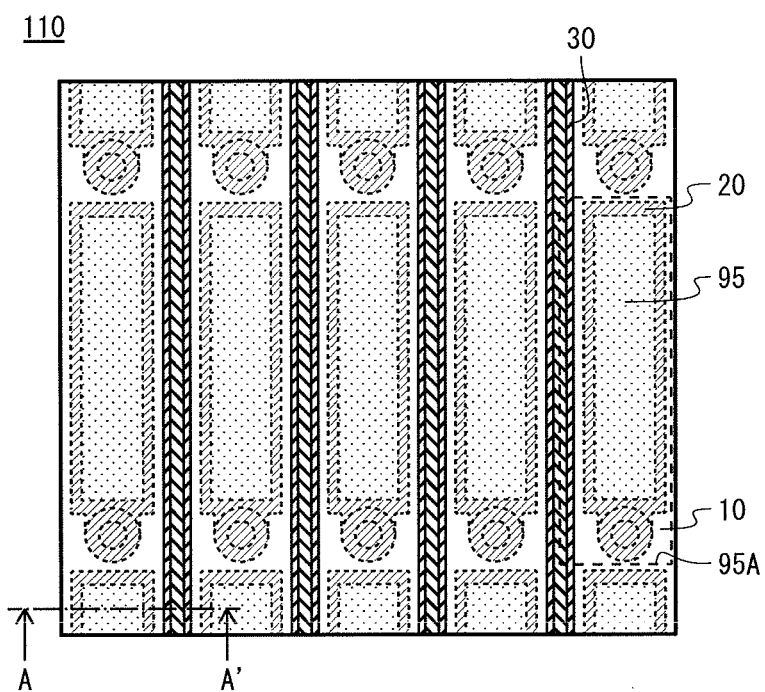
FIGS. 1A and 1B are diagrams illustrating an organic EL display panel according to an aspect of the present invention.

[Overview of Aspects of the Present Invention]

An organic EL display panel pertaining to one aspect of the present invention includes: a substrate; a first electrode on or in the substrate; auxiliary wiring on or in the substrate at a distance from the first electrode; a functional layer, including at least a light-emitting layer, above the first electrode; a hole injection layer for injecting holes to the functional layer, the hole injection layer being between the first electrode and the functional layer; and a second electrode, above the functional layer, wherein the hole injection layer and the second electrode are both formed to be continuous above the first electrode and above the auxiliary wiring, the second electrode and the auxiliary wiring are electrically connected by the hole injection layer, and the hole injection layer contains a tungsten oxide, an UPS spectrum, obtained from a UPS measurement, having a protrusion appearing near a Fermi surface and within a region corresponding to a binding energy range lower than a top of a valence band, the tungsten oxide contained in the hole injection layer satisfying a condition, determined from an XPS measurement, that a ratio in a number density of atoms other than tungsten atoms and oxygen atoms to the tungsten atoms does not exceed 0.83.

With the stated structure, the hole injection layer contains a tungsten oxide. Furthermore, with respect to the holes injection layer, the n UPS spectrum, obtained from a UPS measurement, has a protrusion appearing near a Fermi surface and within a region corresponding to a binding energy range lower than a top of a valence band, and the tungsten oxide contained in the hole injection layer satisfying a condition, determined from an XPS measurement, that a ratio in a number density of atoms other than tungsten atoms and oxygen atoms to the tungsten atoms does not exceed 0.83.

Providing the protrusion appearing near the Fermi surface allows for reduction in the hole injection barrier between the hole injection layer and the functional layer in the light-emitting cell, while also allowing for the exchange of carriers with almost no barrier between the pixel electrode in the light-emitting cell and the hole injection layer, between the auxiliary wiring in the wiring portion and the hole injection layer, and between the hole injection layer and the common electrode. Also, the adherents on the surface of the hole injection layer have been removed, with the protrusion appearing near the Fermi surface being maintained. Consequently, the stated structure achieves low driving voltage and excellent light-emitting efficiency.

Furthermore, carriers can be exchanged with almost no barrier between the pixel electrode in the light-emitting cell and the hole injection layer, between the auxiliary wiring in the wiring portion and the hole injection layer, and between the hole injection layer and the common electrode. It therefore poses no problem to form the hole injection layer on the auxiliary wiring, making a step to pattern the hole injection layer unnecessary. This not only reduces the number of processes but also allows for stable mass production.

Furthermore, with the above structure, the hole injection layer is constituted by chemically stable tungsten oxide. Therefore, the hole injection layer can be prevented from being degraded or changed in properties by the alkaline solution, water, organic solvent, or the like used during formation of the bank. Accordingly, after completion of the organic EL element, the hole injection layer is able to maintain its form, its excellent efficiency for injecting holes to the functional layer in the light emitting cell, and its excellent exchange of carriers with the common electrode in the wiring portion. This allows for manufacturing of an organic EL element that can withstand processing performed during the mass production of organic EL display panels.

The light-emitting layer of the organic EL element is layered after formation of the hole injection layer. Typically, the light-emitting layer is applied separately for each color of emitted light (for example, R, G, and B). To prevent colors from mixing between pixels and to ensure a high level of accuracy, barriers (hereinafter referred to as a bank) may be provided between pixels. The bank is typically formed with photolithography, for example by applying bank material composed of photosensitive resist material onto the surface of the hole injection layer, pre-baking the bank material, exposing the bank material to light with a pattern mask, removing unhardened, excess bank material with a developer composed of an alkaline solution or the like, and finally rinsing with pure water. To form the bank, an alkaline solution, water, an organic solvent, and the like are used. If the hole injection layer is composed of an organic material, such material will degrade or change in properties due to the above solutions, thereby damaging the hole injection layer and preventing the achievement of the desired hole injection efficiency. By contrast, the hole injection layer according to an aspect of the present invention is formed from tungsten oxide, which does not easily degrade or change in properties due to the above solvents. The above problem therefore does not occur.

In the organic EL display panel according to the above aspect of the present invention, the second electrode may be a transparent electrode.

In the organic EL display panel according to the above aspect of the present invention, the transparent electrode may be made up from one of ITO and IZO.

As described above, in a top emission type organic EL element, a transparent electrode material such as ITO or IZO needs to be used for the common electrode (second electrode), but these materials have a higher resistivity than metallic materials. As a result, extensive use of the common electrode in the wiring portion leads to differences in the length of the common electrode between light-emitting pixels, the differences becoming greater as the display panel increases in area. A large voltage drop thus occurs between the center of the display panel and the edge of the power supply unit, causing a corresponding difference in luminance that makes the center appear dark. In other words, this may lead to the problem of fluctuations in voltage, depending on the position of the organic EL element within the display panel, and the problem of degradation in display quality. Therefore, as described above, the wiring part also adopts low-voltage auxiliary wiring in order to minimize usage of the common electrode.

The tungsten oxide provided with predetermined properties as per an aspect of the present invention also forms Schottky ohmic contact with these transparent electrode materials. Therefore, providing the tungsten oxide between the auxiliary wiring and the transparent electrode material does not lead to an increase in the resistance of the wiring portion. Specifically, carriers can be exchanged with almost no barrier between the auxiliary wiring and the hole injection layer, as well as between the hole injection layer and the common electrode composed of ITO, IZO, or the like. As a result, the organic EL display panel according to an aspect of the present invention can be expected to allow for driving at a low voltage while exhibiting excellent light-emitting efficiency.

In the organic EL display panel according to the above aspect of the present invention, the second electrode may have one of Al and Ag as a primary component.

The organic EL display panel according to the above aspect of the present invention may further comprise a metal layer formed to be continuous above the first electrode and above the auxiliary wiring, wherein, above the first electrode, the metal layer is between the second electrode and the light-emitting layer, and above the auxiliary wiring, the metal layer is between the second electrode and the hole injection layer.

In the organic EL display panel according to the above aspect of the present invention, the metal layer may be an electron injection layer that, above the first electrode, injects electrons from the second electrode to the light-emitting layer.

In the organic EL display panel according to the above aspect of the present invention, the metal layer may include barium (Ba).

Between the light-emitting layer in the organic EL element and the common electrode, a metal layer of barium or the like is sometimes provided as an electron injection layer. In a bottom emission type organic EL element, a highly reflective metallic material, such as Ag or Al, is used as the common electrode.

The tungsten oxide provided with predetermined properties as per an aspect of the present invention also forms Schottky ohmic contact with these metals and therefore does not lead to an increase in the resistance of the wiring portion even when formed on the auxiliary wiring. Specifically, carriers can be exchanged with almost no barrier between the auxiliary wiring and the hole injection layer, as well as between the hole injection layer and the common electrode or metal layer composed of Ba, Al, Ag, or the like. As a result, the organic EL display panel according to an aspect of the present invention can be expected to allow for driving at a low voltage while exhibiting excellent light-emitting efficiency.

In the organic EL display panel according to the above aspect of the present invention, the auxiliary wiring may be made up from one of ITO and IZO.

As described above, carriers can be exchanged with almost no barrier between the hole injection layer and the auxiliary wiring composed of ITO or IZO. Accordingly, the organic EL display panel according to an aspect of the present invention can be expected to allow for driving at a low voltage while exhibiting excellent light-emitting efficiency.

In the organic EL display panel according to the above aspect of the present invention, the hole injection layer above the auxiliary wiring may have properties identical to the hole injection layer above the first electrode.

In the organic EL display panel according to the above aspect of the present invention, at least above the auxiliary wiring, the hole injection layer may be at least 4 nanometers thick.

The above structure is even more desirable, since Schottky ohmic contact stably forms between the auxiliary wiring in the wiring portion and the hole injection layer, as well as between the hole injection layer and the metal layer. Stable carrier exchange can therefore be expected. In other words, it is desirable to guarantee at least 2 nm for stable Schottky ohmic contact between the auxiliary wiring in the hole injection layer, and to guarantee at least 2 nm for stable Schottky ohmic contact between the hole injection layer and the metal layer. A thickness of at least 4 nm is therefore considered even more desirable.

The organic EL display panel according to the above aspect of the present invention may further comprise a bank on the hole injection layer defining at least one aperture exposing the first electrode and including a region exposing the auxiliary wiring, wherein the light-emitting layer is formed above the first electrode in the aperture defined by the bank.

In the organic EL display panel according to the above aspect of the present invention, the at least one first electrode may comprise a plurality of first electrodes, one per pixel, and the at least one aperture in the bank may comprise a plurality of apertures formed in one-to-one correspondence with the first electrodes.

In the organic EL display panel according to the above aspect of the present invention, the at least one first electrode may comprise a plurality of first electrodes, one per pixel, arranged in lines, and the at least one aperture in the bank may comprise a plurality of apertures, one for each of the lines of the first electrodes.

In the organic EL display panel according to the above aspect of the present invention, in the UPS spectrum, the protrusion may appear within the region corresponding to the binding energy range from 1.8 eV to 3.6 eV lower than the top of the valance band.

Note that a numerical range stated as "from . . . to . . . " is intended to mean that the upper and lower limits are both inclusive. For example, the numerical range "from 1.8 eV to 3.6 eV" includes both 1.8 eV and 3.6 eV.

In the organic EL display panel according to the above aspect of the present invention, the ratio in the number density of the other atoms to the tungsten atoms may not exceed 0.62. If this is the case, the adherent removal effect is assumed to have reached a level of saturation, so that a sufficient adherent removal effect is expected to be achieved.

In the organic EL display panel according to the above aspect of the present invention, the atoms other than tungsten atoms and oxygen atoms comprise carbon atoms.

In the organic EL display panel according to the above aspect of the present invention, the UPS spectrum obtained from the UPS measurement may have the protrusion appearing near the Fermi surface and within the region corresponding to the binding energy range lower than the top of a valence band, and the tungsten oxide contained in the hole injection layer may satisfy the condition, as determined by the XPS measurement, that the ratio in the number density of atoms other than tungsten atoms and oxygen atoms to the tungsten atoms does not exceed 0.83.

An organic EL display panel pertaining to another aspect of the present invention includes: a substrate; a first electrode on or in the substrate; wiring on or in the substrate at a distance from the first electrode; an organic layer, including organic material, above the first electrode; a tungsten oxide layer, including a tungsten oxide, between the organic layer and the first electrode; and a second electrode above the organic layer, wherein the tungsten oxide layer and the second electrode are both formed to be continuous above the first electrode and above the wiring, the second electrode and the wiring are electrically connected by the tungsten oxide layer, an UPS spectrum of the tungsten oxide layer, obtained from a UPS measurement, has a protrusion appearing near a Fermi surface and within a region corresponding to a binding energy range lower than a top of a valence band, and the tungsten oxide satisfies a condition, determined from an XPS measurement, that a ratio in a number density of atoms other than tungsten atoms and oxygen atoms to the tungsten atoms does not exceed 0.83.

An organic EL display panel pertaining to another aspect of the present invention includes: a substrate; a first electrode on or in the substrate; auxiliary wiring on or in the substrate at a distance from the first electrode; a functional layer, including at least a light-emitting layer, above the first electrode; a hole injection layer for injecting holes to the functional layer, the hole injection layer being between the first electrode and the functional layer; and a second electrode, above the functional layer, wherein the hole injection layer and the second electrode are both formed to be continuous above the first electrode and above the auxiliary wiring, the second electrode and the auxiliary wiring are electrically connected by the hole injection layer, and the hole injection layer contains a tungsten oxide, an UPS spectrum, obtained from a UPS measurement, having: a protrusion appearing near a Fermi surface and within a region corresponding to a binding energy range lower than a top of a valence band; and a peak appearing within a region corresponding to a binding energy range from 4.5 eV to 5.4 eV.

In the organic EL display panel according to the above aspect of the present invention, in the UPS spectrum, the protrusion may appear within the region corresponding to the binding energy range from 1.8 eV to 3.6 eV lower than the top of the valance band.

In the organic EL display panel according to the above aspect of the present invention, the hole injection layer may be irradiated with ultraviolet light so that the UPS spectrum obtained from the UPS measurement has: the protrusion appearing near the Fermi surface and within the region corresponding to the binding energy range lower than the top of a valence band; and the peak appearing within the region corresponding to the binding energy range from 4.5 eV to 5.4 eV.

An organic EL display panel pertaining to another aspect of the present invention includes: a substrate; a first electrode on or in the substrate; wiring on or in the substrate at a distance from the first electrode; an organic layer, including organic material, above the first electrode; a tungsten oxide layer, including a tungsten oxide, between the organic layer and the first electrode; and a second electrode above the organic layer, wherein the tungsten oxide layer and the second electrode are both formed to be continuous above the first electrode and above the wiring, the second electrode and the wiring are electrically connected by the tungsten oxide layer, and an UPS spectrum of the tungsten oxide layer, obtained from a UPS measurement, has: a protrusion appearing near a Fermi surface and within a region corresponding to a binding energy range lower than a top of a valence band; and a peak appearing within a region corresponding to a binding energy range from 4.5 eV to 5.4 eV.

An organic EL display apparatus pertaining to another aspect of the present invention has any one of the above-described organic EL display panels.

[Developments Leading to the Present Invention]

First, with the aim of preventing increase in drive voltage of the organic EL element and reduction in longevity of the organic EL element, the present inventors have come to a technical idea of adding, to the manufacturing process, a cleaning step of removing adherents from the layer surfaces subsequently to the formation of the respective layers.

As the cleaning methods for removing adherents, the present inventors have turned their attention to ultraviolet (UV) ozone cleaning and oxygen plasma cleaning, which are widely used for cleaning glass substrates and electrodes, for the high degree of cleanliness achieved thereby.

Intensive studies by the present inventors on the cleaning methods have revealed that neither UV ozone cleaning nor oxygen plasma cleaning is suitable for cleaning the hole injection layer of an organic EL element, provided that the hole injection layer is composed of a metal oxide, such as molybdenum oxide or tungsten oxide.

The reason is as follows. Both the UV ozone cleaning and oxygen plasma cleaning utilize strong oxidation associated with oxygen radicals formed by decomposition of oxygen molecules. Through the oxidation, oxygen atoms end up filling structures similar to oxygen vacancies of metal oxide on the surface of the hole injection layer. Consequently, the energy level resulting from structures similar to oxygen vacancies disappears from the hole injection layer composed of metal oxide. As a result, there is a risk of decreasing the hole injection efficiency. To be more precise, the present inventors have confirmed, by experiments described below, that the energy level resulting from structures similar to oxygen vacancies almost completely disappear through UV ozone cleaning.

Based on the above findings, the present inventors have recognized the importance of the following two points in order to prevent increase in the drive voltage of, and decrease in the longevity of an organic EL element having a hole injection layer composed of a metal oxide. One of the points is that the energy level resulting from structures similar to oxygen vacancies of metal oxide on the surface of the hole injection layer remains without being eliminated. The other of the points is that adherents are removed from the surface the hole injection layer.

After a series of researches and studies regarding the above features of the present invention, the present inventors came to be aware of Non-Patent Literature 1 disclosing UV ozone cleaning performed subsequently to the formation of a hole injection layer composed of tungsten oxide. However, Non-Patent Literature 1 discloses nothing about the impact on the characteristics of the organic EL element imposed by UV ozone cleaning and nothing about optimizing the conditions of UV ozone cleaning. It is further noted that Non-Patent Literature 1 does not describe anything about the fact, which are found by the present inventors through specific studies, that UV ozone cleaning is not suitable for cleaning a hole injection layer composed of tungsten oxide unless adequately modified. Naturally, Non-Patent Literature 1 does not describe anything about the technical reasons for the unsuitability.

As another method for removing adherents, the following discusses sputter etching of performing argon ion sputtering in a vacuum chamber subsequently to a hole injection layer is formed. The sputter etching has been reported to remove adherents and also to increase the energy level resulting from structures similar to oxygen vacancies. Thus, the sputter etching appears to be an excellent cleaning method at first.

Unfortunately, the clean surface and the increased energy level obtained by the sputter etching can be maintained only in the vacuum chamber for the following reason. That is, the surface of a hole injection layer treated by sputter etching in vacuum is highly instable because the molecular bonds have been forcedly broken by an ion beam. Therefore, once taken out of the vacuum chamber, the hole injection layer easily adsorbs atmospheric molecules to be stabilized. In the manner described above, structures similar to oxygen vacancies of metal oxide which are created in vacuum are instantly filled, and the layer surface once cleaned rapidly adsorbs contaminants.

The layer surface may be kept clean by performing some or all of the subsequent manufacturing steps continuously inside the vacuum chamber. However, performing manufacturing steps inside a vacuum chamber is applicable, on condition that the organic EL display panel to be manufactured is relatively small. For a large-sized organic EL display panel having display size of e.g., around 50 inches, it is extremely difficult to perform the manufacturing steps inside a vacuum chamber as the vacuum chamber needs to be large enough for such a large-sized organic EL display panel. Besides, the throughput of steps performed inside a vacuum chamber is small, and such steps are not desirable for mass production.

Alternatively to removing adherents, a method of preventing adhesion of contaminants per se is one possibility. For example, by performing some or all of manufacturing steps subsequent to the layer formation continuously inside a vacuum chamber, the respective layers are exposed neither to the atmosphere nor to impurity molecules. Thus, the layer surface is kept free or substantially free of contaminants. However, this scheme is extremely difficult to apply to the manufacturing of large-sized organic EL display panels because the vacuum chamber of a corresponding size is required as already described above.

Alternatively, performing manufacturing steps inside a chamber filled with inert gas is another possibility. This scheme is applicable to the manufacturing of large-sized organic display EL panels. Unfortunately, such a chamber still contains impurity molecules and the like, although the amount is smaller than that in the atmosphere. In addition, complete removal of such molecules from the chamber is difficult.

As has been described above, it is extremely difficult to obtain an organic EL element having a hole injection layer satisfying that the energy level resulting from structures similar to oxygen vacancies of metal oxide on the layer surface remains without being eliminated, and that the surface of the hole injection layer is free or substantially free of adherents.

In contrast, an organic EL element according to one aspect of the present invention includes a hole injection layer having an energy level resulting from structures similar to oxygen vacancies of metal oxide on the surface of the hole injection layer remains without being eliminated. Therefore, holes are injected from the anode (pixel electrode) to the functional layer with efficiency. Consequently, the organic EL element emits light at low power consumption and high intensity. In addition, since adherents have been removed from the surface of the hole injection layer, no or substantially no contaminants are embedded between the hole injection layer and the functional layers. As a consequence, the drive voltage of the organic EL element is not increased and no carrier traps, such as impurities derived from adherents, are formed, which ensures a long life and favorable characteristics of the organic EL element.

Second, the inventors observed the following through an experiment described below: if an occupied energy level near the Fermi surface, formed by a structure similar to an oxygen vacancy, exists along the surface of a hole injection layer formed from a metal oxide, then at the interface between the hole injection layer and the functional layer, the difference between the lowest binding energy of the occupied energy level near the Fermi surface and the binding energy of the highest occupied molecular orbital in the functional layer becomes small, which is effective for reducing the driving voltage of the element.

Focusing on this observation, the inventors discovered that if the occupied energy level near the Fermi surface exists in the hole injection layer, then the difference between the lowest binding energy of the occupied energy level near the Fermi surface and the Fermi level of the electrode is also small at the interface with the electrodes such as the anode, the cathode, and the auxiliary wiring. This suggested the possibility of favorable carrier exchange.

The inventors then discovered that a hole injection layer made from metal oxide that has an occupied energy level near the Fermi surface can achieve Schottky ohmic contact with electrodes that are relatively low-resistance and are made from a metal material such as Al, or electrodes made from a transparent electrode material with a relatively high resistance, such as ITO or IZO. For this reason, even if formed on the auxiliary wiring, the hole injection layer does not increase the resistance of the wiring portion.

Third, the inventors also examined the material for forming a hole injection layer that does not easily degrade or suffer from a change in properties during the bank forming process.

As described above, a metal oxide, which is an inorganic material, is a good material for forming a hole injection layer with improved driving voltage and longevity of the organic EL element. However, actual manufacturing of an organic EL element using molybdenum oxide for the hole injection layer suggested that the hole injection layer might degrade or suffer from a change in properties due to the alkaline solution, water, organic solvent, or the like use during the bank forming process. Degradation or a change in properties of the hole injection layer would impair the expected ability of the hole injection layer to inject holes above the pixel electrode in the light-emitting cell and would increase the resistance of the wiring portion above the auxiliary wiring, thus preventing normal driving of the organic EL element. Moreover, such a hole injection layer would not be able to withstand the mass production process of organic EL elements and organic EL panels incorporating such organic EL elements. Therefore, it cannot always be considered desirable to form the hole injection layer from molybdenum oxide, which may cause degradation or a change in properties.

Therefore, focusing on tungsten oxide which has a lower probability of causing degradation or a change in properties, the inventors discovered that tungsten oxide provided with certain physical properties has low solubility and does not easily degrade in the above solution and the like. Furthermore, such tungsten oxide has a strong capability to inject holes.

Embodiment 1

The following is a description of an organic EL display panel and an organic EL display apparatus according to an aspect of the present invention, followed by the results of experiments to confirm performance and an analysis thereof. It is to be noted that, in each of the accompanying figures, the relation between sizes of each of the members are not illustrated directly reflecting the actual relation.

<Structure of Organic Display Panel>

Figure 1B:
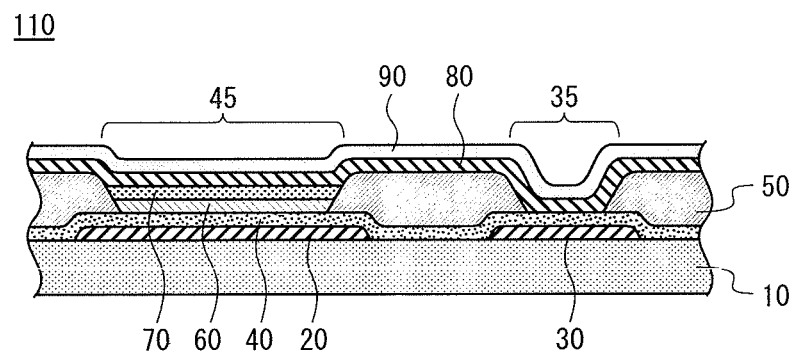

FIGS. 1A and 1B illustrate an organic EL display panel according to an aspect of the present invention. FIG. 1A is a partial plan view illustrating the main portions of the organic EL display panel. FIG. 1B is a cross-sectional diagram, along the line from A to A' in FIG. 1A, illustrating the main portions of the organic EL display panel.

As shown in FIG. 1A, an organic EL display panel 110 according to the present embodiment is provided with a matrix of a plurality of light-emitting pixels 95A each having a light-emitting cell 95. A plurality of anodes (pixel electrodes, first electrodes) 20 are provided, one for each pixel, and an auxiliary wiring (also corresponding to the wiring) 30 is provided along the light-emitting cells 95 for each row of light-emitting pixels.

As illustrated in FIG. 1B, the organic EL display panel 110 includes the following: a substrate 10, anodes 20 and auxiliary wirings 30 formed on the substrate 10, a hole injection layer 40 (also corresponding to the tungsten oxide layer) formed above the anodes 20 and the auxiliary wiring 30, pixel apertures 45 formed on the hole injection layer 40 above the anodes 20, banks 50 having connection apertures 35 above the auxiliary wiring 30, buffer layers 60 formed within the pixel apertures 45 of the banks 50, light-emitting layers 70 (also corresponding to the organic layers) formed on the buffer layers 60 within the pixel apertures 45 of the banks 50, an electron injection layer (also corresponding to the metal layer) 80 formed on the upper surface of the above components, a cathode 90 (common electrode, a second electrode) formed on the electron injection layer 80, and the like.

A hole injection layer with properties identical to the hole injection layer 40 formed above the anode 20 is also formed above the auxiliary wiring 30. In other words, the hole injection layer 40 is formed across the entire surface shown in the partial plan view of FIG. 1A. The electron injection layer 80 and the cathode 90 are also formed across the entire surface shown in the partial plan view of FIG. 1A.

The auxiliary wiring 30 and the cathode 90 are electrically connected via the hole injection layer 40 and the electron injection layer 80 within the connection apertures 35 provided along the auxiliary wiring 30, thus constituting the wiring portion that connects the cathode 90 to the power source. The layer structure between the cathode 90 and the auxiliary wiring 30 in the connection apertures 35 is not limited to the above structure. For example, a layer other than the hole injection layer 40 and the electron injection layer 80 may be included, or alternatively the electron injection layer 80 may be excluded. Any layer structure that does not prevent electrons from flowing from the auxiliary wiring 30 to the cathode 90 is acceptable. Organic EL display panels including such a multilayered structure are included in the scope of the present invention and achieve the same advantageous effects as the organic EL display panel 110 according to the present embodiment.

Each light-emitting cell 95 is composed of the hole injection layer 40, the buffer layer 60, the light-emitting layer 70, and the electron injection layer 80 provided within the pixel apertures 45. Through the cathode 90, the light-emitting cell 95 emits light produced by recombination of holes and electrons injected into the light-emitting layer 70. Note that the anodes 20 are provided separately for each pixel in correspondence with the light-emitting cells 95. In other words, when the light-emitting cell is composed of subpixels, such as R, G, B subpixels, the light-emitting cell 95 and the anode 20 are provided separately in correspondence with each subpixel.

(Substrate)

The substrate 10 is the base material for the organic EL element and may be formed with an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

While not shown in the figures, TFTs (thin film transistors) are provided on the surface of the substrate 10 for driving the organic EL elements.

(Anode)

The anode 20 is formed by, for example, layering a 20 nm-thick transparent conductive film of ITO on a 400 nm-thick metal film of Al. Note that the structure of the anode 20 is not limited in this way and may instead be formed from a single layer, such as a transparent conducting film of ITO, IZO, or the like; a metal film of Al, Ag, or the like; or an alloy film of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above transparent conducting films, metal films, and metal alloy films.

(Auxiliary Wiring)

The auxiliary wiring 30 is formed by, for example, layering a 20 nm-thick transparent conductive film of ITO on a 400 nm-thick metal film of Al. Note that the structure of the auxiliary wiring 30 is not limited in this way and may instead be formed from a single layer, such as a transparent conducting film of ITO, IZO, or the like; a metal film of Al, Ag, or the like; or an alloy film of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above transparent conducting films, metal films, and metal alloy films.

(Hole Injection Layer)

The hole injection layer 40 is, for example, formed as a layer of tungsten oxide that is at least 2 nm thick (in the present example, 30 nm). In the composition formula (WOx) denoting the composition of tungsten oxide, x is a real number existing within a range of approximately 2<x<3. A thickness under 2 nm is not desirable, as such a thickness makes it difficult to form the hole injection layer 40 uniformly and to form Schottky ohmic contact between the anode 20 and the hole injection layer 40 of the light-emitting cell. The above Schottky ohmic contact can be stably formed when the thickness of the tungsten oxide layer is at least 2 nm. Therefore, by forming the hole injection layer 40 to at least this thickness, a stable efficiency of hole injection from the anode 20 to the hole injection layer 40 of the light-emitting cell can be expected.

Furthermore, it is even more desirable for the thickness of the tungsten oxide layer to be at least 4 nm, since the Schottky ohmic contact stably forms between the auxiliary wiring 30 and the hole injection layer 40 as well as between the hole injection layer 40 and the electron injection layer 80 in the wiring portion. At this thickness, stable carrier exchange can therefore be expected.

While it is desirable for the hole injection layer 40 to be formed only from tungsten oxide, the inclusion of a trace level of impurities is acceptable, provided that the amount does not exceed the amount of impurities that might normally be incorporated.

By being formed under predetermined conditions, the hole injection layer 40 has an electron level with a structure similar to an oxygen vacancy of a metal oxide. The existence of this electron level allows for good hole injection from the anode 20 to the hole injection layer 40 and from the hole injection layer 40 to the buffer layer 60 in the light-emitting cell, as well as good carrier exchange between the auxiliary wiring 30 and the hole injection layer 40, and between the hole injection layer 40 and the electron injection layer 80, in the wiring portion. In addition, subsequently to the layer formation, the hole injection layer 40 is irradiated with ultraviolet light of a predetermined wavelength in the atmosphere. As a result of the ultraviolet (UV) irradiation, the surface of the hole injection layer 40 is cleaned to reduce adherents thereon, without affecting the energy level resulting from the structures similar to oxygen vacancies of metal oxide. In addition, the duration and intensity of UV irradiation is set so that, with respect to a photoelectron spectrum exhibited by the hole injection layer 40 after the UV irradiation, changes in shape of a spectral region corresponding to a predetermined range of binding energy converge. With the setting, the maximum effect of removing adherents is achieved by UV irradiation performed at the minimum conditions.

In greater detail, the above reference to having an "electron level with a structure similar to an oxygen vacancy of a metal oxide" means that the hole injection layer 40 has, in an electronic state thereof, an occupied energy level between 1.8 eV and 3.6 eV lower than the upper end of the valance band of the hole injection layer, i.e. the lowest energy level of the valence band, in terms of binding energy. Furthermore, the occupied energy level corresponds to the energy level of the highest occupied molecular orbital (HOMO) of the hole injection layer 40. That is, in the electronic state of the hole injection layer 40, the occupied energy level is closest to the Fermi level (Fermi surface) of the hole injection layer 4, in terms of binding energy. As such, the occupied energy level of the hole injection layer is referred to as "the occupied energy level near the Fermi surface" in the following description.

Due to the existence of this occupied energy level near the Fermi surface, a so-called interface energy level alignment is formed at the layer interface between the hole injection layer 40 and the functional layer (the buffer layer 60), so that the binding energy of the highest occupied molecular orbital of the buffer layer 60 and the binding energy of the occupied energy level near the Fermi surface of the hole injection layer 40 become approximately equal.

Note that the expressions "approximately equal to" and "interface energy level alignment being formed" as referred to herein indicate that at the interface between the hole injection layer 40 and the buffer 60, the difference between the lowest binding energy at the occupied energy level near the Fermi surface and the lowest binding energy at the highest occupied molecular orbital is ±0.3 eV.

Furthermore, the expression "interface" as referred to here denotes an area that includes a surface of the hole injection layer 40 and a portion of the buffer layer 60 within a distance of 0.3 nm from the surface of the hole injection layer 3.

Furthermore, a characteristic of the hole injection layer 40 is the formation of a so-called Schottky ohmic contact at the interface with the anode 20, the auxiliary wiring 30, and the electron injection layer 80.

The expression "Schottky ohmic contact" as referred to here denotes that the Fermi level of the anode 20, the auxiliary wiring 30, and the electron injection layer 80 differs from the above-described lowest binding energy of the occupied energy level near the Fermi surface of the hole injection layer 40 by a small amount, specifically ±0.3 eV, at a position that is 2 nm away from the surface of the anode 20, auxiliary wiring 30, or the electron injection layer 80 towards the hole injection layer 40. Furthermore, the expression "interface" as referred to here denotes a region that includes a surface of the anode 20, the auxiliary wiring 30, or the electron injection layer 80 and the Schottky barrier formed on the side of the surface facing the hole injection layer 40.

While it is desirable that the occupied energy level near the Fermi surface exists throughout the hole injection layer 40, it suffices for this occupied energy level to exist at the interface with the buffer layer 60, the anode 20, the auxiliary wiring 30 and the electron injection layer 80. Note that not all tungsten oxide has such an occupied energy level near the Fujii surface; rather, within the hole injection layer and at the interface with the buffer layer 60, this particular energy level only forms under the predetermined film forming conditions described below.

(Bank)

The banks 50 are, for example, composed of an organic material with insulating properties (such as acrylic resin, polyimide resin, novolac-type phenolic resin, and the like). The banks 50 are formed in a pixel bank structure, with pixel apertures 45 in one-to-one correspondence with a plurality of anodes 20, or in a line bank structure, with one pixel aperture 45 corresponding to a plurality of anodes 20 arranged in a line. Note that the banks 50 are not essential to the present invention and are unnecessary in cases such as when an organic EL display panel is constituted by one organic EL element.

(Buffer Layer)

In one example, the buffer layer 60 is a 20 nm-thick layer of TFB (poly(9,9-di-n-octylfluorene-alt-(1,4-phenylene-((4-sec-butylphenyl)imino)-1,4-phenylene)), which is an amine-containing organic polymer.

(Light-Emitting Layer)

In one example, the light-emitting layer 70 is a 70 nm-thick layer of F8BT (poly(9,9-di-n-octylfluorene-alt-benzothiadiazole)), which is an organic polymer. However, the material of the light-emitting layer 70 is not limited to this, and the light-emitting layer 70 may contain a commonly-known organic material. Examples of such commonly-known organic material for the light-emitting layers 5 include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(Functional Layer)

A functional layer according to the present invention refers to one of: a hole transport layer that transfers holes; a light-emitting layer that emits light as a result of recombination of injected holes and electrons; and a buffer layer used for adjusting optical characteristics of the organic EL element 1 or for blocking electrons. Alternatively, functional layers according to the present invention may refer to a combination of two or more of, or all of the above-mentioned layers. Although the target of the present invention is the hole injection layer, an organic EL element commonly includes layers having each of the functions of the above-described hole transfer layer, light-emitting layer and the like, in addition to the hole injection layer. As such, the expression "functional layers" refers to all such layers which need to be included in the organic EL element, aside from the hole injection layer to which the present invention is directed.

(Electron Injection Layer)

The electron injection layer 80 is, for example, a 5 nm-thick barium layer and has the function of injecting electrons from the cathode 90 to the light-emitting layer 70. The electron injection layer 80 is formed to be continuous above the anodes 20 and above the auxiliary wiring 30. Above the anodes 20, the electron injection layer 80 is located between the cathode 90 and the light-emitting layer 70, whereas above the auxiliary wiring 30, the electron injection layer 80 is located between the cathode 90 and the hole injection layer 40. When light is emitted through the top (i.e. top emission), as in the present embodiment, the electron injection layer 80 must be light-transmissive. Forming the electron injection layer as a 5 nm-thick barium layer makes the electron injection layer light-transmissive. Note that when light is emitted through the bottom (i.e. bottom emission), depending on the element structure, the electron injection layer need not always be light-transmissive.

(Cathode)

The cathode 90 is formed by, for example, layering a 35 nm-thick transparent conductive film of ITO. Note that the structure of the cathode 90 is not limited in this way and may instead be formed from a thin layer of a transparent conducting film of IZO, or the like; a metal such as Al, Ag, or the like; or an alloy of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above transparent conducting films, metal films, and metal alloy films.

A direct current power supply is connected to the anodes 20 and to the auxiliary wirings 30 to supply power from an external source to the organic EL display panel 110.

<Structure of Organic EL Display Apparatus>

Figure 2:
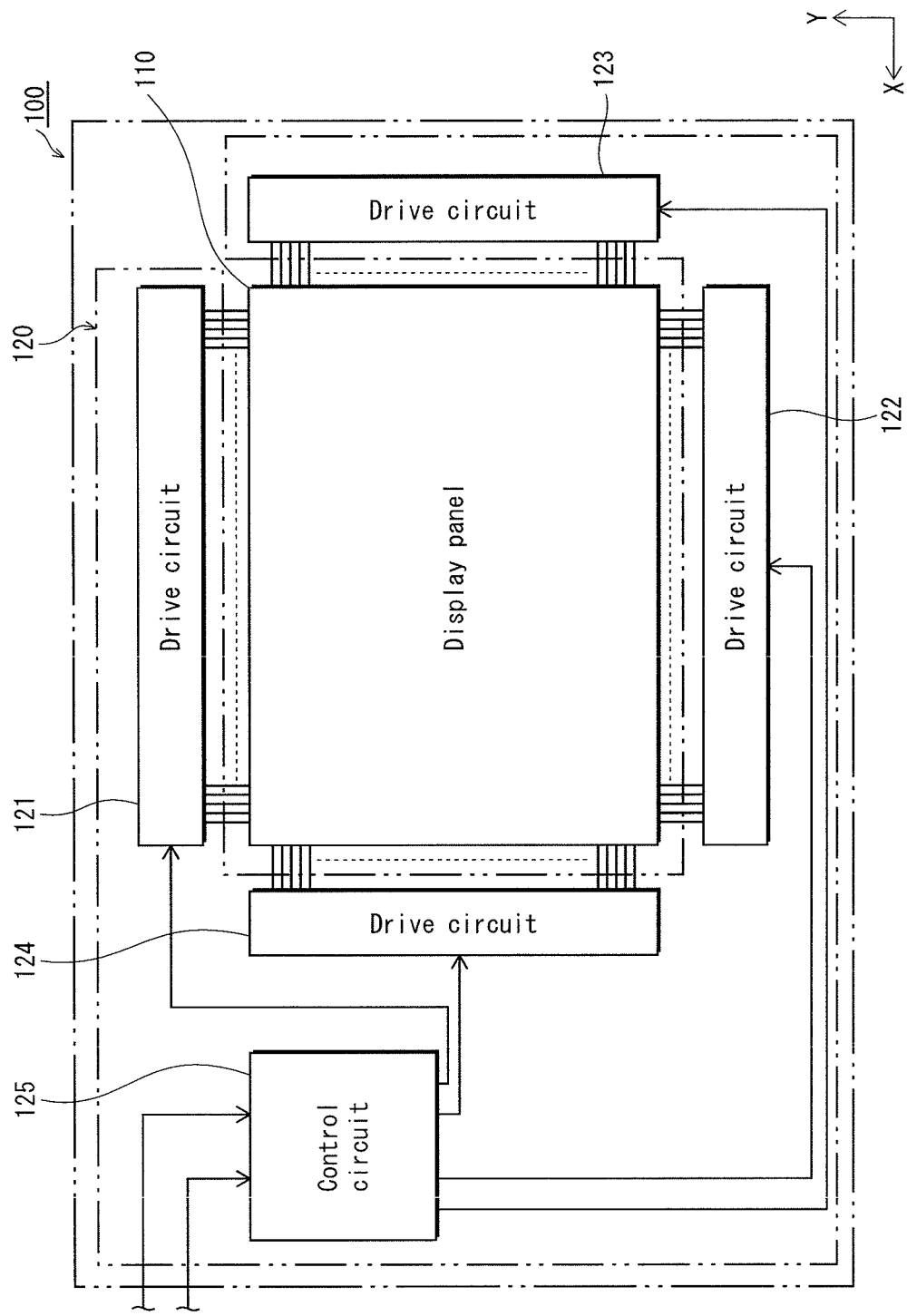
FIG. 2 is a diagram illustrating the overall configuration of an organic EL display apparatus according to an aspect of the present invention.

Based on FIG. 2, an organic EL display apparatus according to an aspect of the present invention is now described. FIG. 2 is a diagram illustrating the overall configuration of an organic EL display apparatus according to an aspect of the present invention.

As illustrated in FIG. 2, an organic EL display apparatus 100 is provided with the organic EL display panel 110 according to an aspect of the present invention as well as a drive control unit 120 connected thereto. The organic EL display apparatus 100 is used in monitors, televisions, cellular telephones, and the like. The drive control unit 120 includes four drive circuits 121-124 and a control circuit 125. Note that in an actual organic EL display apparatus 100, the layout and the connection of the drive control unit 120 with respect to the organic EL display panel 110 are not limited to the depiction in FIG. 2.

<Method of Manufacturing Organic EL Display Panel>

With reference to the drawings, the following provides details on a method of manufacturing an organic EL display panel according to the present embodiment.

FIGS. 3A-3E and 4A-4D are cross-section diagrams illustrating the method of manufacturing an organic EL display panel according to an aspect of the present invention.

Figure 3A:
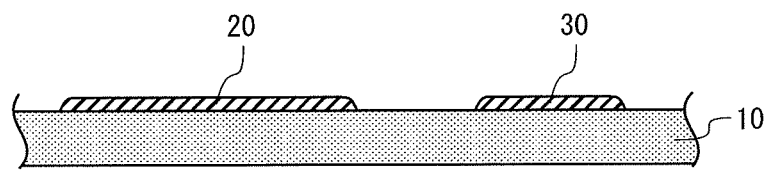
FIGS. 3A through 3E are cross-section diagrams illustrating the method of manufacturing an organic EL display panel according to an aspect of the present invention.

First, as illustrated in FIG. 3A, a substrate 10 is prepared. The substrate 10 is provided with a drive circuit (not shown in the drawings) composed of, for example, TFTs (Thin Film Transistors), capacitors, and the like. Using, for example, vacuum deposition or sputtering, a metal film of Al and a transparent conducting film such as ITO are formed in this order across the entire substrate 10. Subsequently, using photolithography, the metal film and the transparent conducting layer are etched to form anodes 20 at predetermined positions as well as auxiliary wiring 30 at predetermined positions electrically insulated from the anodes 20.

At this point, the anodes 20 are formed individually in correspondence with the light-emitting units, whereas the auxiliary wiring 30 is provided in a one-dimensional arrangement along the rows or columns, for example, of light-emitting pixels provided in the two-dimensional matrix. Note that a planarizing layer, for example, may be provided on the substrate 10 as necessary to eliminate unevenness due to the drive circuit or other factors, with the anodes 20 and auxiliary wiring 30 being formed on top of the planarizing layer.

Figure 3B:
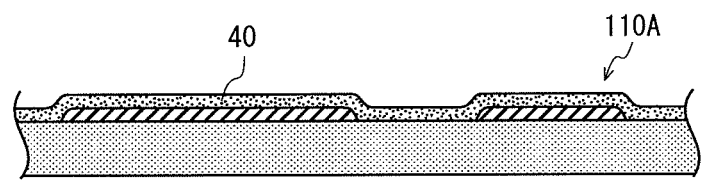

Next, as illustrated in FIG. 3B, the hole injection layer 40 is formed on the anodes 20 in the auxiliary wiring 30 by the reactive sputtering method. Specifically, the target of reactive sputtering method is metal tungsten. An argon gas and an oxygen gas are introduced into the chamber as the sputtering gas and the reactive gas, respectively. Under this state, high voltage is applied to ionize the argon, so that the ionized argon is caused to bombard the sputtering target. The metal tungsten ejected as a result of the sputtering phenomenon reacts with the oxygen gas to produce tungsten oxide. The hole injection layer 40 thus forms as a continuous film along the anodes 20 and the auxiliary wiring 30 on the substrate 10, yielding an intermediate product 110A.

The film formation described above is performed under the following conditions: (i) the substrate temperature is not controlled; (ii) gas pressure (total gas pressure) is equal to 4.8 Pa; (iii) the ratio of oxygen partial pressure to the total gas pressure is equal to 50%; and (iv) input power per unit surface area of the sputtering target (input power density) is equal to 1.4 W/cm$^2$. The hole injection layer 40 composed of tungsten oxide formed under the above conditions has the energy level resulting from structures similar to oxygen vacancies on its surface.

Next, the intermediate product 110A is removed from the chamber to the atmosphere. At this point, the hole injection layer 40 is exposed to the atmosphere and thus adsorbs gas molecules on its exposed surface. It is also assumed that once the hole injection layer 40 is formed, impurity molecules present in the chamber adhere to the layer surface even before the intermediate product 110A is taken out of the chamber.

Next, UV irradiation is performed in the atmosphere to expose the surface of the hole injection layer 40 to ultraviolet light. In this step, an ultraviolet (UV) irradiation apparatus 200 according to one aspect of the present invention is used. The UV irradiation apparatus 200 has a metal halide lamp manufactured by Ushio Inc. (Model No.: UVL-3000M2-N) as a light source 201. The UV irradiation apparatus 200 will be described later in detail. The irradiation conditions are separately determined by experiments conducted using photoemission spectroscopy measurements, which will be described later. Specifically, the irradiation conditions are determined so that changes in shape of the resulting photoelectron spectrum in a spectral region corresponding to a predetermined binding energy range converge. In this embodiment, the irradiation intensity is determined to be 155 mW/cm$^2$ and the irradiation duration is determined to be 10 minutes.

In the description above, the UV irradiation is performed in the ambient atmosphere. Alternatively, however, the UV irradiation may be performed in various other gas atmospheres, such as reduced-pressure atmosphere, inert gas atmosphere, or vacuum. The above variations are possible because the cleaning by UV irradiation uses ultraviolet light at such wavelengths not generating oxygen radicals. Still, however, the UV irradiation performed in the atmosphere is advantages in the manufacture of large-sized panels, for the reasons stated above.

Figure 3C:
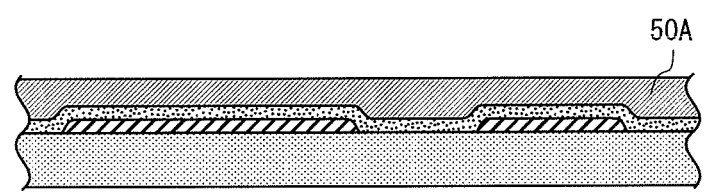

As illustrated in FIG. 3C, a negative photoresist 50A is then applied to the entire surface.

Figure 3D:
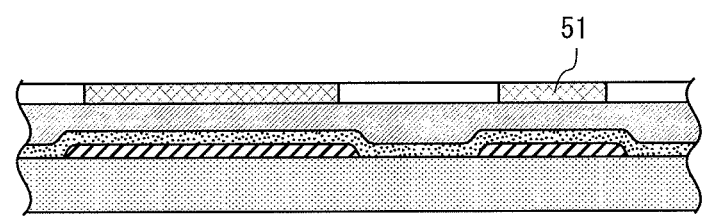

Subsequently, as illustrated in FIG. 3D, a photomask 51 having light-blocking portions at positions corresponding to the light-emitting cells and connecting portions is layered on the negative photoresist 50A. The photoresist 50A is exposed through the photomask 51 using photolithography.

Figure 3E:
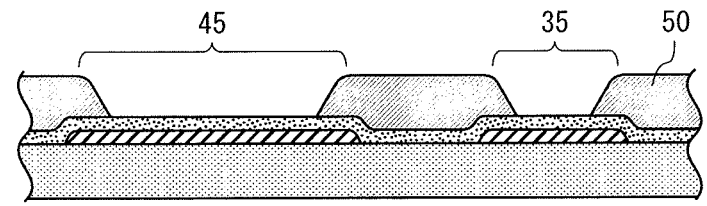

Next, as illustrated in FIG. 3E, the intermediate product 110A is developed to form the pixel apertures 45 and connection apertures 35 between the banks 50.

The UV irradiation is applicable to the hole injection layer composed of metal oxide having undergone the bank forming step as above. In this case, by performing the UV irradiation of the surface of the hole injection layer after the banks are formed, organic molecules, which are residues of banks and developer, are removed from the surface of the hole injection layer. In general, irradiating banks with ultraviolet light results in changes in the contact angle of each bank with respect to an organic solvent applied as an upper layer. Yet, according to the present invention, it is easy to uniformly determine the irradiation conditions of ultraviolet light. Therefore, the contact angle and the bank configuration can be appropriately adjusted in view of the uniformly determined irradiation conditions.

Figure 4A:
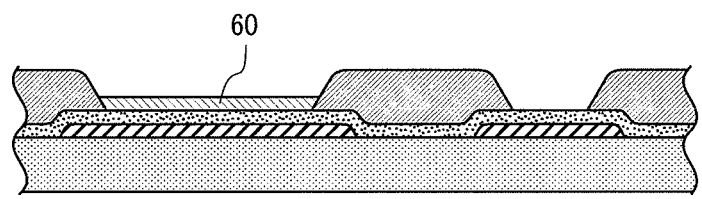
FIGS. 4A through 4D are cross-section diagrams illustrating the method of manufacturing an organic EL display panel according to an aspect of the present invention.

Next, as illustrated in FIG. 4A, the buffer layer 60 is formed by ejecting drops of ink composition containing organic amine-containing molecular material into the pixel apertures 45 by a wet process, such as spin coating or an inkjet method, and removing the solvent by volatilization. The buffer layer 60 is thus formed.

Figure 4B:
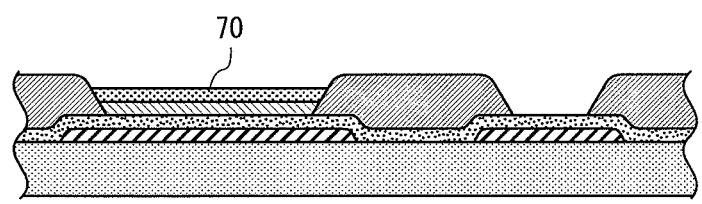

Subsequently, as illustrated in FIG. 4B, the light-emitting layer 70 is formed by ejecting drops of ink composition containing organic light-emitting material onto the surface of the buffer layer 60 by the same method and removing the solvent by volatilization.

Here, it should be noted that the method for forming the buffer layer 60 and the light-emitting layer 70 is not limited to the above method. Other than spin coating and the inkjet method, ink may be ejected/applied by another commonly-known method such as the gravure printing method, the dispenser method, the nozzle coating method, the intaglio printing method, or the relief printing method.

Figure 4C:
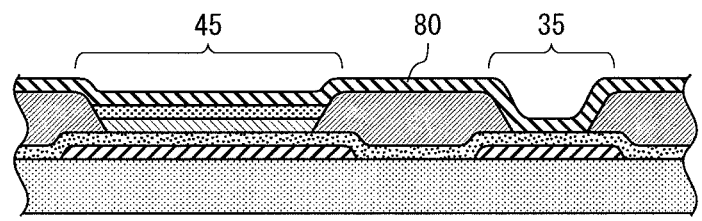

Subsequently, as illustrated in FIG. 4C, the electron injection layer 80 is formed to be continuous on the light-emitting layer 70 and on the hole injection layer 40 in the connection aperture 35 with, for example, the vacuum deposition method.

Figure 4D:
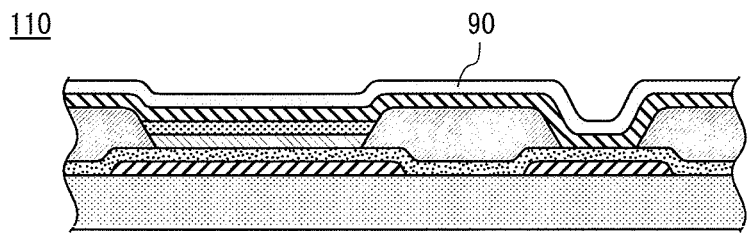

Furthermore, as illustrated in FIG. 4D, by the same method, the cathode 90 is formed on the electron injection layer 80.

Note that while not illustrated in FIGS. 1A and 1B, a sealing layer may be additionally provided on the surface of the cathode 90, or a sealing cap may be provided to isolate the entire organic EL element from external space, in order as to prevent the organic EL element from being exposed to the atmosphere after completion. The sealing layer may be formed, for example, by using materials such as SiN (silicon nitride) and SiON (silicon oxynitride), and may be disposed such that the organic EL element is sealed therein. When using a sealing cap to prevent atmospheric exposure of the organic EL element 1, the sealing cap may be formed by using, for instance, the same material as the substrate 10, and a getter which absorbs moisture and the like may be provided within the sealed space formed by the substrate 10 and the sealing cap.

Performance of the above steps completes the organic EL display panel 110.

The above-described manufacturing method of the organic EL display panel 110 involves the UV irradiation step of radiating ultraviolet light having the predetermined wavelength, performed after the hole injection layer 40 of tungsten oxide is formed. With the step, adherents on the surface of the hole injection layer 40 of the light-emitting cell and the wiring portion are removed, while the energy level resulting from structures similar to oxygen vacancies of metal oxide is maintained on the surface of the hole injection layer 40.

Furthermore, the energy level mentioned above is continuously maintained in the atmosphere throughout the time from the cleaning of the hole injection layer 40 to the formation of the buffer layer 60 in the light-emitting cell and the time from the cleaning of the hole injection layer 40 to the formation of the electron injection layer 80 in the wiring portion. Consequently, in the light-emitting cell, the ability of hole injection of the buffer layer 60 is maintained with stability, and in the wiring portion, the ability of ohmic contact with the electron injection layer 80 is maintained with stability. This ensures the stable manufacturing of the organic EL display panel 110 that is driven with low drive voltage and has longevity.

Furthermore, the duration of UV irradiation and the intensity of ultraviolet light in the UV irradiation step are determined in view of the conditions with which, with respect to a photoelectron spectrum exhibited by the hole injection layer 40, changes in shape of a spectral region corresponding to a predetermined binding energy range converge. That is, the irradiation conditions are determined to achieve the maximum removable of adherents with the minimum conditions. Thus, the highly stable hole injection efficiency in the light-emitting cell and the schottky ohmic contact in the wiring portion are realized with a minimum cleaning process.

<UV Irradiation Apparatus>

Figure 5:
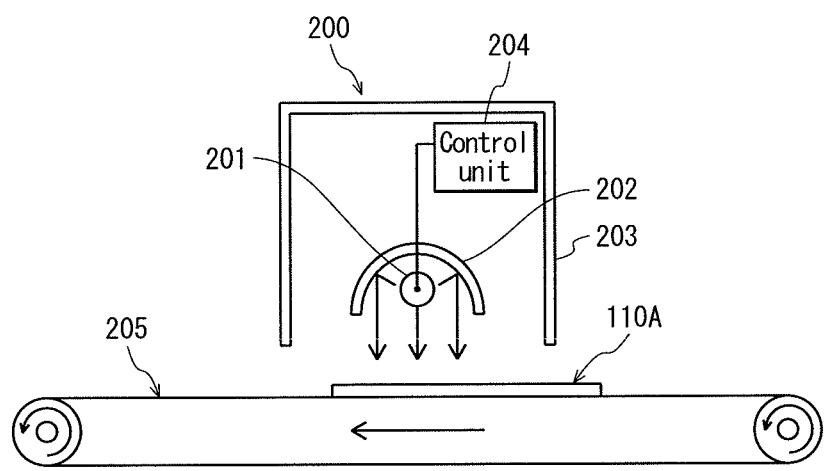
FIG. 5 is a view illustrating important parts of a method for manufacturing the organic EL element according to the embodiment.

Next, the following describes the UV irradiation apparatus. FIG. 5 illustrates an UV irradiation apparatus 200 according to one aspect of the present invention. The UV irradiation apparatus 200 is for irradiating ultraviolet light to an intermediate product 110A of the organic EL display panel 110 and includes: a light source 201 that emits ultraviolet light mainly within the wavelength region longer than 184.9 nm and equal to 380 nm or shorter; a reflector 202 that reflects ultraviolet light emitted by the light source 201 toward the intermediate product 110A; a housing 203 that houses the light source 201 and reflector 202 to hold them in place; and a control unit 204 that controls ON/OFF of the light source 201.

The intermediate product 110A has, for example, the anode 20 the auxiliary wiring 30 and the hole injection layer 40 on the substrate 10 but the banks 50 and the buffer layer 60 have not been formed yet.

The light source 201 is, for example, a straight metal halide lamp disposed to longitudinally coincide with the widthwise direction of the intermediate product 110A being transferred. The light source 201 is operated to emit light under the conditions suitable for effective manufacturing of organic EL display panel 110 capable of emitting light at high intensity and low electrical consumption. The conditions of UV irradiation, such as irradiation duration and irradiation intensity, are determined based on various factors, including the formation conditions of the hole injection layer 40, such as the type of metal oxide used, and the convergence of changes in shape of photoelectron spectroscopy spectra exhibited by the samples of the hole injection layer 40 as described in the present embodiment. The irradiation conditions are set by the operator. Alternatively, the irradiation conditions may be automatically set by the control unit 204. For example, the control unit 204 stores a database in which layer forming conditions, irradiation durations, and irradiation intensities are correlated. On receiving input of the layer forming conditions by the operator, the control unit 204 sets the irradiation duration and intensity with reference to the database.

The intermediate product 110A is transported to the position for UV irradiation by a conveyer 205. In the figure, the intermediate product 110A placed onto the conveyer 205 from the upstream (right-hand side of the figure) in the transport direction is transported by the conveyer 205 to pass the position for receiving UV irradiation. While the intermediate product 110A is passing the position, a predetermined amount of ultraviolet light is applied to the upper surface of the intermediate product 110A, i.e., the upper surface of the hole injection layer 40. Having been irradiated with ultraviolet light, the intermediate product 110A is transported out to the downstream (left-hand side of the figure).

In the UV irradiation apparatus 200 described above, the light source 201 is not limited to a metal halide lamp. The light source 201 may be any light source capable of emitting ultraviolet light mainly within the wavelength region longer than 184.9 nm and equal to 380 nm or shorter (preferably, longer than 253.7 nm and equal to 380 nm or shorter).

<Experiments and Observations>

(Effect of Adherents Removal by UV Irradiation)

According to this embodiment, subsequently to its formation, the hole injection layer composed of tungsten oxide is exposed to ultraviolet light under the predetermined conditions, whereby adherents are removed from the surface of the hole injection layer. The adherent removal effect achieved by the UV irradiation is confirmed by the following experiments.

Samples were prepared each by laminating the anode composed of ITO on the substrate, and the hole injection layer composed of tungsten oxide on the anode, in the chamber of the sputtering film-forming apparatus. After the lamination, each intermediate sample was taken out of the chamber to the atmosphere to prepare samples without any UV irradiation, samples with UV irradiation for one minute, and samples with UV irradiation for ten minutes. The irradiation intensity was 155 mW/cm$^2$.

In the following description in the present embodiment, a sample without UV irradiation may be referred to as a "no-irradiation sample" and a sample with UV irradiation for n minutes may be referred to as an "n-minute irradiation sample".

Each sample was then attached to a photoelectron spectroscopy apparatus (PHI 5000 VersaProbe) manufactured by ULVAC-PHI, Incorporated to measure the X-ray photoelectron spectroscopy (XPS). Generally, an XPS spectrum indicates the elemental composition, binding condition, and valence of the target surface up to several nanometers in depth. That is, if elements not originally contained in tungsten oxide are observed, it is highly likely that the elements are adherents. In addition, it is generally known that molecules adhere as a result of atmospheric exposure or during a manufacturing process are mainly carbon-containing molecules, if water molecules and oxygen molecules are excluded. Therefore, the adherents removal effect achieved is confirmed by measuring changes in the carbon concentration in the surface region of the hole injection layer.

The conditions under which the XPS measurement was conducted are as follows. Note that no charge-up occurred during measurement.

Light source: AlKα
Bias: None
Electron emission angle: Direction of normal line to the substrate First, each sample was subjected to wide-scan measurement. As a result of the measurement, the only elements found in each sample were tungsten (W), oxygen (O), and carbon (C). Then, narrow-scan spectra of each sample were measured for the W4f orbital (W4f) and also for the C1s orbital (C1s) to obtain the relative value of the number density of carbon atoms to the number of density of tungsten atoms present in the surface region up to several nanometers in depth of the hole injection layer composed of tungsten oxide. That is, the composition ratio between W and C was obtained. The composition ratio was obtained from the spectra, by using the composition ratio calculation function of "MultiPak" XPS, which is analyzing software included with the photoelectron spectroscopy apparatus used in the measurements.

Table 1 below shows the composition ratio between W and C of each sample.

TABLE 1

| Sample Name | Composition Ratio between W and C (W:C) |
|---|---|
| No-Irradiation Samples | 1:1.27 |
| 1-Minute Irradiation Samples | 1:0.83 |
| 10-Minute Irradiation Samples | 1:0.62 |

With reference to Table 1, the number of carbon atoms relative to the number of tungsten atoms decrease more and more as the irradiation duration is longer, which is apparent when comparing the samples without irradiation against the samples with 1-minute irradiation and the samples with 10-minute irradiation. That is, it is made clear that the UV irradiation according to the present embodiment serves to decrease adherents on the surface of the hole injection layer composed of tungsten oxide.

(Influences of UV Irradiation on Hole Injection Ability)

According to the present embodiment, the UV irradiation is performed to remove adherents from the surface of the hole injection layer composed of tungsten oxide, in a manner that the energy level resulting from structures similar to oxygen vacancies is maintained without any substantial influence. Note that the structures similar to oxygen vacancies favorably affect the hole injection ability from the hole injection layer to the buffer layer and the Schottky ohmic contact ability between the hole injection layer and each electrode. This property of maintaining structures similar to oxygen vacancies is confirmed by the following experiments.

In the experiments, the above-described samples without irradiation, with 1-minute irradiation, and with 10-minute irradiation were subjected to UPS (ultraviolet photoelectron spectroscopy) measurements. Generally, a UPS spectrum indicates the electronic state, from the valence band to the Fermi surface (Fermi level), of the measurement target surface of up to several nanometers in depth. Especially in the case where the measurement target is tungsten oxide or molybdenum oxide, the presence of structures similar to oxygen vacancies on the layer surface is indicated by a protrusion appearing, in a UPS spectrum, near the Fermi surface in the low binding energy direction from the top of the valence band (hereinafter, such a protrusion is referred to as a "spectral protrusion near the Fermi surface") (Non-Patent Literature 2). That is, by observing changes in the spectral protrusion near the Fermi surface before and after UV irradiation, the influence imposed by the UV irradiation on the structures similar to oxygen vacancies on the layer surface is examined. In tungsten oxide, as described in detail below, the spectral protrusion near the Fermi surface occupies a binding energy range that is from 1.8 eV to 3.6 eV lower than the top of the valence band (the lowest binding energy within the valence band).

The conditions under which the UPS measurement was conducted are as follows. Note that no charge-up occurred during measurement.

Figure 6:
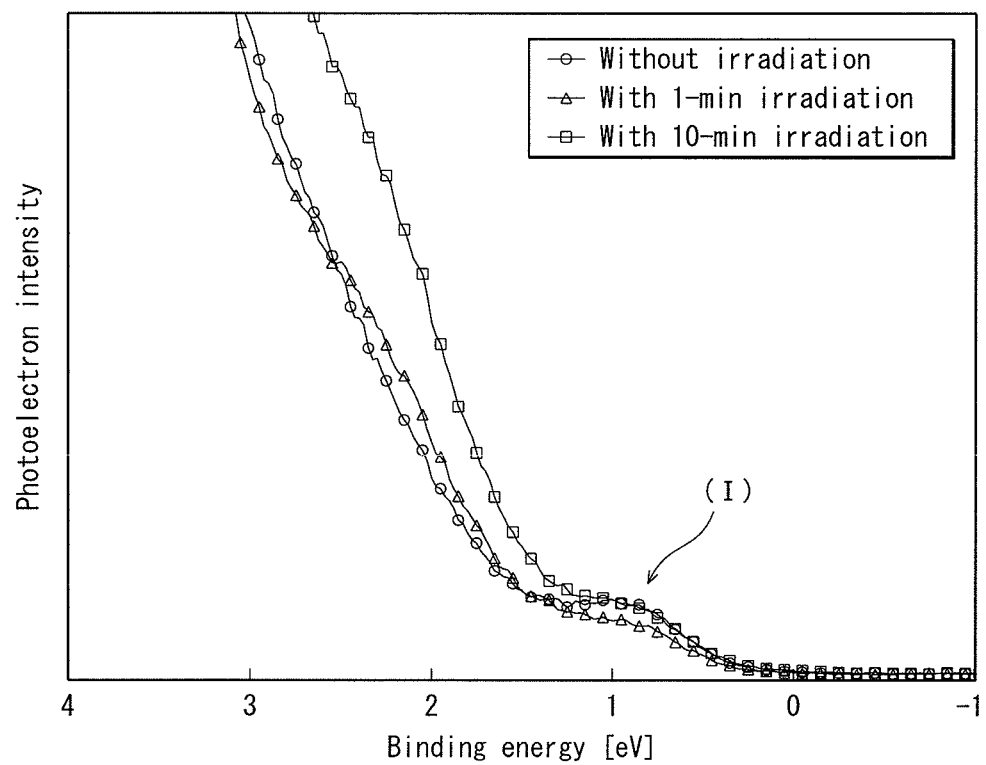
FIG. 6 is a view illustrating UPS spectra of tungsten oxide.

Light source: He I line
Bias: None
Electron emission angle: Direction of normal line to the substrate FIG. 6 shows the UPS spectra of the respective samples, focusing on portions near the Fermi surface. In the following description, every photoelectron spectroscopy spectrum (UPS and XPS) is shown with the horizontal axis representing the binding energy having the origin point at the Fermi level measured by the apparatus for measurement (matching with the Fermi level of the anode) and with the left direction relative to the origin point being positive. In all the spectra measured on the samples without irradiation, with 1-minute irradiation, and with 10-minute irradiation, a spectral protrusion near the Fermi surface is clearly observed. In the figure, spectral protrusions near the Fermi surface are collectively denoted by (I). These results indicate that the structures similar to oxygen vacancies favorably affecting the hole-injection ability are maintained even after the UV irradiation.

For the purpose of comparison, UV ozone cleaning was also performed. More specifically, samples were prepared each by laminating the anode composed of ITO on the substrate, and the hole injection layer composed of tungsten oxide on the anode, in the chamber of a sputtering film-forming apparatus. The intermediate samples were than taken out of the chamber to the atmosphere, followed by UV ozone cleaning of the surface of the hole injection layer by a UV ozone apparatus. The samples after the UV ozone cleaning were subjected to UPS measurement to check the presence of a spectral protrusion near the Fermi surface.

Figure 7:
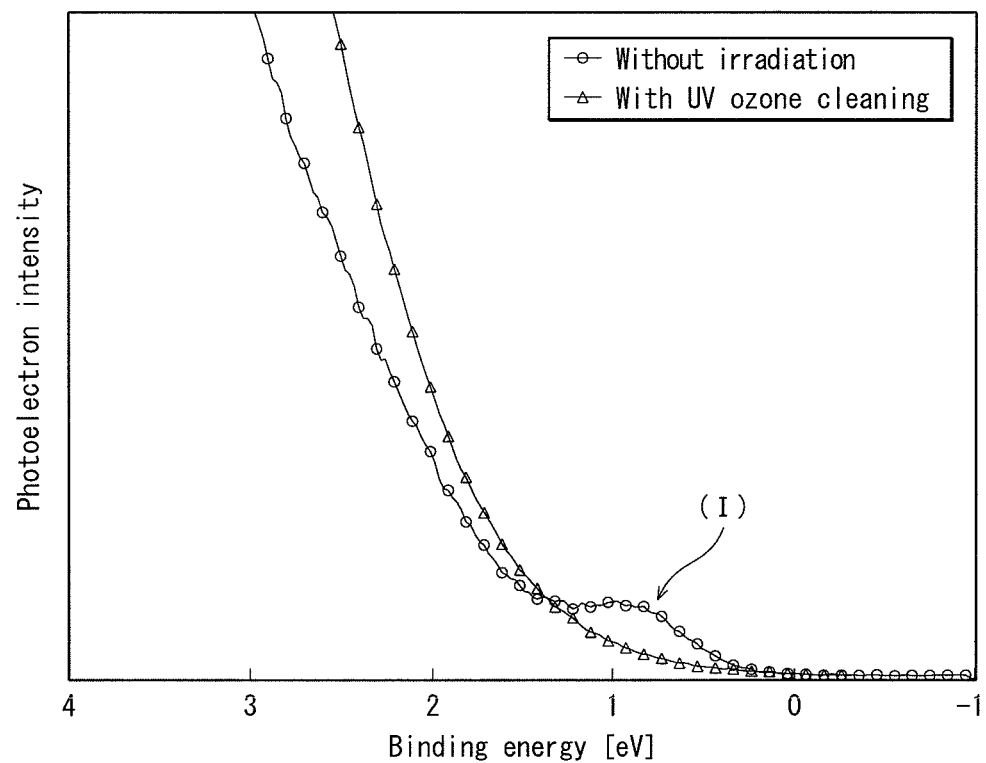
FIG. 7 is a view illustrating UPS spectra of tungsten oxide.

FIG. 7 illustrates the UPS spectrum measured on the hole injection layer composed of tungsten oxide having been subjected to the UV ozone cleaning for three minutes, focusing on a portion near the Fermi surface. For the purpose of comparison, FIG. 7 also illustrates the UPS spectrum of the samples without irradiation, which is illustrated in FIG. 6. Unlike from the results shown in FIG. 6 regarding the samples subjected to the UV irradiation according to the present embodiment, no spectral protrusion near the Fermi surface is observed at all. The results indicate that through the UV ozone cleaning, almost all structures similar to oxygen vacancies are lost from the surface of the hole injection layer.

As described above, it is clarified that cleaning by the UV irradiation according to the present embodiment is different from the UV ozone cleaning in that structures similar to oxygen vacancies are maintained without being lost. That is, structures similar to oxygen vacancies, which favorably affect the hole injection ability and the Schottky ohmic contact ability, are not eliminated by the UV irradiation.

(Regarding Method for Determining UV Irradiation Conditions)

According to the present embodiment, the surface of the hole injection layer composed of tungsten oxide is cleaned by UV irradiation. It is confirmed by the following experimental results that the adherent removal effect becomes saturated with the irradiation for a specific duration or longer.

Figure 8:
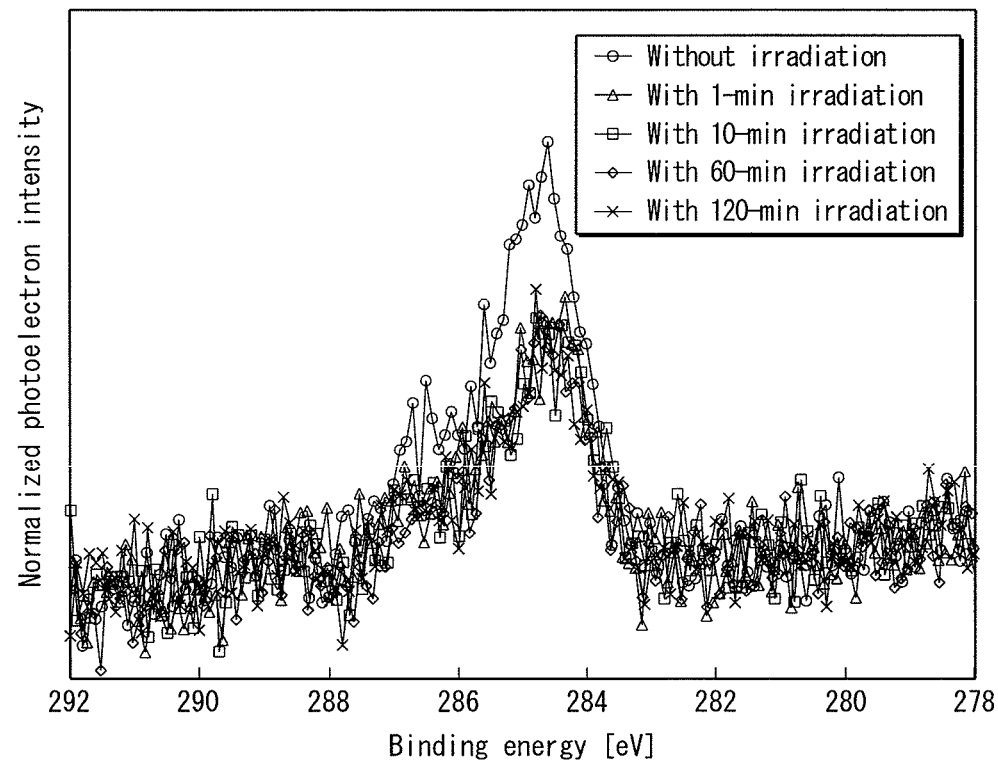
FIG. 8 is a view illustrating XPS spectra of tungsten oxide.

In the same manner as described above, samples without irradiation, with 1-minute irradiation, and with 10-minute irradiation were prepared. In addition, samples with 60-minute irradiation and 120 minute irradiation were prepared. Then, narrow-scan spectra for W4f and C1s of the respective samples were measured by XPS measurement. From the respective spectra, background components are subtracted. Then, the photoelectron intensity is normalized using the intensities by the area intensity. The narrow-scan spectra for C1s of the respective samples are shown in FIG. 8. The area intensity of each C1s spectrum illustrated in FIG. 8 is proportional to the ratio of the number density of carbon atoms to the number density of tungsten atoms, all of which were present in the surface region of the hole injection layer composed of tungsten oxide up to several nanometers in depth from the layer surface.

According to FIG. 8, the C1s spectra measured on the samples with 1-minute irradiation or longer are all substantially equal in intensity. This indicates that the adherent removal effect has substantially reached a level of saturation with the irradiation for the duration of one minute or longer.

Generally, a C1s spectrum tends to be low in intensity and roughly irregular as shown in FIG. 8, because the amount of adherents is intrinsically small. Therefore, C1s spectra may not serve the best in determining saturation of the adherent removal effect. In view of this, the following describes other methods involving the use of spectra of relatively strong intensity, for determining saturation of the adherent removal effect.

The first of such a method is to make a saturation determination based on changes in the shape of a UPS spectral region corresponding to a range of binding energy around the top of the valence band (i.e., the UPS spectral region corresponding to the binding energy range from 4.5 eV to 5.4 eV). A peak or shoulder appearing in the spectral region indicates a lone pair of electrons in the 2p orbital in oxygen atoms constituting tungsten oxide.

Figure 9:
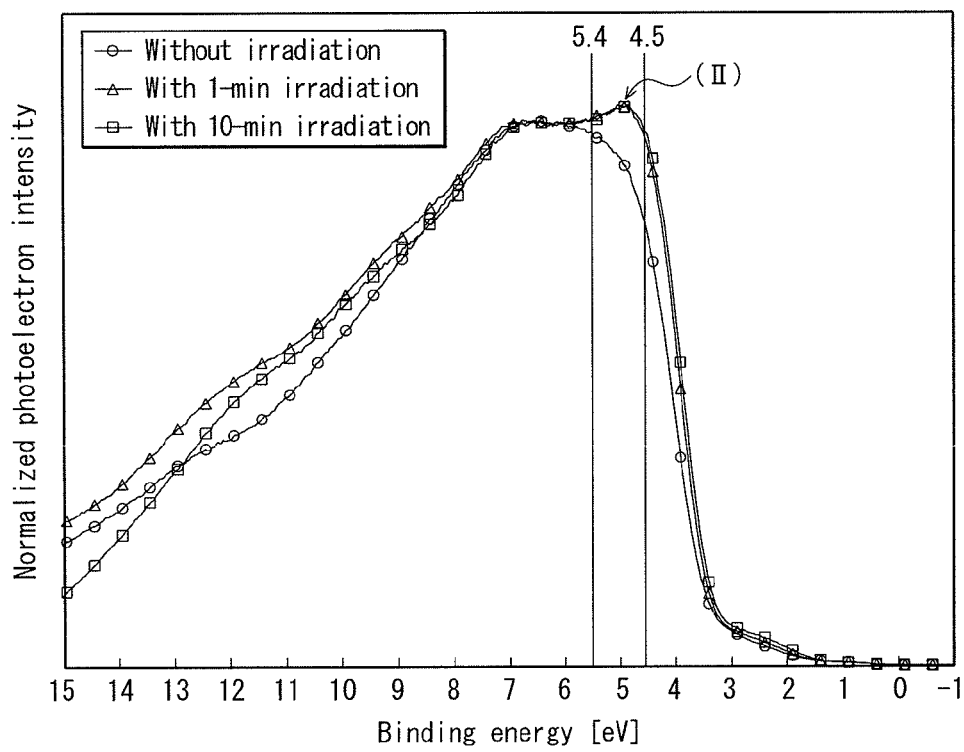
FIG. 9 is a view illustrating UPS spectra of tungsten oxide.

FIG. 9 illustrates the UPS spectra. The UPS measurements were made on the respective samples without irradiation, with 1-minute irradiation, and with 10-minute irradiation. The photoelectron intensity is normalized using a gentle peak appearing around the binding energy of 6.5 eV. As shown in FIG. 9, the spectra measured on samples with 1-minute irradiation and with 10-minute irradiation both have a clear peak (denoted by (ii) in the figure) appearing in the binding energy range from 4.5 eV to 5.4 eV. Such a peak does not appear in the spectrum measured on samples without irradiation. In addition, the respective spectra measured on samples with 1-minute irradiation and with 10-minute irradiation are substantially identical in the shape of the peak. This means that changes in the UPS spectral shape within the binding energy range from 4.5 eV to 5.4 eV substantially converge with the irradiation for the duration of one minute or longer. This behavior is similar to that observed in C1s spectra. In addition, this behavior is assumed to indicate, similarly to C1s spectra, that the adherent removal effect is obtained by UV irradiation and that the effect becomes saturated with the irradiation performed for the duration of one minute or longer.

Figure 10:
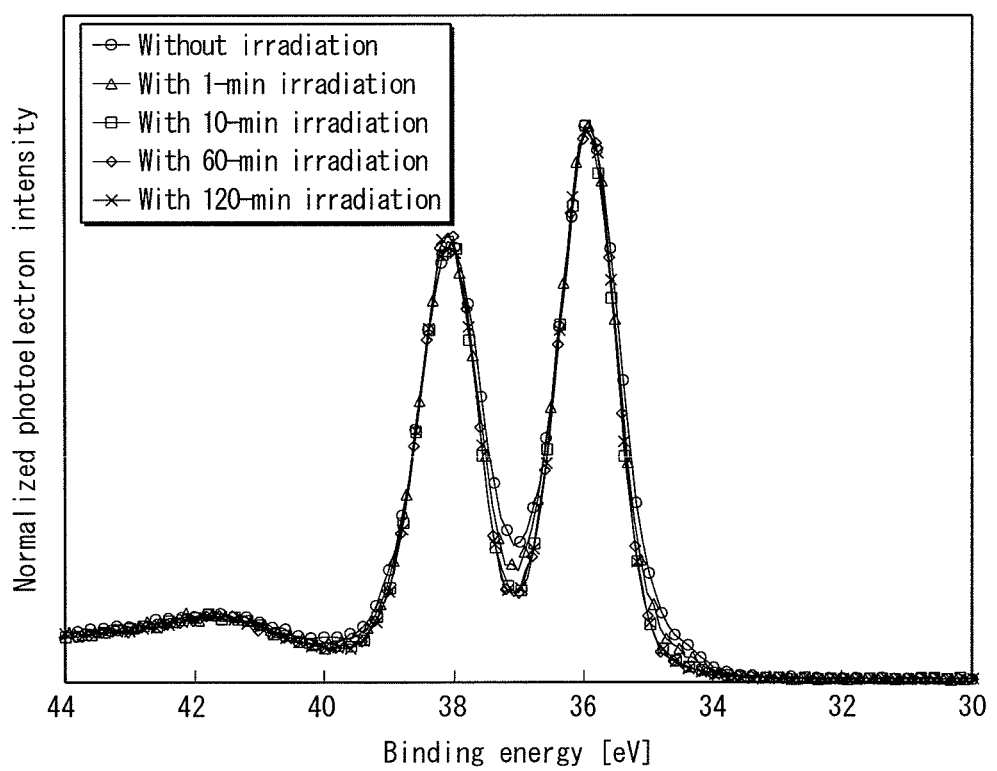
FIG. 10 is a view illustrating XPS spectra of tungsten oxide.

The second one of such a method uses XPS measurements to make a saturation determination based on changes in the W4f spectral shape. FIG. 10 shows W4f spectra measured on the respective samples without irradiation, with 1-minute irradiation, with 10-minute irradiation, with 60-minute irradiation, and with 120-minute irradiation. The spectra are normalized using the maximum and minimum values.

As shown in FIG. 10, all the samples with irradiation exhibit a peak steeper than a peak exhibited by the samples without irradiation (i.e., the half-width of each peak is smaller). It is noted, in addition, that the peak shape is slightly steeper for the samples with 10-minute irradiation than for the samples with 1-minute irradiation. Yet, for the samples with 10-minute irradiation, with 60-minute irradiation, and with 120-minute irradiation, the spectra coincide substantially entirely. This means that changes in the spectral shape converge for any samples with irradiation performed for the duration of ten minutes or longer.

Such changes in shape of W4f spectra resulting from different irradiation durations are explained in the following way, for example. Although it depends on the configuration of adherents, provided that the adherents supply negative charges to tungsten atoms present on the layer surface, the binding energy of the inner-shell orbital W4f becomes lower according to the negative charges. Chemically speaking, some of hexavalent tungsten atoms present on the layer surface of tungsten oxide change into lower-valent atoms, such as pentavalent atoms. In the XPS spectrum for W4f, this energy level shift is observed as a broader spectral shape because of the spectrum for hexavalent tungsten atoms, which make up the majority, overlaps with the spectrum for lower-valent tungsten atoms, which make up a small proportion.

In view of the above, with respect to the spectra illustrated in FIG. 10, it is assumed that the peak is sharper in shape because the removal of adherents by the UV irradiation alters pentavalent tungsten atoms back into hexavalent atoms. From the above observation, it is understood that most of the adherents are removed by the UV irradiation performed for one minute and that the adherent removal effect has reached a level of saturation with the UV irradiation performed for ten minutes or longer. This behavior is similar to that observed on C1s.

In addition, although not illustrated in the figure, it is confirmed that the changes in the shape of the spectra for O1s orbital of oxygen atoms converge with the UV irradiation performed for ten minutes or longer.

From the above, the adherent removal effect achieved by the UV irradiation according to the present embodiment becomes saturated with the UV irradiation performed for a certain duration or longer. In the case where the metal oxide is tungsten oxide, the irradiation conditions are determined as follows. For example, the irradiation duration is determined by measuring, with respect to any specific irradiation intensity, the time taken for changes in the shape of the narrow-scan spectrum for W4f or O1s in XPS measurement converge or changes in the shape of UPS spectral region corresponding to the binding energy range from 4.5 eV to 5.4 eV converge. The time thus measured is determined to be the irradiation duration. More specifically, a spectrum measured after the UV irradiation for n-minute is compared with a spectrum measured after the UV irradiation for (n+1)-minute to obtain the difference between the two spectra at each of a plurality of measurement points. If the root-mean-square of the differences in the normalized intensity becomes equal to a specific value or smaller, it is then determined that the changes in the spectral shape converge with the irradiation duration of n-minutes and thus the maximum level of adherent removal has been completed. In this embodiment, it is determined from FIGS. 9 and 10 that the adherent removal effect becomes saturated with the UV irradiation performed for ten minutes.

(Regarding Maintaining Electronic State After UV Irradiation)

According to the present embodiment, the energy level resulting from structures similar to oxygen vacancies, which favorably affect the hole-injection ability and the Schottky ohmic contact ability, is maintained throughout the time from the surface cleaning and at least until another layer is formed on the cleaned surface. The grounds are as follows.

The UPS spectra shown in FIG. 6 described above were measured two days after the UV irradiation. That is, between the samples without irradiation and the samples with the respective irradiation durations that were left to stand in the atmosphere for two days after the UV irradiation, there is no notable difference in the spectral protrusion near the Fermi surface of the UPS spectra. In each UPS spectrum, the spectral protrusion is clearly observed. In addition, although not illustrated in the figures, measurements were made on samples two hours after the UV irradiation and one day after the UV irradiation. In these measurements, the spectral protrusion near the surface was clearly observed in each spectrum in a manner similar to FIG. 6. That is to say, it is confirmed that the energy level resulting from structures similar to oxygen vacancies are sustained in the atmosphere at least for two days after the UV irradiation.

This time period of two days is sufficiently long as compared with the time lapsed until the step of laminating the buffer layer and the electron injection layer on the hole injection layer is completed (normally within a couple of hours) after the step of cleaning the hole injection layer by UV irradiation. That is, unless the step of forming the buffer layer is intentionally delayed, it is unlikely that the buffer layer and the electron injection layer are not formed until after this two-day period.

(Regarding Improvements on EL Element Characteristics by UV Irradiation)

The organic EL elements constituting the organic EL display panel according to the present embodiment manufactured using the step of cleaning the hole injection layer by UV irradiation exhibits better characteristics as compared with organic EL elements constituting the organic EL display panel manufactured without UV irradiation. Such characteristics are confirmed by the following experiments.

First, the inventors prepared hole-only devices as assessment devices to be used in accurately determining the effect on the hole injection efficiency achieved by removing adherents from the surface of the hole injection layer by UV irradiation.

Generally, in an organic EL element, electric current is formed of carriers, which consists of holes and electrons. As such, the electrical characteristics of an organic EL element reflects electron current as well as hole current. In a hole-only device, however, the injection of electrons from the cathode is blocked, and there is almost no flow of electron current. Therefore, the electrical current consists almost entirely of hole current, and the carriers can be considered almost entirely to be holes. A hole-only device is therefore desirable when assessing hole injection efficiency.

Figure 11:
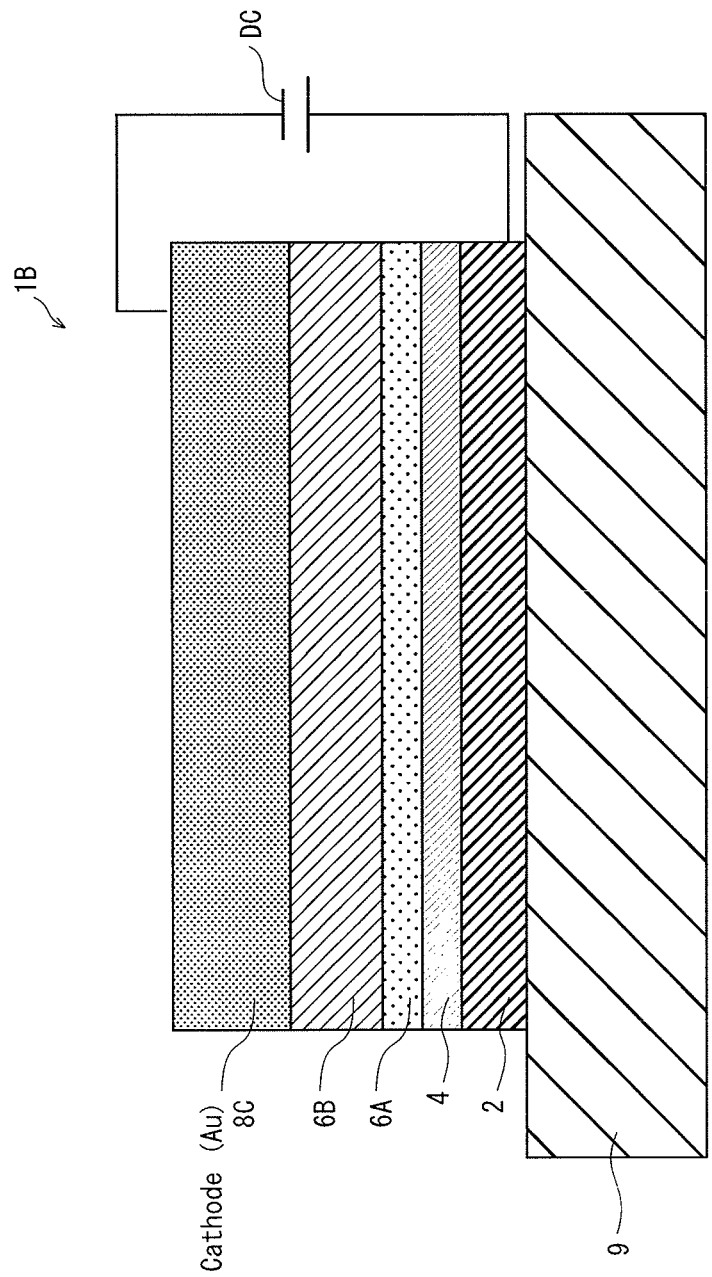
FIG. 11 is a schematic cross-sectional view illustrating a structure of a hole-only device.

Specifically, the hole-only device 1B is manufactured as follows. First, a 50 nm-thick ITO thin film is formed as the anode 2 on the substrate 9 by a sputtering method, as illustrated in FIG. 11. Then, a 30 nm-thick tungsten oxide layer is formed as the hole injection layer 4 on the anode 2, by a predetermined sputtering method in a manner that the layer surface has the energy level resulting from structures similar to oxygen vacancies. Then, a 20 nm-thick layer of TFB, which is an amine-containing organic polymer, is formed as the buffer layer 6A on the hole injection layer 4, and a 70 nm-thick layer of F8BT, which is an organic polymer, is formed as the light-emitting layer 6B. Finally, a 100 nm-thick layer of gold is formed as the cathode 8C on the light-emitting layer 6B.

Note that two hole-only devices 1B were prepared. One of the hole-only devices 1B had the hole injection layer exposed to the UV light according to the present embodiment (for the irradiation duration of 10 minutes) after the hole injection layer is formed and taken out of the chamber of the sputtering film-forming apparatus. The other of the hole-only devices 1B had the hole injection layer not exposed to UV light. Hereinafter, the former hole-only device 1B is referred to as "HOD with irradiation", whereas the latter hole-only device 1B is referred to as "HOD without irradiation".

The completed hole-only devices 1B were then connected to a direct current power supply DC, and voltage was applied thereto. Furthermore, by changing the applied voltage, an electric current value per unit surface area (electric current density) was calculated for different voltages. Note that hereinafter, the "driving voltage" refers to a voltage applied to obtain the current density value is 0.4 mA/cm$^2$.

The hole injection efficiency of the hole injection layer is said to be higher as the driving voltage is smaller, for the following reason. That is, the members composing the hole-only devices 1B, other than the hole injection layer, were prepared according to the same manufacturing method. Thus, it could be assumed that the hole injection barrier between two adjacent layers, other than that between the hole injection layer and the buffer layer is uniform in each of the hole-only devices 1B. Considering the above, it could be expected that the differences in driving voltage of the hole-only devices 1B resulting from whether or not the surface of the hole injection layer was exposed to UV light closely reflects the hole injection efficiency from the hole injection layer to the buffer layer.

Table 2 illustrates each of the hole-only devices 1B and a driving voltage thereof.

TABLE 2

| Sample Name | Drive Voltage |
| --- | --- |
| HOD with Irradiation | 18.9 V |
| HOD without Irradiation | 19.7 V |

Figure 12:
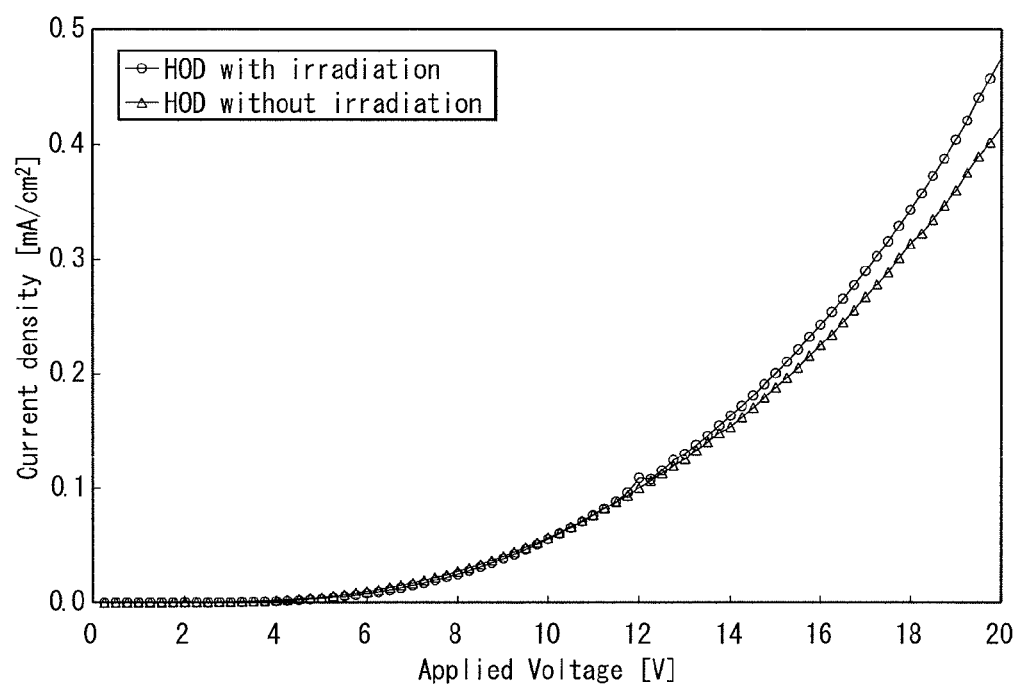
FIG. 12 is a device characteristics diagram showing relation curves illustrating relations between applied voltage and electric current density of hole-only devices.

In addition, FIG. 12 illustrates an electric current density-applied voltage curve of each of the hole-only devices 1B. In the figure, the vertical axis indicates electric current density (mA/cm$^2$), whereas the horizontal axis indicates applied voltage (V).

As shown in Table 2 and FIG. 12, when comparing the HOD with irradiation to the HOD without irradiation, the drive voltage is lower and the rising of the electric current density-applied voltage curve is quicker. Further, it could be seen that HOD with irradiation requires for the lowest level of applied voltage to reach a high electric current density compared with HOD without irradiation. That is, HOD with irradiation has a higher degree of hole injection efficiency compared with HOD without irradiation.

In the above, observation has been made of the hole injection efficiency from the hole injection layer to the buffer layer in each of the hole-only devices 1B. However, the organic EL elements constituting the organic EL display panel are essentially the same as hole-only devices 1B in terms of the effect imposed by the adherent removal by the UV irradiation on the efficiency of hole injection form the hole injection layer to the buffer layer.

Figure 13:
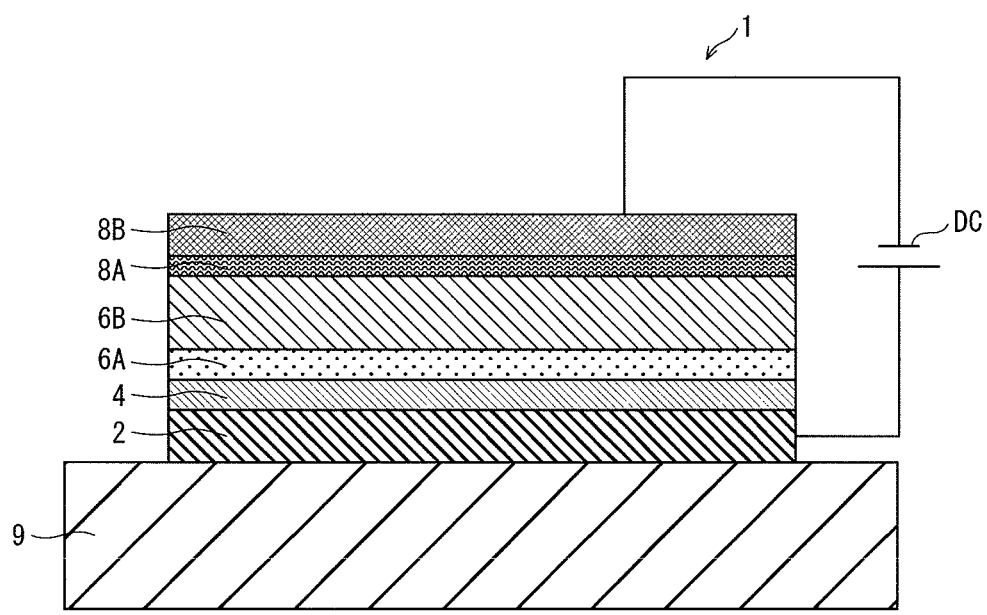
FIG. 13 is a schematic cross-sectional view illustrating a structure of an organic EL element as an assessment device.

To confirm this point, the inventors manufactured organic EL elements 1 as assessment devices. The inventors prepared the organic EL elements 1 as illustrated in FIG. 13 by forming the 50 nm-thick anode 2 composed of an ITO thin film on the substrate 10, and further disposing, on the anode 2 so formed, the following layers in the order in which they are introduced: a 30 nm-thick hole injection layer 4 composed of tungsten oxide; a 20 nm-thick buffer layer 6A composed of TFB, which is an organic amine-containing polymer; a 70 nm-thick light-emitting layer 6B composed of F8BT, which is an organic polymer; the electron injection layer 8A composed of a 5 nm-thick barium layer; and the cathode 8B composed of a 100 nm-thick aluminum layer.

In order to confirm the above, two samples of organic EL element 1 were prepared. One of the samples were prepared using the hole injection layer exposed to UV light, and the other of the samples were prepared using the hole injection layer not exposed to UV light. Hereinafter, the former sample of the organic EL element 1 is referred to as "BPD with irradiation", whereas the latter is referred to as "BPD without irradiation". Except that the hole injection layer of the BPD without irradiation was not exposed to UV light, the BPDs were manufactured by the same manufacturing method.

Each sample organic EL apparatus 1 thus prepared was connected to the DC power source, so that voltage was applied thereto. Furthermore, by changing the applied voltage, an electric current value per unit surface area (electric current density) was calculated for different voltages. Note that hereinafter, the "driving voltage" refers to a voltage applied to obtain the current density value is 10 mA/cm².

Table 3 illustrates each of the sample organic EL elements 1 and a driving voltage thereof.

TABLE 3

| Sample Name | Drive Voltage |
|---|---|
| BPD with Irradiation | 8.3 V |
| BPD without Irradiation | 9.2 V |

Figure 14:
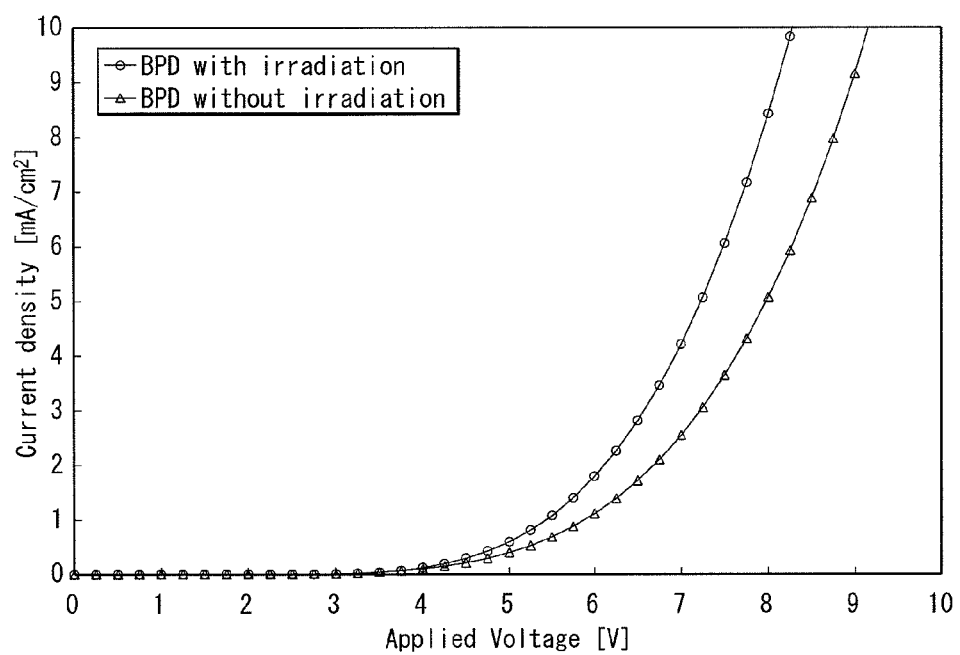
FIG. 14 is a device characteristics diagram of relation curves each illustrating a relation between applied voltage and electric current density of a different organic EL element.

In addition, FIG. 14 illustrates an electric current density-applied voltage curve of each of the sample organic EL elements 1. In the figure, the vertical axis indicates electric current density (mA/cm²), whereas the horizontal axis indicates applied voltage (V).

As shown in Table 3 and FIG. 14, when comparing the BPD with irradiation to the BPD without irradiation, the drive voltage is lower and the rising of the electric current density-applied voltage curve is quicker. Further, it could be seen that BPD with irradiation requires for the lowest level of applied voltage to reach a high electric current density compared with BPD without irradiation. This tendency is the same as that observed with the HOD with irradiation and HOD without irradiation.

By the above experiments, it is confirmed regarding the organic EL element 1 that the effect imposed on the hole injection efficiency from the hole injection layer to the buffer layer as a result of removal of adherents by UV irradiation to the surface of the hole injection layer is similar to that confirmed with the hole-only devices 1B.

By the above experiments, the following is confirmed. That is, by UV irradiation performed in a predetermined manner according to the present embodiment after the hole injection layer is formed, adherents are removed to the maximum extent from the surface of the hole injection layer without affecting the energy level resulting from structures similar to oxygen vacancies. This means that Adherents, which are likely to cause increase of the drive voltage and decrease of the life of the organic EL element 1, are removed without impairing the hole injection ability. Consequently, the efficiency in injecting holes from the hole injection layer to the buffer layer is improved, so that excellent characteristics of the organic EL element is realized.

(Regarding Wavelength of Ultraviolet Light)

According to the present embodiment, after the hole injection layer is formed, adherents on the hole injection layer is removed by radiating ultraviolet light of a predetermined wavelength in the atmosphere. An organic EL display panel 110 having the hole injection layer having been subjected to the adherents removal operates on a lower drive voltage than an organic EL display panel manufactured without removal of adherents. The wavelength of ultraviolet light was determined through the following observations.

First, the wavelength of ultraviolet light that generates ozone ($O_3$) in a gas atmosphere containing oxygen molecules ($O_2$), such as in the atmosphere is 184.9 nm. By the following reaction, the oxygen molecules are decomposed by ultraviolet light at 184.9 nm to yield oxygen radicals, which are then combined with remaining oxygen molecule to generate ozone.

In addition, the wavelength of ultraviolet light causing further decomposition of ozone to yield oxygen radicals again is 253.7 nm.

In UV ozone cleaning, ultraviolet light at 184.9 nm and 253.7 nm is employed to generate oxygen radicals and their strong oxidation is used to remove adherents. Therefore, like the hole infection layer subjected to the UV ozone cleaning in the experiments described above, there is a risk that the energy level resulting from structures similar to oxygen vacancies disappears almost completely from the layer surface by UV ozone cleaning.

In view of the above risk, the present embodiment uses ultraviolet light in a wavelength region of 184.9 nm or longer as such ultraviolet light is not likely to cause decomposition of oxygen molecules to yield oxygen radicals. It is also preferable to use ultraviolet light within a wavelength region of 253.7 nm or longer in order to avoid decomposition of atmospheric oxygen into ozone to yield oxygen radicals although the amount of such oxygen is small.

Figure 15:
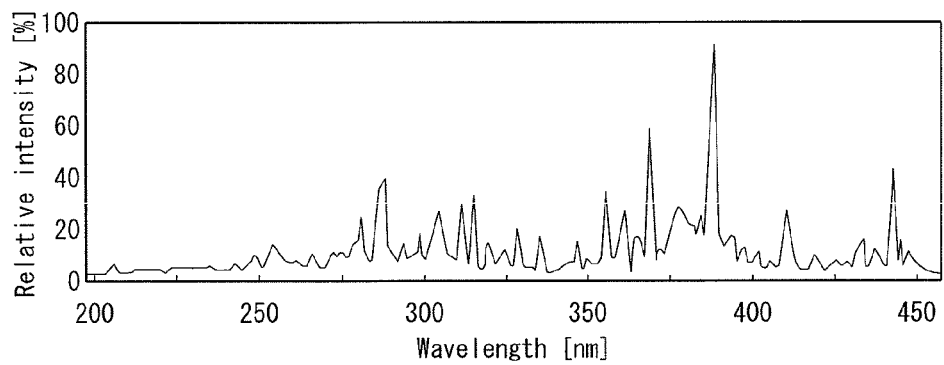
FIG. 15 is a view illustrating the spectral distribution of a metal halide lamp employed in an embodiment of the present invention.

The metal halide lamp actually used in the present embodiment has a spectral distribution illustrated in FIG. 15. As illustrated in the figure, the present embodiment uses a lamp that emits light of wavelengths of 253.7 nm or shorter as little as possible. In light emitted by the metal halide lamp, the intensity at 253.7 nm or shorter is at most a few percent of the maximum intensity (at about 380 nm).

Next, the binding energies between different combinations of atoms that may present in typical adherents are shown in Table 4. In the table, the mark "=" indicates double bond, whereas the mark "—" indicates single bond. To remove adherents, first, it is required to irradiate the layer surface with light having energy stronger than the bonding energies to break the bonds.

TABLE 4

| Binding | Binding Energy |
|---|---|
| C=C | 607 |
| C—C | 348 |
| C=O | 724 |
| C—O | 352 |
| C—H | 413 |
| O=O | 490 |
| O—O | 139 |
| O—H | 463 |

Note that the light energy E per mol of photons and the wavelength λ are in the inverse proportion shown below.

$$E = Nhc/\lambda\ (N\text{: Avogadro's number, } h\text{: Planck's constant, } c\text{: velocity of light, and } \lambda\text{: wavelength})$$

From the above expression, the energy of ultraviolet light at the wavelength 184.9 nm is calculated to be 647 kJ/mol. Similarly, the energy of ultraviolet light at the wavelength 253.7 nm is calculated to be 472 kJ/mol. With reference to Table 4, the energy value of the ultraviolet light in the wavelength region determined according to the present embodiment is sufficient to disconnect most of atomic bonds typically appearing in adherents. Especially, as will be later described in detail, in the case of chemical adsorption, adherents mainly make single bonds to oxygen atoms present in tungsten oxide. The strongest singe bond with atoms present in adherents is O—H bond with the bonding energy of 463 kJ/mol (corresponding to wavelength of 258 nm) or so. Therefore, the ultraviolet light within the wavelength region of the present embodiment is strong enough to break the chemical bond. In the case of physical adsorption, the bonding is far weaker than chemical adsorption, so that such adherents are readily removed by UV irradiation.

The above describes the reason why the ultraviolet light used in the present embodiment is sufficient to remove adherents.

Indeed, the efficiency of adherent removal by the UV radiation according to the present embodiment is essentially lower than UV ozone cleaning. This is because the UV ozone cleaning ensures that adherents being unbonded are immediately oxidized with oxygen radicals to form molecules such as $CO_2$ and $H_2O$, which easily migrate. As has been already described, however, UV ozone cleaning is not suitable for cleaning the hole injection layer composed of metal oxide, such as tungsten oxide.

To be noted next is that atomic bonds occurring in metal oxide is not generally broken by the energy of ultraviolet light within the wavelength region according to the present embodiment. According to Non-Patent Literature 3, for example, the binding energy between oxygen atom and tungsten atom in tungsten oxide is 672 kJ/mol (corresponding to the wavelength of 178 nm). That is, it is difficult to break the bond between oxygen atom and tungsten atom with ultraviolet light within the wavelength region according to the present embodiment. This is in contrast with the above-described sputter etching performed in vacuum by using argon ion. With the use of ultraviolet light according to the present embodiment, adherents are removed without breaking atomic bonds present in the hole injection layer composed of metal oxide, such as tungsten oxide. That is, adherents are removed without making the hole injection layer chemically active, i.e., while the hole injection layer is chemically stable.

For the reasons described above, the present invention uses ultraviolet light at the wavelength of 184.9 nm or longer, preferably 253.7 nm or longer. Note that visible light is generally incapable of breaking the bond of chemical adsorption. The present embodiment therefore uses ultraviolet light (380 nm or shorter), rather than visible light.

(Reason for which Energy Level Affecting Hole Injection Ability and Schottky Ohmic Contact Ability are Maintained after UV Irradiation)

According to the present embodiment, the energy level resulting from structures similar to oxygen vacancies on the surface of the hole injection layer is continuously maintained even after UV irradiation and thus the hole injection ability to the buffer layer is maintained with stability, and the schottky ohmic contact ability with the electron injection layer is maintained with stability as well. That is, the present embodiment ensures manufacturing of organic EL display panel 110 which operates on low drive voltage. This property of maintaining the energy level is considered below.

It has been frequently reported, with reference to results of experiments and first principles calculations, that existence of the energy level which can be seen in a thin film of, or a crystal of tungsten oxide, derives from structures similar to oxygen vacancies. More specifically, it is assumed that the existence of the energy level on interest results from bonding orbitals formed, by the absence of oxygen atoms, from the 5d orbitals of adjacent tungsten atoms and also results from the 5d orbitals of singular tungsten atoms not terminated with an oxygen atom and exist on the layer surface or within the layer.

Here, it may be assumed that these 5d orbitals of tungsten atoms are more stable when present in chemically adsorbed adherents, as compared with the case where the 5d orbitals are present as bonding orbitals or as the 5d orbitals of singular tungsten atoms. However, such an assumption is not necessarily correct. Actually, as observed in the UPS spectra illustrated in FIG. 6, tungsten oxide left to stand in the atmosphere for two day exhibits a spectral protrusion near the Fermi surface, which is the indication of the energy level being discussed.

Figure 16:
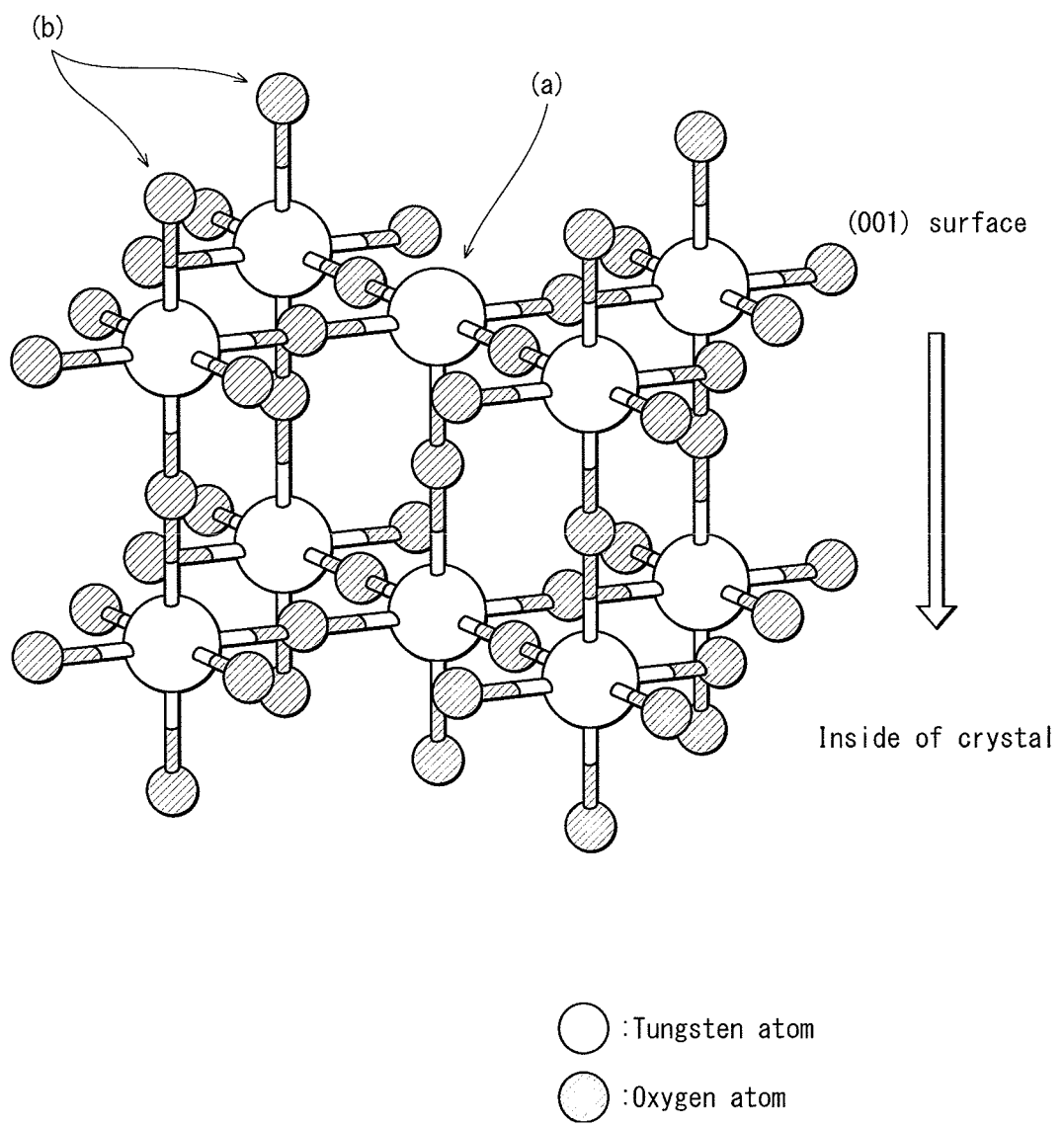
FIG. 16 is a view illustrating the surface configuration of tungsten oxide.

In Non-Patent Literature 4, it has been reported that when tungsten trioxide single crystal is cleaved in vacuum to expose the clean (001) surface, part of oxygen atoms present on the outermost surface are emitted. Non-Patent Literature 4 further reports the following reason, which has been confirmed by the first principles calculations, for which the (001) surface is more stable in terms of energy when a tungsten atom not terminated with an oxygen atom is periodically present on the outermost surface as shown in FIG. 16 than when all the tungsten atoms are terminated with an oxygen atom. That is, when all the tungsten atoms present on the outermost surface are terminated with an oxygen atom, the electrical repulsive force occurring between terminal oxygen atoms becomes large, which causes the instability. In short, the (001) surface is more stable when structures similar to oxygen vacancies (a) are present on the surface.

To simplify the illustration, FIG. 16 shows that the octahedrons, which have, at the vertices, six oxygen atoms binding to one tungsten atom, are in perfect alignment, like rhenium trioxide. In reality, the octahedrons are in a slightly distorted arrangement.

By analogy with the above findings, the following mechanism may be one example of the reason for which the energy level resulting from structures similar to oxygen vacancies is maintained on the surface of the hole injection layer continuously after the UV irradiation according to the present embodiment.

According to the present invention, the hole injection layer composed of tungsten oxide is assumed to have a (001) facet at least locally on the layer surface immediately after the formation of the hole injection layer. That is, as illustrated in FIG. 16, the hole injection layer is assumed to have terminal oxygen atoms (b) and tungsten atoms not terminated with an oxygen atom (a). Non-terminated tungsten atoms (a) are surrounded by terminal oxygen atoms (b). It is because the (001) surface has a stable structure. It is this surface that is exposed to impurity molecules and atomic molecules in the chamber of the sputtering film-forming apparatus subsequently to the formation of the hole injection layer.

In general, if unsaturated metal atoms such as (a) are present on the layer surface of metal oxide, the metal atoms tend to be terminated with a water or organic molecule as a result of chemical adsorption. In the present embodiment, however, none of the W4f spectra illustrated in FIG. 10 have a peak in a binding energy range from 31 eV to 33 eV at which a peak derived from the bonding between a tungsten atom and a carbon atom should appear. Instead, each W4f spectra illustrated in FIG. 10 has a peak derived from the bonding between a tungsten atom and an oxygen atom. It is therefore highly likely that the atoms of adsorbed molecules to which tungsten atoms (a) are chemically bonded is oxygen atoms.

However, for example, a tungsten atom (a) may chemically react with a water molecule to form a hydroxyl group or a tungsten atom (a) may chemically react with an organic molecule to be bonded to an oxygen atom contained in the organic molecule. In such cases, a repulsive force is generated between an adsorbed oxygen atom, which generally is in negatively charged, and adjacent terminal oxygen atoms (a), which are also negatively charged. In view of the above, it is expected that adsorption of molecules to tungsten atoms (a) is relatively unlikely, for the same reason for which tungsten atoms (a) are unlikely to have terminal oxygen atoms in vacuum.

On the other hand, terminal oxygen atoms (b) surrounding tungsten atoms (a) undergo addition reaction with water molecules and organic molecules to cause chemical adsorption. Such chemical adsorption occurs relatively easily as there is substantially no factor inhibiting adsorption, such as repulsive force. In some cases, the chemical adsorption to terminal oxygen atoms (b) may result in that organic molecules composed of a few or more atoms are present in the immediate vicinity of tungsten atoms (a). Such organic molecules act as spatial barriers to against adsorbing molecules. Therefore, adsorption of molecules to terminal oxygen atoms (b) is also expected to prevent adsorption of molecules to tungsten atoms (a).

From the above consideration, in the layer surface having: terminal oxygen atoms (b); and tungsten atoms (a) not terminated with an oxygen atom and surrounded by the terminal oxygen atoms (b) as illustrated in FIG. 16, the occurrence of chemical adsorption to the tungsten atoms (a) is less likely. Instead, impurity molecules and atomic molecules tend to chemically adhere to the terminal oxygen atoms (b) surrounding tungsten atoms (a). Note that the chemical adsorption occurring in this case is a bond via a terminal oxygen atom and thus generally is a single bond.

In response to the UV irradiation according to the present embodiment, only molecules chemically bonded to oxygen atoms (b) are disconnected and released. As a result, it is expected that the oxygen atoms (b) revert to terminal oxygen atoms as they were before the chemical adsorption or react with water molecules to form hydroxyl groups, which are stable and not easily disconnected by the UV irradiation according to the present embodiment.

To summarize the above, the hole injection layer composed of tungsten oxide according to the present embodiment has, on the layer surface, the local structure as illustrated in FIG. 16. That is, tungsten atoms (a) not terminated with an oxygen atom are surrounded by terminal oxygen atoms (b). First of all, this structure per se has a characteristic which prevents adsorption of molecules. In addition, molecules adhered to terminal oxygen atoms (b) are released by UV irradiation, after which hydroxyl groups mainly remain present on the layer surface. In this manner, while adherents are removed by UV radiation performed after the layer formation, the electronic state resulting from structures similar to oxygen vacancies (a) on the layer surface is maintained without being affected by the UV irradiation. The electron state thus maintained positively affects the hole injection ability.

(Conditions for Forming Tungsten Oxide Layer)

In the present embodiment, the tungsten oxide film constituting the hole injection layer is formed under predetermined conditions, thereby providing the hole injection layer with the above-described occupied energy level near the Fermi surface. This reduces the hole injection barrier between the hole injection layer and the buffer layer and allows for driving of the organic EL display panel 110 at a low voltage.

A method for obtaining a tungsten oxide film having the above-described characteristics employs a DC magnetron sputtering device, with metal tungsten as the sputtering target. The chamber gas is composed of argon gas and oxygen gas. It is considered desirable to form the tungsten oxide film with the reactive sputtering method under the following conditions: gas pressure (total gas pressure) is higher than 2.7 Pa and lower than or equal to 7.0 Pa; the ratio of oxygen partial pressure to the total pressure is at least 50% and at most 70%; and the input power per unit surface area of the target (input power density) is at least 1 $W/cm^2$ and at most 2.8 $W/cm^2$.

The effectiveness of such film forming conditions described above has been confirmed through the following experiments.

First, hole-only devices 1B shown in FIG. 11 were prepared as assessment devices to be used in accurately assessing the dependence of the efficiency of hole injection, from the hole injection layer to the buffer layer, on the film forming conditions.

In the manufacturing process, the hole injection layers were formed by applying the reactive sputtering method with a DC magnetron sputtering device. The gas introduced into the chamber was composed of at least one of argon gas and oxygen gas, and the sputtering target used was metal tungsten. Further, no control was performed regarding substrate temperature, while control of argon partial pressure, oxygen partial pressure, and total gas pressure within the chamber was performed by adjusting the flow amount of the respective gases. Furthermore, in order as to obtain the hole-only devices, changes were made to certain film forming conditions, namely total gas pressure, oxygen partial pressure, and input power, as illustrated in Table 5. As a result, hole-only devices 1B (element Nos. 1 through 14), each having a hole injection layer formed under different film forming conditions, were obtained. Note that, hereinafter, oxygen partial pressure is indicated as a ratio (%) with respect to the total pressure of the gases in the chamber of the sputtering device.

TABLE 5

Film Forming Conditions of the Hole-only Devices 1B

| | Device No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Oxygen Partial Pressure (%) | 70 | 50 | 100 | 50 | 70 | 100 | 70 | 50 | 100 | 50 | 70 | 30 | 30 | 50 |
| Total Pressure (Pa) | 2.7 | 4.8 | 1.7 | 1.7 | 2.7 | 1.7 | 2.7 | 4.8 | 1.7 | 2.7 | 1.7 | 1.7 | 2.7 | 4.8 |
| Input Power (W) | 500 | 500 | 500 | 500 | 250 | 250 | 1000 | 1000 | 1000 | 500 | 500 | 500 | 500 | 250 |
| T-S (mm) | 113 | 113 | 113 | 113 | 113 | 113 | 113 | 113 | 113 | 113 | 113 | 113 | 113 | 113 |
| Film Forming Rate (nm/s) | 0.164 | 0.14 | 0.111 | 0.181 | 0.057 | | 0.308 | 0.311 | 0.246 | 0.154 | 0.153 | 0.364 | 0.177 | 0.049 |
| Film Thickness (nm) | 30 | 30 | 30 | 30 | 30 | 30 | 30 | 30 | 30 | 30 | 30 | 30 | 30 | 30 |

Table 6 illustrates a relation between input power and input power density of the above-presented DC magnetron sputtering device.

TABLE 6

| Input Power (W) | Input Power Density (W/cm$^2$) |
|---|---|
| 250 | 1.4 |
| 500 | 2.8 |
| 1000 | 5.6 |

The completed hole-only devices 1B were then connected to a direct current power supply DC, and voltage was applied thereto. Furthermore, by changing the applied voltage, an electric current value per unit surface area (electric current density) was calculated for different voltages. Hereinafter, the expression "driving voltage" refers to the voltage applied when the current density value is 10 mA/cm$^2$.

It can be inferred that as the driving voltage grows smaller, the efficiency of hole injection from the hole injection layer to the buffer layer is higher. This is because the components of each hole-only device 1B other than the hole injection layer are prepared according to the same manufacturing method. Therefore, other than the hole injection layer, the hole injection barrier between two adjacent layers can be assumed to be constant. Furthermore, as described below, it was confirmed through another experiment that the anode 2 and the hole injection layer in this experiment are in Schottky ohmic contact. Accordingly, the differences in driving voltage depending on the conditions for forming the hole injection layer strongly reflect the hole injection efficiency from the hole injection layer to the buffer layer and the hole conduction efficiency of the hole injection layer itself.

It can be assumed that in addition to the hole injection efficiency from the hole injection layer to the buffer layer, the hole conduction efficiency of the hole injection layer also influences the characteristics of the elements in the experiments described in the present embodiment. The below assessment of energy diagrams, however, also clearly indicates that the hole injection barrier between the hole injection layer and the buffer layer is strongly reflected in the characteristics of the elements.

Table 7 illustrates the driving voltages obtained through experiments for each hole-only device 1B under various film forming conditions of total pressure, oxygen partial pressure, and input power. Note that the numbers enclosed in circles in Table 7 indicate the element number of each of the hole-only devices 1B.

TABLE 7

Film Forming Conditions and Driving Voltages of the Hole-only Devices 1B
(Applied Voltage Value under Electric Current Density of 10 mA/cm$^2$)

| | | Total Pressure | | |
|---|---|---|---|---|
| | | 1.7 Pa | 2.7 Pa | 4.8 Pa |
| Oxygen Partial Pressure | 30% | ⑫ 500 W (Unmeasured) | ⑬ 500 W (19 V) | Film could not be formed |
| | 50% | ④ 500 W (19 V) | ⑩ 500 W (19 V) | ⑭ 250 W (13.7 V) |
| | | | | ② 500 W (13.7 V) |
| | | | | ⑧ 1000 W (>20 V) |
| | 70% | ⑪ 500 W (Unmeasured) | ⑤ 250 W (14.7 V) | Film could not be formed |
| | | | ① 500 W (18.2 V) | |
| | | | ⑦ 1000 W (>20 V) | |

TABLE 7-continued

Film Forming Conditions and Driving Voltages of the Hole-only Devices 1B
(Applied Voltage Value under Electric Current Density of 10 mA/cm$^2$)

| | Total Pressure | | |
|---|---|---|---|
| | 1.7 Pa | 2.7 Pa | 4.8 Pa |
| 100% | ⑥250 W (Unmeasured)<br>③500 W (>20 V)<br>⑨1000 W (>20 V) | Film could not be formed | Film could not be formed |

*Numbers enclosed in circles indicate device No., numbers without parenthesis indicate input electricity, and numbers placed in parenthesis indicate driving voltage.

Furthermore, FIGS. 17A through 17C are graphs illustrating the dependence of driving voltages of the hole-only devices 1B on the film forming conditions. Each of the points in FIG. 17A indicates, from left to right in the figure, a driving voltage of element Nos. 4, 10, and 2. Similarly, each of the points in FIG. 17B indicates, from left to right in the figure, a driving voltage of element Nos. 13, 10, and 1. Finally, each of the points in FIG. 17C indicates, from left to right in the figure, a driving voltage of element Nos. 14, 2, and 8.

Here, it should be noted that in the following cases, film formation was not successfully performed due to limitations of the sputtering device, such as gas flow amount: total pressure of 2.7 Pa and oxygen partial pressure of 100%, total pressure of 4.8 Pa and oxygen partial pressure of 30%, total pressure of 4.8 Pa and oxygen partial pressure of 70%, and total pressure of 4.8 Pa and oxygen partial pressure ratio of 100%.

First, concerning the dependence of driving voltage on total pressure, when the oxygen partial pressure ratio was set to 50% and the input power was set to 500 W, a clear reduction in driving voltage was observed when the total pressure was set higher than 2.7 Pa and lower than or equal to 4.8 Pa, as illustrated in FIG. 17A. In addition, as a result of a different experiment, it was found that this trend of reduction in driving voltage continues at least until the total pressure is lower than or equal to 7.0 Pa. Taking this into account, it is desirable that total pressure during the forming of the hole injection layer 4 be set higher than 2.7 Pa and lower than or equal to 7.0 Pa.

Next, concerning the dependence of driving voltage on oxygen partial pressure ratio, when the total pressure was set to 2.7 Pa and the input power was set to 500 W, it was observed that driving voltage decreases as oxygen partial pressure ratio increases, at least when the oxygen partial pressure ratio was set higher than or equal to 50% and lower than or equal to 70%, as illustrated in FIG. 17B. However, as a result of a different experiment, it was found that when the oxygen partial pressure ratio exceeds this range, the driving voltage begins to increase adversely. Taking this into account, it is desirable that oxygen partial pressure ratio during the forming of the hole injection layer be set higher than or equal to 50%, while setting an upper limit at approximately 70%.

Finally, concerning the dependence of driving voltage on input power, when total pressure was set to 4.8 Pa and oxygen partial pressure ratio was set to 50%, a rapid increase in driving voltage was observed when the input power exceeded 500 W, as illustrated in FIG. 17C. Taking this into account, it is desirable that input power be restricted to be lower than or equal to 500 W. Here, it should be noted that, when referring to elements Nos. 1 and 3 in Table 7, it could be seen that, even when the input power was set to 500 W, driving voltage increased when the total pressure was set lower than or equal to 2.7 Pa.

Figure 18:
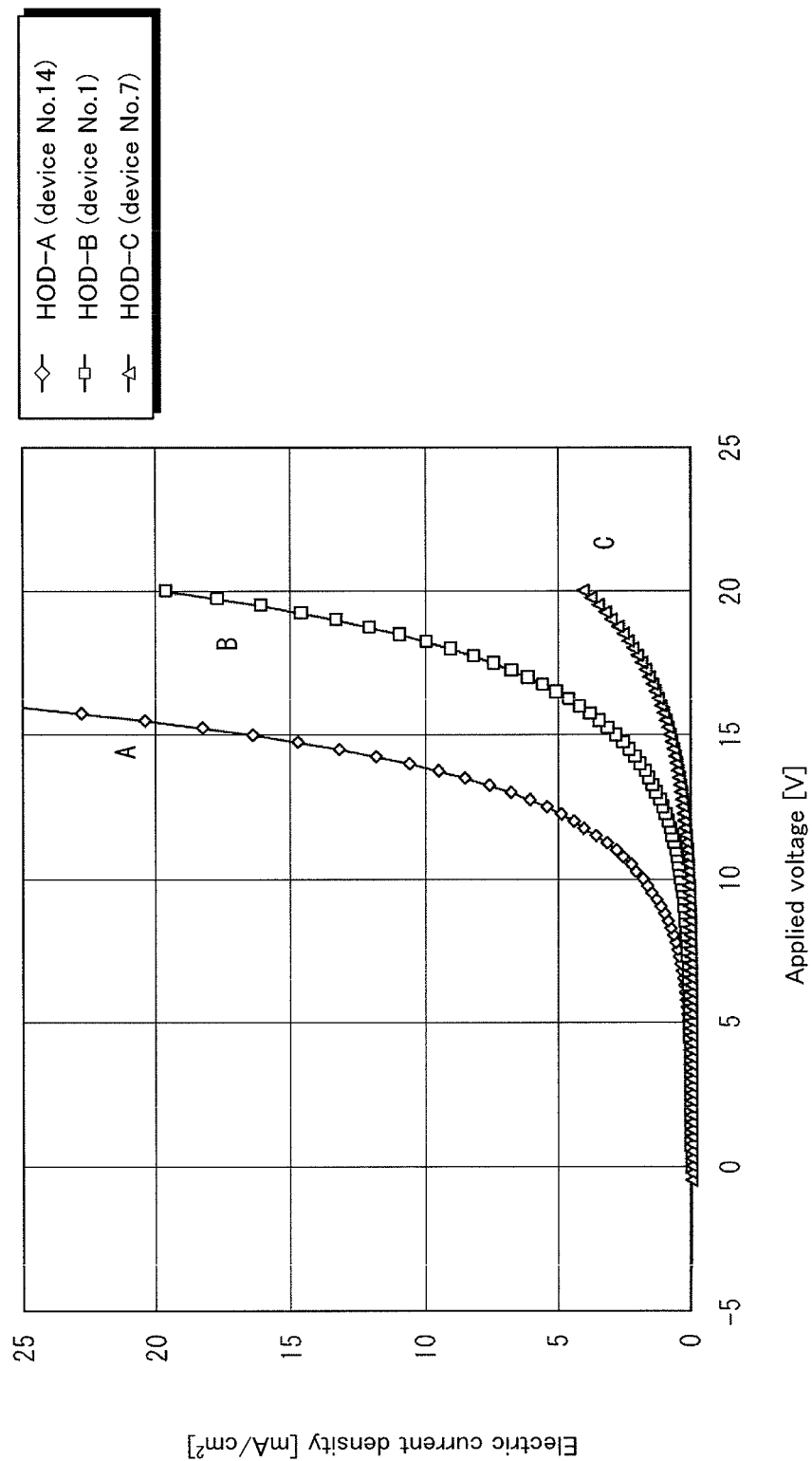
FIG. 18 is a device characteristics diagram showing relation curves illustrating relations between applied voltage and electric current density of hole-only devices.

FIG. 18 is a diagram illustrating a current density-applied voltage curve of the hole-only devices 1B, taking elements Nos. 14, 1, and 7 as examples. In the figure, the vertical axis indicates electric current density (mA/cm$^2$), whereas the horizontal axis indicates applied voltage (V). Furthermore, element No. 14 fulfills all desirable film forming conditions explained in the above of total pressure, oxygen partial pressure, and input power, while on the other hand, each of element Nos. 1 and 7 do not fulfill at least one of the desirable film forming conditions.

Concerning the film forming conditions under which the hole injection layer (and the later-described tungsten oxide layer 12) is formed, in order as to facilitate the explanations to be provided in the following, hereinafter, the film forming conditions under which the hole injection layer was formed in element No. 14 is referred to as film forming conditions A, the film forming conditions under which the hole injection layer was formed in element No. 1 is referred to as film forming conditions B, and the film forming conditions under which the hole injection layer was formed in element No. 7 is referred to as film forming conditions C. In addition, element Nos. 14, 1, and 7 are accordingly labeled HOD-A, HOD-B, and HOD-C in FIG. 18.

As illustrated in FIG. 18, the current density-applied voltage curve indicating HOD-A indicates that HOD-A has a higher degree of responsiveness to an increase in applied voltage compared with HOD-B and HOD-C. Further, it could be seen that HOD-A requires for the lowest level of applied voltage to reach a high current density compared with HOD-B and HOD-C. As a result, as compared to HOD-B and HOD-C, the hole injection efficiency from the hole injection layer to the buffer layer can be inferred to be superior in HOD-A. Here, it should be noted that HOD-A operates at the lowest driving voltage among the hole-only devices 1B.

Thus far, tests on the hole injection efficiency from the hole injection layer to the buffer layer in the hole-only devices 1B have been described. In an organic EL element 1, the dependence on film forming conditions of the hole injection efficiency from the hole injection layer to the buffer layer is essentially the same as the hole-only devices 1B. In order to confirm this point, organic EL elements 1 as illustrated in FIG. 13 were prepared using hole injection layers formed under conditions A, B, and C.

Figure 19:
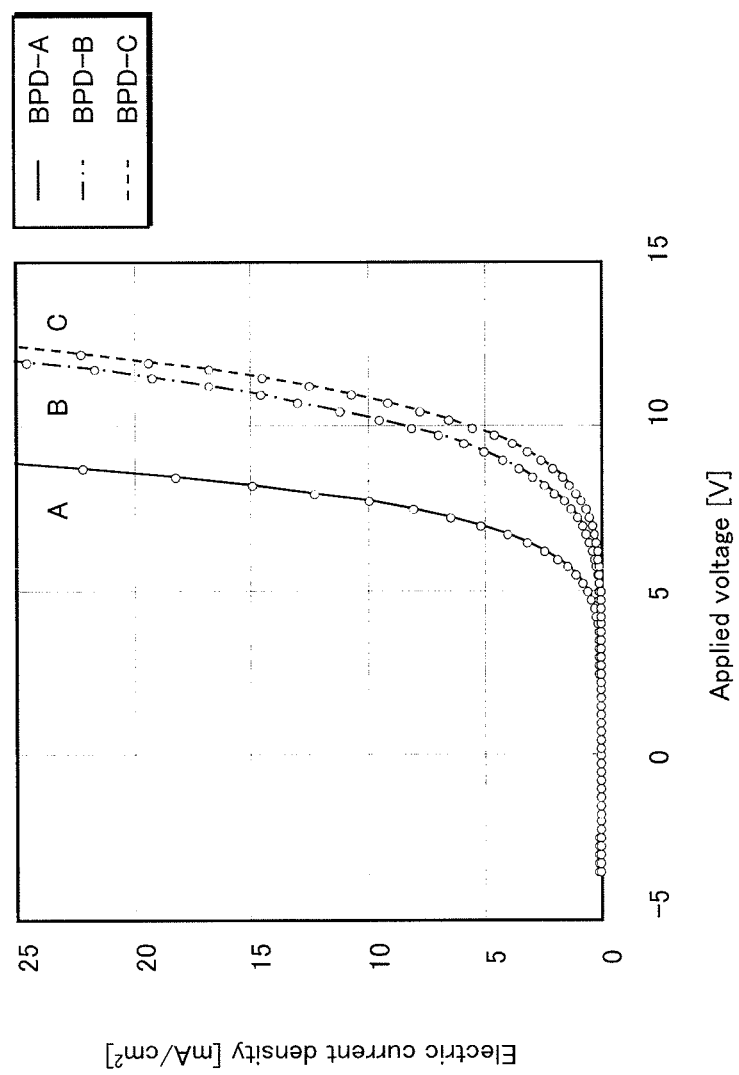
FIG. 19 is a device characteristics diagram showing relation curves illustrating relations between applied voltage and electric current density of organic EL elements.

The organic EL elements 1 prepared under film forming conditions A, B, and C were then connected to a direct current power supply DC, and voltage was applied thereto. FIG. 19 is a diagram illustrating the electric current density-applied voltage curve at this point. In Fig. the drawing, the vertical axis represents the current density (mA/cm$^2$), and the horizontal axis represents the applied voltage (V).

Note that, in order as to facilitate the explanations to be made in the following, the organic El elements 1 prepared under film forming conditions A, B, and C are respectively illustrated as BPD-A, BPD-B, and BPD-C in FIG. 19.

As illustrated in FIG. 19, the current density-applied voltage curve indicating BPD-A indicates that BPD-a has a higher degree of responsiveness to an increase in applied voltage compared with BPD-B and BPD-C. Further, it could be seen that BPD-A requires for the lowest level of applied voltage to reach a high current density compared with BPD-B and BPD-C. This trend is similar to the trend which could be seen in the hole-only devices HOD-A, HOD-B, and HOD-C, which were prepared under the same respective film forming conditions as BPD-A, BPD-B, and BPD-C.

Figure 20:
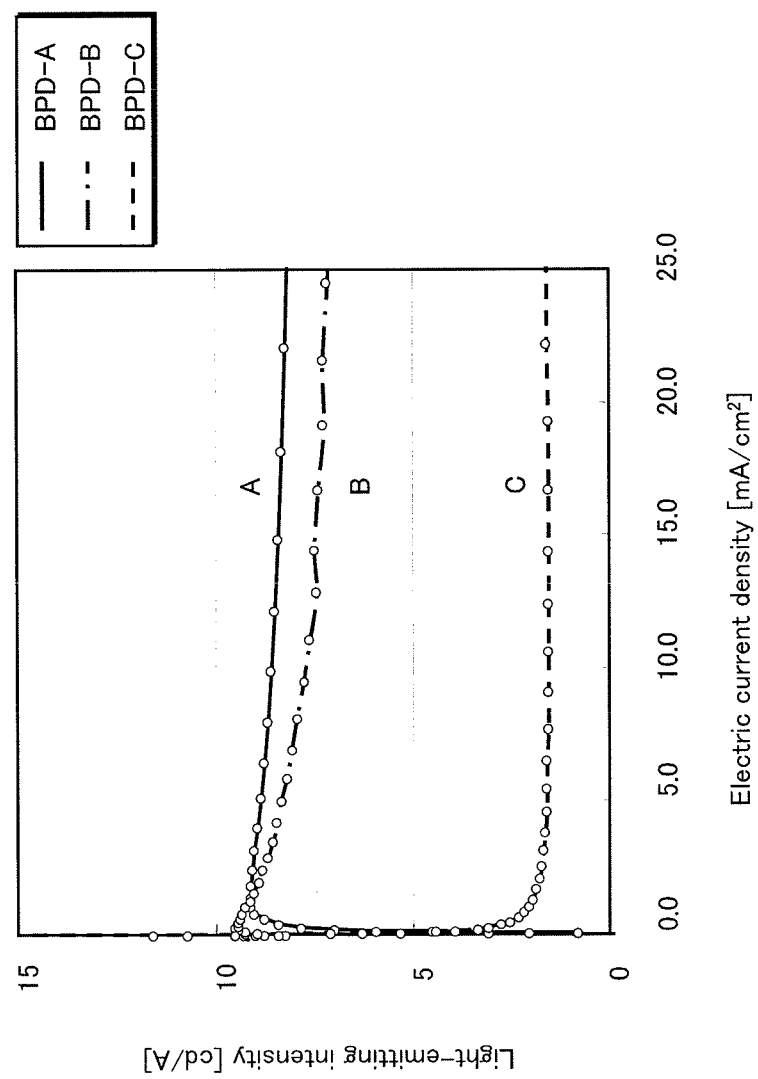
FIG. 20 is a device characteristics diagram showing relation curves illustrating relations between current density and light-emitting intensity of organic EL elements.

In addition, FIG. 20 illustrates light-emitting intensity-electric current density curves corresponding to the above organic EL elements 1, each curve indicating the relation between the change in electric current density and the resultant change in light-emitting intensity. In the figure, the vertical axis represents light-emitting intensity (cd/A), and the horizontal axis represents current density ($mA/cm^2$). The figure shows that the light-emitting intensity was strongest for BPD-A, at least over the range in which the current density was measured.

From the above results, it can be inferred that in the organic EL elements 1, the hole injection efficiency from the hole injection layer to the buffer layer depends on the film forming conditions in the same way as was the case with the hole-only devices 1B. Namely, in the organic EL elements 1 of the present experiment, the tungsten oxide film constituting the hole injection layer was formed using metal tungsten as the sputtering target in a DC magnetron sputtering device, applying the reactive sputtering method without controlling the substrate temperature. The chamber gas was composed of argon gas and oxygen gas, with a total pressure higher than 2.7 Pa and lower than or equal to 7.0 Pa, an oxygen partial pressure ratio of at least 50% and at most 70%, and input power density at least 1 $W/cm^2$ and at most 2.8 $W/cm^2$. Under these conditions, it can be inferred that the hole injection efficiency from the hole injection layer to the buffer layer was good, thereby achieving a superb low driving voltage and high light-emitting efficiency.

Note that among the above conditions, the condition concerning input power is represented in terms of input power density based on Table 6. When using a DC magnetron sputtering device that is different from the DC magnetron sputtering device used in the present experiment, a hole injection layer that achieves an organic EL element 1 with a superb low driving voltage and high light-emitting efficiency, as in the present experiment, can be yielded by adjusting the input power according to the size of the sputtering target so that the input power density fulfills the above condition. Conditions on total pressure and oxygen partial pressure, on the other hand, are independent of the device and the size of the sputtering target.

Additionally, as already explained above, no intentional adjustment of the substrate temperature was performed while forming the hole injection layer by applying the reactive sputtering method, and during the experiment, the sputtering device was placed under room temperature. Therefore, the substrate was at room temperature at least before the forming of the hole injection layer was performed. However, while forming of the layer is being performed, there is a possibility that the substrate temperature may rise by several tens of degrees Celsius.

The hole injection layer of the organic EL display panel 110 according to the present embodiment is manufactured under film forming conditions A, and has the occupied energy level near the Fermi surface as described above. Detailed analysis is to be made regarding this point in the following.

(Electronic State of Hole Injection Layer)

The tungsten oxide constituting the hole injection layer of the organic EL display panel 110 of the present embodiment has the above-described occupied energy level near the Fermi surface. The occupied energy level near the Fermi surface is formed by adjusting the film forming conditions under which the hole injection layer is faulted as described above. Details are provided below.

The inventors conducted an experiment to determine whether the occupied energy level near the Fermi surface exists in each of the tungsten oxide films formed under a corresponding one of film forming conditions A, B, and C.

Figure 21:
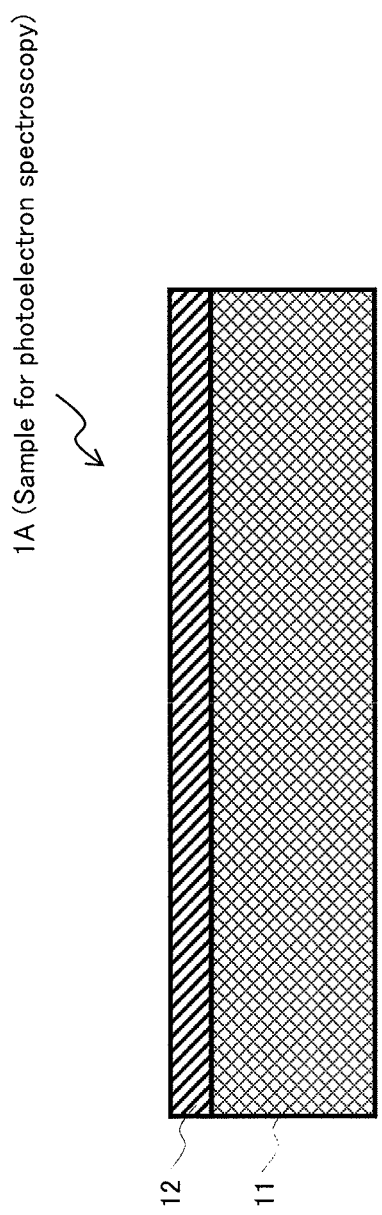
FIG. 21 is a schematic cross-sectional view illustrating a structure of a sample for photoelectron spectroscopy measurement.

The inventors prepared sample devices for photoelectron spectroscopy measurement under film forming conditions A, B, and C. As illustrated by the sample 1A in FIG. 21, each of the samples was prepared by forming a 10 nm-thick tungsten oxide layer 12 (corresponding to the hole injection layer) on a conductive silicon substrate 11 by applying the above-described reactive sputtering method. Hereinafter, a sample 1A formed under film forming conditions A is referred to as sample A, a sample 1A formed under film forming conditions B is referred to as sample B, and a sample 1A formed under film forming conditions C is referred to as sample C.

The forming of the tungsten oxide layer 12 of each of the sample devices was performed inside a sputtering device. Then, to prevent atmospheric exposure, the samples A, B, and C were transported to a glovebox which was connected to the sputtering device and which was filled with nitrogen gas. Subsequently, the sample devices were sealed inside transfer vessels in the glovebox, and were mounted on a photoelectron spectroscopy device. Thus, ultraviolet photoelectron spectroscopy (UPS) measurement of the sample devices was performed while preventing the tungsten oxide layer 12 having been formed on the sample devices from undergoing atmospheric exposure.

In general, a UPS spectrum obtained as a result of the UPS measurement reflects a state of occupied energy levels, such as a valence band and the like, within several nanometers in distance from the surface of the target of measurement. As such, the present experiment was conducted in order as to observe the state of occupied energy levels at a surface portion of the tungsten oxide layer 12 by utilizing UPS measurement.

The conditions under which the UPS measurement was conducted are as follows. Here, it should be noted that, since the samples A, B, and C commonly include the conductive silicon substrate 11, charge-up did not occur during the UPS measurement.

Figure 22:
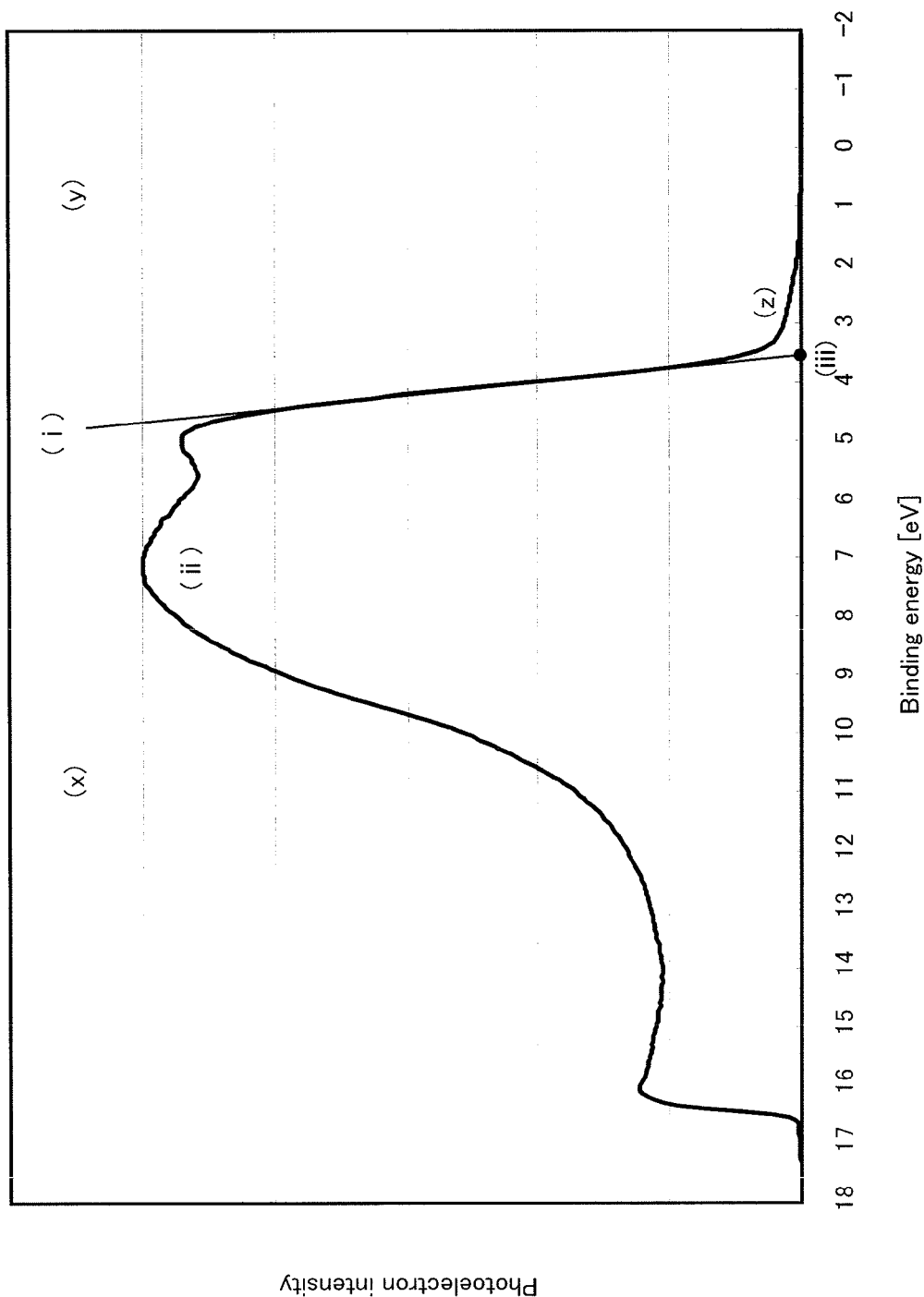
FIG. 22 is a diagram illustrating UPS spectra of a tungsten oxide layer.

Light source: He I line
Bias: None
Electron emission angle: Direction of normal line to the substrate
Interval between measurement points: 0.05 eV FIG. 22 illustrates a UPS spectrum of the tungsten oxide layer 12 of the sample A. The origin of the horizontal axis, which indicates binding energy, corresponds to the Fermi surface of the conductive silicon substrate 11, and the left direction with respect to the origin is positive.

In the following, description is provided on each of the occupied energy levels of the tungsten oxide layer 12 with reference to FIG. 22.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area x that extends in the high binding energy direction departing from point (iii); and area y that extends in the low binding energy direction departing from point (iii).

Here, according to Table 8, each of the samples A, B, and C has a tungsten oxide layer 12 whose composition ratio between tungsten atoms and oxygen atoms is approximately 1:3. The composition ratios were obtained by performing X-ray photoelectron spectroscopy (XPS) measurement. More specifically, XPS measurement of the sample devices was performed by using the photoelectron spectroscopy device while preventing atmospheric exposure of the tungsten oxide layer 12 having been formed on the sample devices, in a similar way as in the UPS measurement. By conducting the XPS measurement, the composition ratio of tungsten to oxygen within several nanometers in distance from the surface of the tungsten oxide layer 12 was estimated for each of the samples A, B, and C. Note that the film forming conditions under which the tungsten oxide layers 12 were formed are also illustrated in Table 8.

TABLE 8

| | Sample | | |
|---|---|---|---|
| | Sample A | Sample B | Sample C |
| | Film Forming Conditions | | |
| | Film forming conditions A | Film forming conditions B | Film forming conditions C |
| Total Pressure (Pa) | 4.8 | 2.7 | 2.7 |
| Oxygen Partial Pressure (%) | 50 | 70 | 70 |
| Input Power (W) | 250 | 500 | 1000 |
| Composition Ratio (oxygen/tungsten) | 3.0 | 2.9 | 2.8 |

Based on the composition ratios, it can be assumed that in each of the samples A, B, and C, the tungsten oxide layer 12, at least within several nanometers in distance from the surface thereof, has an atomic arrangement basically in accordance with tungsten trioxide. That is, in the basic structure of the tungsten oxide layer 12, six oxygen atoms bond with one tungsten atom in octahedral coordination such that octahedrons share oxygen atoms at corners thereof with adjacent octahedrons. Accordingly, the area x in FIG. 22 has either the structure of tungsten trioxide crystal or an amorphous structure in which the crystalline order is disturbed (yet in which bonds are not broken, thus preserving the above basic structure). The area x thus corresponds to a valence band with an occupied energy level deriving from the above basic structure. Note that the inventors have performed X-ray absorption fine structure (XAFS) measurement with respect to the tungsten oxide layer 12 of each of the samples A, B, and C, and have confirmed that the above-mentioned basic structure is formed therein.

Accordingly, the area y in FIG. 22 corresponds to the band gap between the valence band and the conductive band of the tungsten oxide layer 8. Further, it is commonly known that an occupied energy level that differs from the occupied energy level of the valence band may exist in the area y of the tungsten oxide, as is suggested by the UPS spectrum in FIG. 22. This occupied energy level in area y derives from another structure that is different from the above-mentioned basic structure, and is referred to as a band gap energy level (in-gap state or gap state).

Figure 23:
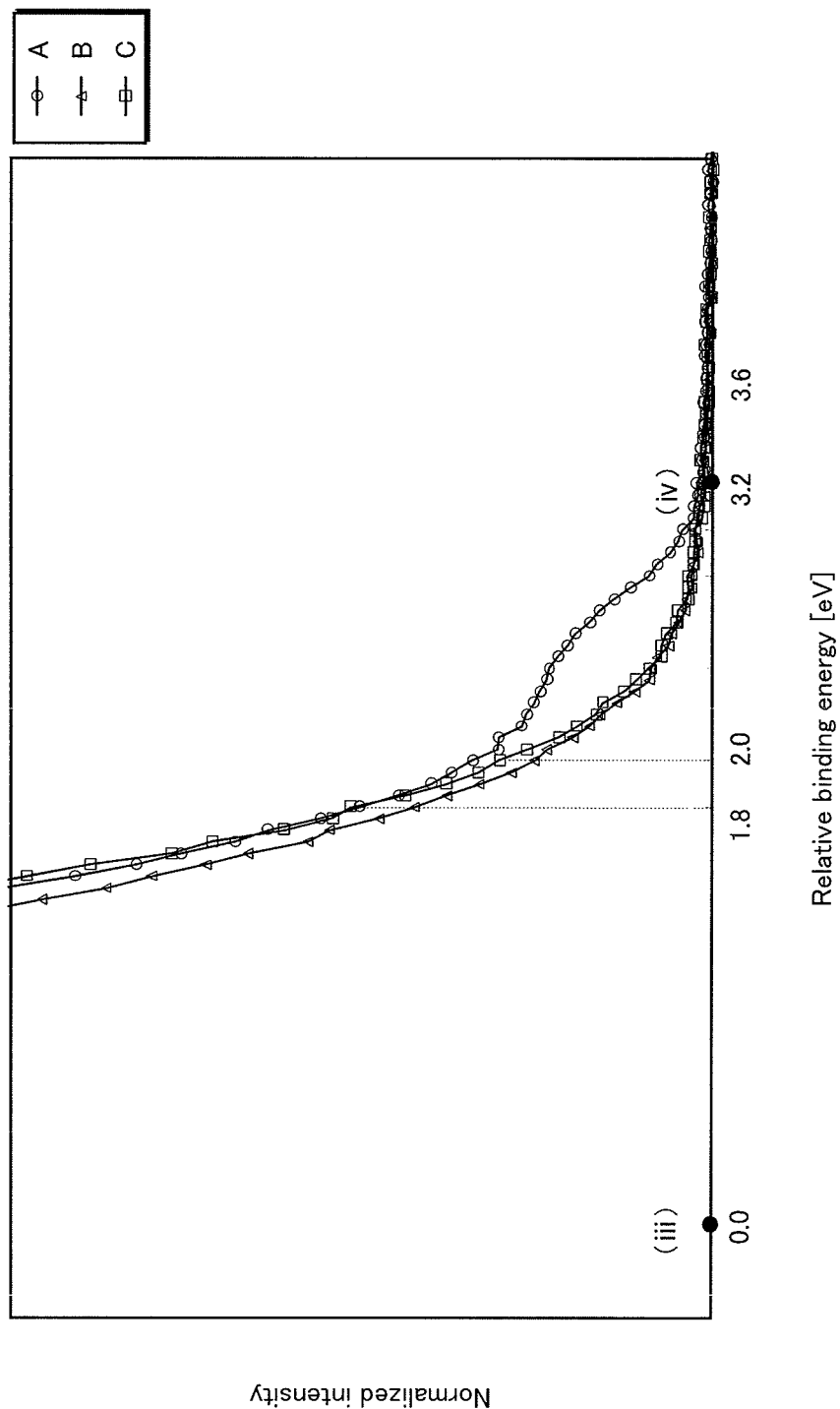
FIG. 23 is a diagram illustrating UPS spectra of a tungsten oxide layer.

The subsequent FIG. 23 illustrates a UPS spectrum of the tungsten oxide layer 12 of each of the samples A, B, and C, particularly within area y. The spectrum intensity indicated by the vertical axis in FIG. 23 has been normalized using the peak-top intensity value of a peak (ii) in FIG. 22, which is located approximately 3 eV to 4 eV to the high binding energy direction from point (iii). In addition, note that point (iii) in FIG. 23 is illustrated at the same point on the horizontal axis as in FIG. 22. The horizontal axis indicates a relative value (relative binding energy) with respect to point (iii), and the binding energy decreases from left to right.

As illustrated in FIG. 23, the spectrum indicating the tungsten oxide layer 12 of the sample A exhibits a peak in an area between a point which is 3.6 eV lower in terms of binding energy than point (iii) and a point which is 1.8 eV lower in terms of binding energy than point (iii). Point (iv) in the figure indicates the beginning of the peak. The existence of such a peak is not observed in the spectra corresponding to the samples B and C.

For forming the hole injection layer, the present invention thus uses tungsten oxide whose UPS spectrum indicates an upward protrusion (not necessarily in the form of a peak) in an area which is between 1.8 eV and 3.6 eV lower in terms of binding energy than point (iii), thereby endowing the organic EL display panel 110 with excellent hole injection efficiency.

Furthermore, it has been found that hole injection efficiency tends to increase when the upward protrusion has a higher degree of sharpness. Therefore, as illustrated in FIG. 23, it can be said that the area that is between 2.0 eV and 3.2 eV lower than point (iii) in terms of binding energy is particularly important, since the upward protrusion is relatively easier to confirm in this area and has a relatively sharper inclination.

Note that, in the following description, the upward protrusion as observed in the UPS spectrum is referred to as "spectral protrusion near the Fermi surface". Furthermore, the energy level corresponding to this spectral protrusion near the Fermi surface is the "occupied energy level near the Fermi surface", which has been already described in the above.

Subsequently, the inventors performed differentiation on the normalized intensity of the UPS spectrum of each of the samples A, B, and C indicated in FIG. 23. The differentiation was performed for the purpose of making the spectral protrusion near the Fermi surface more distinguishable.

In specific, by using the graph analysis software IGOR Pro 6.0, binomial smoothing (where smoothing factor was set to 1) was conducted eleven times with respect to the UPS spectra illustrated in FIG. 23, and differentiation was subsequently performed applying the central difference method. Such processing of data was conducted so as to remove fluctuation factors such as background noise generated during the UPS measurement, to smoothen the differential curves, and to convey the arguments presented in the following in a clear manner as possible.

Figure 24:
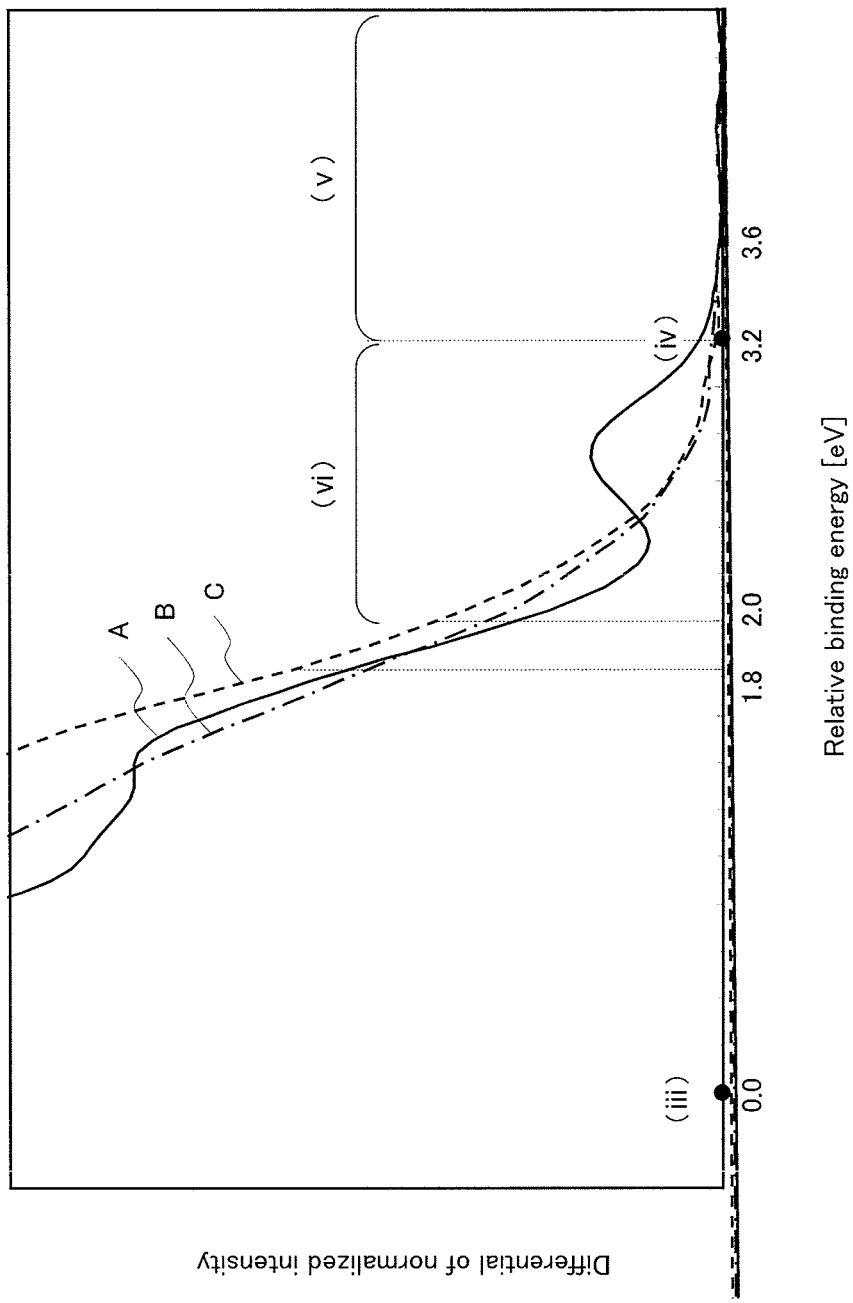
FIG. 24 illustrates differential curves corresponding to the respective UPS spectra illustrated in FIG. 23.

FIG. 24 illustrates differential curves yielded as a result of the above processing. Points (iii) and (iv) in FIG. 24 are provided at the same points on the horizontal axis as the respective points (iii) and (iv) in FIG. 23.

According to the differential curves illustrated in FIG. 24, the derivatives of normalized intensities of the tungsten oxide layers 12 corresponding to the samples B and C do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to the samples B and C exhibit only a slight increase as approaching the high binding energy direction, although increase is seen in the increase rates thereof. In addition, the shapes of the differential curves corresponding to the samples B and C within areas (v) and (vi) turn out to exhibit similarity with the respective UPS spectra illustrated in FIG. 23, from which the differential curves have been derived. Therefore, it can be said that the shapes of the UPS spectrum and the differential curve derived therefrom of each of the samples B and C within areas (v) and (vi) resemble the shape of an exponential function curve.

On the other hand, for the tungsten oxide layer 12 of the sample A, the differential curve exhibits a rapid rise from the vicinity of point (iv) towards the direction of higher binding energy. Thus, the shape of the differential curve within the areas (v) and (vi) clearly differs from the shape of an exponential function curve. Similarly, in FIG. 23, the spectrum for the sample A from which FIG. 24 is derived begins to protrude in the vicinity of point (iv). At the same time, it is clear that the spectrum exhibits a spectral protrusion near the Fermi surface differing from the shape of an exponential function curve.

In other words, such a sample A is characterized in that an occupied energy level near the Fermi surface is found in an area which is approximately 1.8 eV to 3.6 eV lower than the lowest binding energy of the valence band. In particular, a spectral protrusion near the Fermi surface corresponding to the occupied energy level near the Fermi surface can be clearly seen in the UPS spectrum in an area that is approximately between 2.0 eV and 3.2 eV lower than the lowest binding energy of the valence band.

Figure 25:
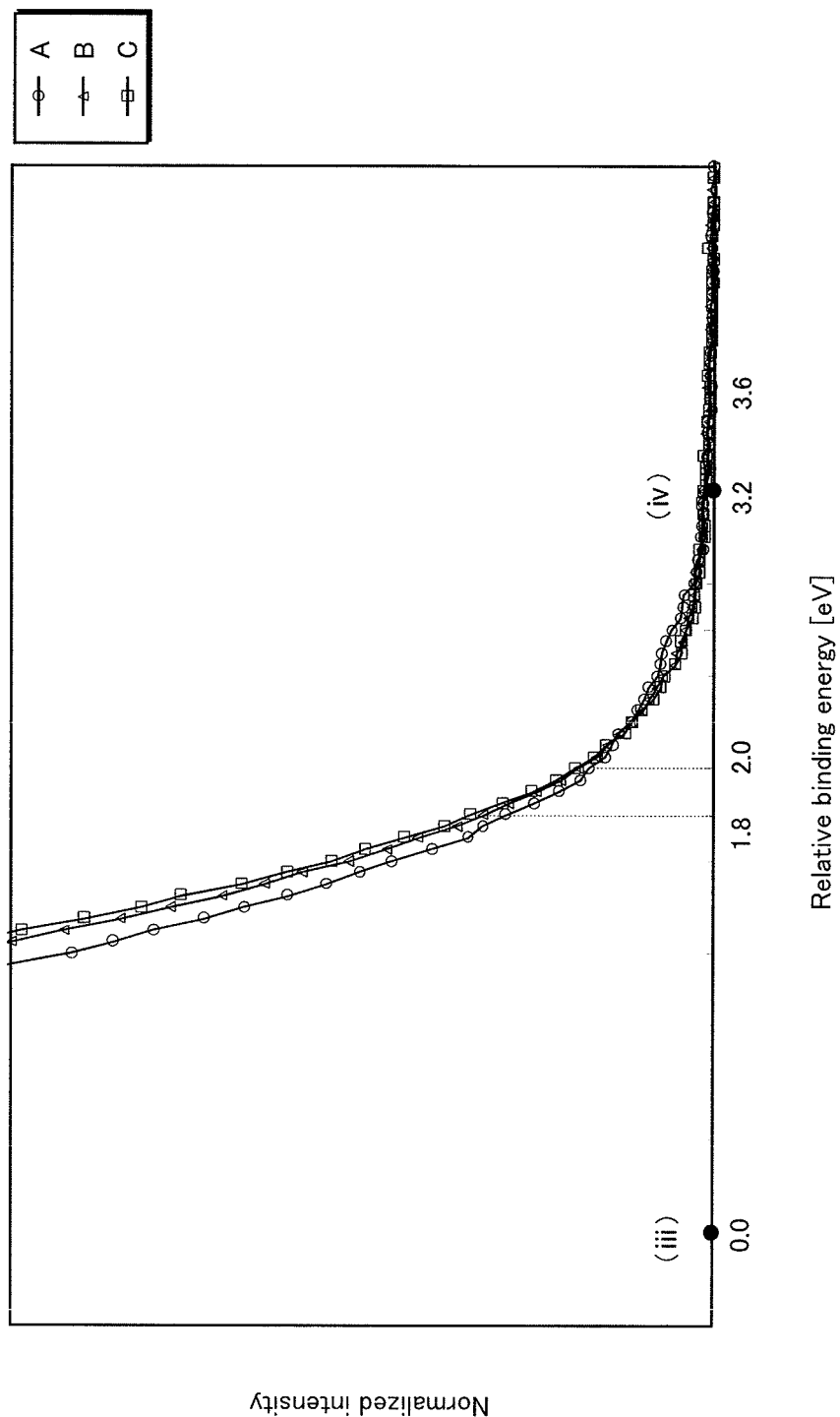
FIG. 25 illustrates UPS spectra of a tungsten oxide layer that has been subjected to atmospheric exposure.

Next, the inventors conducted atmospheric exposure, at room temperature for a period of one hour, of the tungsten oxide layer 12 of each of the samples A, B, and C on which the UPS spectra measurement illustrated in FIG. 23 had been performed. These sample devices had not previously been exposed to the atmosphere after film formation. The inventors then conducted UPS measurement again to confirm changes in the spectra. FIG. 25 is a diagram illustrating UPS spectra within the above area y. The horizontal axis in FIG. 25 is similar to the horizontal axis in FIG. 23, with points (iii) and (iv) located along the horizontal axis at the same position as in FIG. 23.

Based on the UPS spectra illustrated in FIG. 25, the tungsten oxide layer 12 of each of the samples B and C does not exhibit the spectral protrusion near the Fermi surface either before or after atmospheric exposure. On the other hand, the tungsten oxide layer 12 of the sample A still exhibits the spectral protrusion near the Fermi surface, although the spectrum after atmospheric exposure differs in intensity and shape. Hence, the sample A maintains the same characteristics as before atmospheric exposure even after conducting atmospheric exposure for a certain duration, thus clearly demonstrating that the sample A has a certain level of stability with respect to the surrounding atmosphere. The spectral protrusion near the Fermi surface of the tungsten oxide layer 12 of the sample A is more unclear than before the atmospheric exposure. This is considered to be because many impurity molecules adhere to the tungsten oxide layer 12 in the process of, for example, taking out the tungsten oxide layer 12 to the atmosphere. As has been described above, by the UV irradiation according to the present invention, adjerents on the surface of the tungsten oxide layer 12 of the sample A in such a state are removed and the spectral protrusion near the Fermi surface is thereafter maintained in good condition. The inventors acrually performed UV irradiation according to the present invention on the sample A after the atmospheric exposure, and found that the spectral protrusion near the Fermi surface would be clear as with before the atmospheric exposure, and the clarity would be maintained thereafter.

Thus far, the measured UPS spectra of the samples A, B, and C have been discussed. It should be noted, however, that the spectral protrusion near the Fermi surface can similarly be observed in the spectra obtained by XPS measurement or hard X-ray photoelectron spectroscopy measurement.

Figure 26:
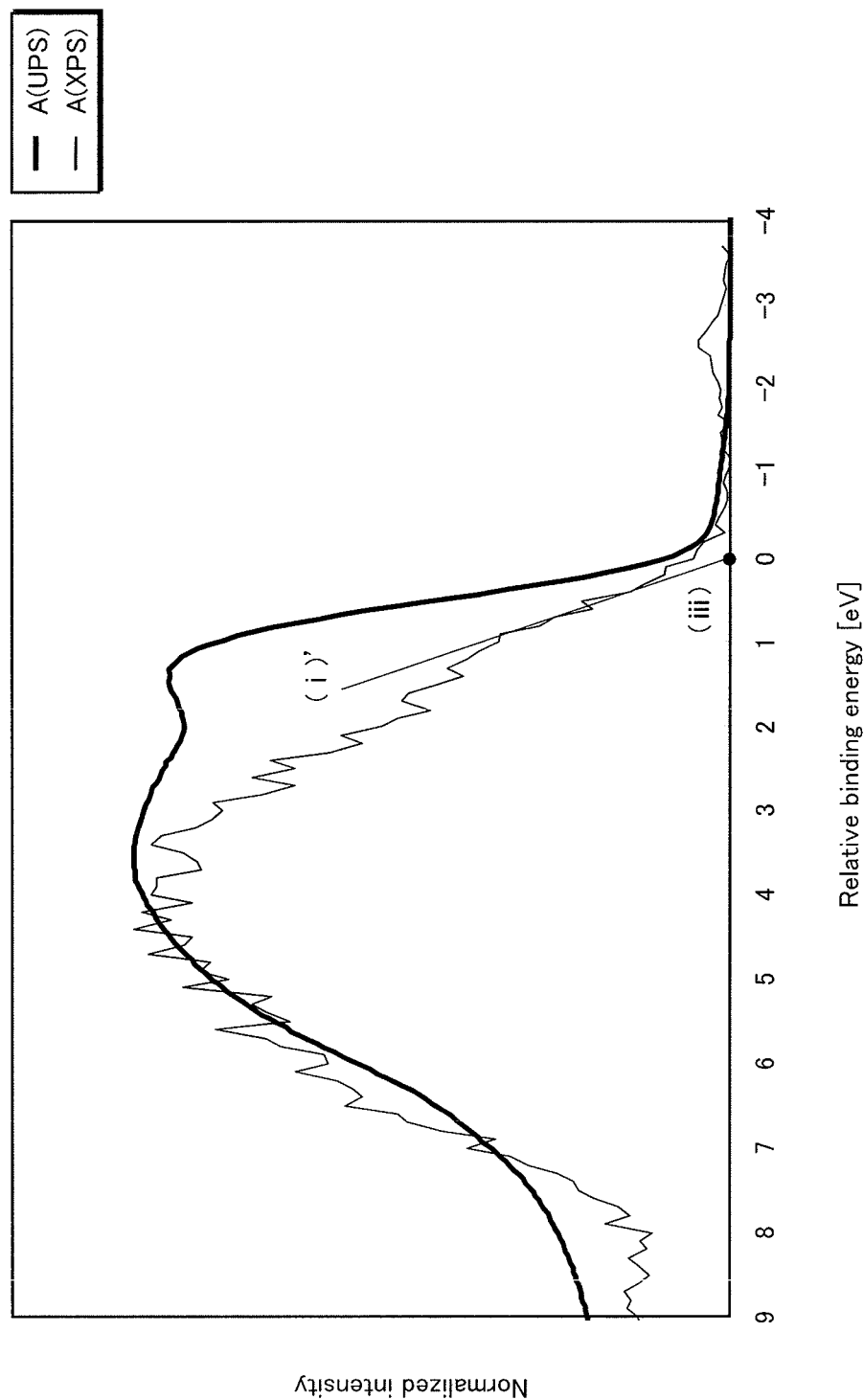
FIG. 26 is a diagram illustrating both a UPS spectrum and an XPS spectrum of a tungsten oxide layer according to an aspect of the present invention.

FIG. 26 is a diagram illustrating an XPS spectrum of the tungsten oxide layer 12 of the sample A after the above atmospheric exposure. For the sake of comparison, the UPS spectrum of the tungsten oxide layer 12 of the sample A (as illustrated in FIG. 22) is also shown overlaid on the XPS spectrum.

The conditions under which the XPS measurement was conducted are similar to the conditions for the above UPS measurement, differing only in that an Al—Kα line was used as the light source. The interval between measurement points, however, was 0.1 eV. In FIG. 26, point (iii) is provided at the same point on the horizontal axis as point (iii) in FIG. 22, and like FIG. 23, the horizontal axis indicates a relative binding energy with respect to point (iii). In addition, a line in the XPS spectrum corresponding to the line (i) in FIG. 22 is illustrated as line (i)' in FIG. 26.

As illustrated in FIG. 26, the spectral protrusion near the Fermi surface of the tungsten oxide layer 12 of the sample a is found in the XPS spectrum, as well as in the UPS spectrum, as a protrusion of a considerable degree within an area approximately between 1.8 eV and 3.6 eV lower than the lowest binding energy of the valence band. The spectral protrusion near the Fermi surface was similarly found in a separate experiment in the spectrum observed with hard X-ray photoelectron spectroscopy.

The sample 1A (FIG. 21) was used instead of the organic EL element 1 shown in FIG. 13 as the sample device for conducting the above photoelectron spectroscopy measurements. Unlike the structure of the organic EL element 1, the sample 1A is composed of the tungsten oxide layer 12 formed on the conductive silicon substrate 11. This step was taken merely to prevent the occurrence of charge-up during measurement; the structure of the organic EL display panel 110 according to an aspect of the present invention is not to be limited to such a structure.

According to another experiment conducted by the inventors, when UPS measurement and XPS measurements were conducted against a sample device having the structure of the organic EL element 1 illustrated in FIG. 13 (i.e. an anode composed of ITO and a hole injection layer composed of tungsten oxide formed in this order on one surface of the substrate 10), charge-up occurred during measurement of the tungsten oxide layer under film forming conditions B and C.

However, by using a neutralizing electron gun that cancels such charge-up, a similar spectrum as for the sample 1A was obtained at least in the range extending from the band gap to the lowest binding energy in the valence band, even though in some cases the absolute value of the binding energy indicated by each of the occupied energy levels of the hole injection layer (for example, the binding energy value when the Fermi level of the photoelectron spectroscopy device itself is set as a reference point) differed from the corresponding value of the tungsten oxide layer 12 of the sample 1A.

(Analysis of Hole Injection Efficiency from Hole Injection Layer to Functional Layer)

In the case of an occupied energy level near the Fermi surface in a hole injection layer composed of tungsten oxide, the principle behind the effect that the occupied energy level has on the efficiency of hole injection from the hole injection layer to the functional layer can be explained as follows. Note that in this case, the existence of the occupied energy level can be confirmed as a protrusion near the Fermi surface in, for instance, a UPS spectrum.

It has been frequently reported, with reference to results of experiments and first principles calculations, that existence of the occupied energy level near the Fermi surface, which can be seen in a thin film or a crystal of tungsten oxide, derives from a structure similar to an oxygen vacancy.

Specifically, it can be assumed that the existence of the occupied energy level near the Fermi surface derives from a binding orbital formed by 5d orbitals of adjacent tungsten atoms due to a deficiency of oxygen atoms, or from a 5d orbital of a singular tungsten atom which is not terminated with an oxygen atom and which exists at the surface of a film or within a film. Further, it is assumed that such 5d orbitals, when either in semi-occupied state or unoccupied state, are capable of pulling an electron off of the HOMO of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (Non-Patent Literature 5). Note that molybdenum oxide has many common physical properties similar to those of tungsten oxide, such as a catalyst effect, electrochromism, and photochromism.

In further detail, the inventors arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

Figure 27:
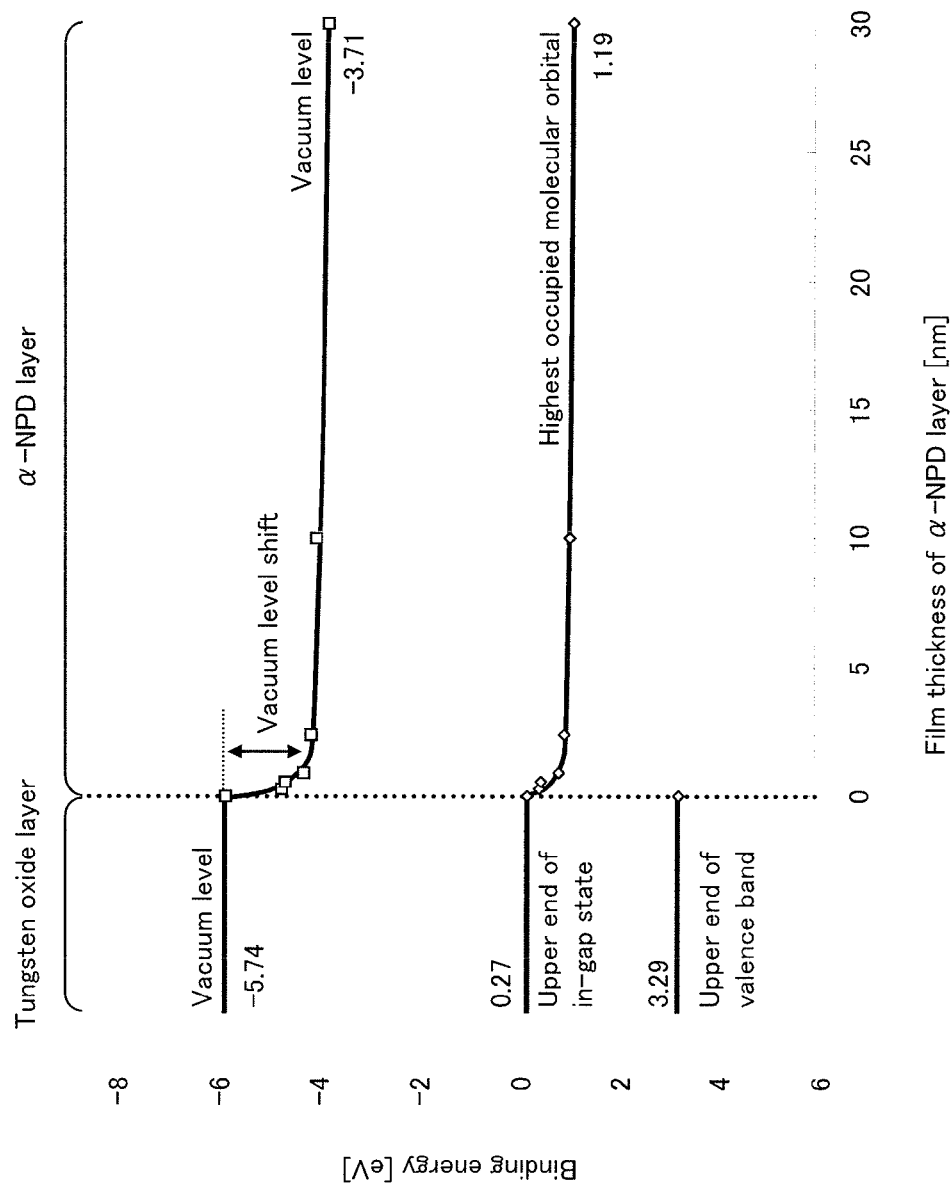
FIG. 27 is a diagram illustrating an energetic state at an interface between the tungsten oxide layer according to an aspect of the present invention and an α-NPD layer.

FIG. 27 is a diagram illustrating an energetic state at an interface between the tungsten oxide layer having the occupied energy level near the Fermi surface and an α-NPD layer.

Within the tungsten oxide layer (corresponding to the hole injection layer), FIG. 27 illustrates the lowest binding energy of the valence band (the "upper end of the valence band" in the figure) and the lowest binding energy of the occupied energy level near the Fermi surface, corresponding to the point at which the occupied energy level near the Fermi surface rises (the "upper end of the in-gap state" in the figure). In the UPS spectrum, the upper end of the valence band corresponds to point (iii) in FIG. 22, and the upper end of the in-gap state corresponds to point (iv) in FIG. 23.

In addition, the figure illustrates the relationship between (i) the thickness of the α-NPD layer, in a case where the α-NPD layer (corresponding to the functional layer) is formed on the tungsten oxide layer, and (ii) the binding energy of the highest occupied molecular orbital of the α-NPD as well as the vacuum level. Here, the binding energy of the highest occupied molecular orbital of the α-NPD layer corresponds to the binding energy at a point at which a peak in the highest occupied molecular orbital begins in the UPS spectrum, i.e. the lowest binding energy of the highest occupied molecular orbital in the α-NPD.

More specifically, the energy diagram illustrated in FIG. 27 is obtained through repeated alternate execution of the UPS measurement and the ultra-high vacuum vapor deposition, where the tungsten oxide layer formed on the ITO substrate is transferred back and forth between a photoelectron spectroscopy device and an ultra-high vacuum vapor deposition device connected to the photoelectron spectroscopy device. Since the occurrence of charge-up was not encountered during the UPS measurement, the binding energy on the vertical axis in FIG. 27 is indicated as an absolute value taken with respect to a reference point, which is the Fermi level of the ITO substrate.

FIG. 27 demonstrates that, at least within a range of between 0 and 0.3 nm from the surface of the α-NPD layer, i.e. in a vicinity of the interface between the tungsten oxide layer and the α-NPD layer, the upper end of the in-gap state of the tungsten oxide layer and the highest occupied molecular orbital of the α-NPD layer are approximately equal in terms of binding energy. In other words, the energy levels are in a state of alignment (the state described above as the "interface energy level alignment"). Here, it should be noted that the state of "approximately equal" as referred to above actually includes a state where a slight difference exists between the binding energies of the two layers, and specifically denotes a range of ±0.3 eV inclusive.

Further, it can be seen from FIG. 27 that the interface energy level alignment is formed as a result of interaction between the tungsten oxide and the α-NPD, and not by mere coincidence. Refer to the following for reasons as to why such an indication can be made.

For instance, the change in vacuum level (vacuum level shift) observed at the interface between the tungsten oxide layer and the α-NPD layer indicates that an electrical double layer (EDL) is formed at the interface. Further, considering the direction in which the vacuum level shift is oriented, it can be seen that the EDL is formed to be negative in the direction of the tungsten oxide layer, and positive in the direction of the α-NPD layer. In addition, since the magnitude of the vacuum level shift is considerably large near 2 eV, it can be reasonably assumed that the EDL has been formed not due to physical adsorption or the like, but rather as a result of an effect similar to a chemical bond. Thus, it can be reasonably assumed that the interface energy level alignment has been formed as a result of interaction between the tungsten oxide and the α-NPD.

Furthermore, the inventors assume that the interaction is specifically caused by a mechanism as described below.

First of all, as described above, the occupied energy level near the Fermi surface derives from the 5d orbital of a tungsten atom that has a structure similar to an oxygen vacancy. In the following, the 5d orbital of the tungsten atom is referred to as a "W5d orbital corresponding to the spectral protrusion".

When the highest occupied molecular orbital of an α-NPD molecule approaches the W5d orbital corresponding to the spectral protrusion at the surface of the tungsten oxide layer, an electron transfers from the highest occupied molecular orbital of the α-NPD molecule to the W5d orbital corresponding to the spectral protrusion. Such transfer of an electron takes place since both the tungsten oxide layer and the α-NPD molecule seek for stabilization of energetic state. Hence, an EDL is formed at the interface, thus causing the vacuum level shift and the interface energy level alignment observed in FIG. 27.

More specifically, many reports have been made, as a result of first principles calculations, that the highest occupied molecular orbital of an organic amine-containing molecule, such as α-NPD, is characterized in that the electron density thereof typically exhibits a distribution biased towards a nitrogen atom of the amine structure, and that the structure thereof includes, as the main component, a lone pair of electrons of the nitrogen atom. It can therefore be assumed that, particularly at the interface between the tungsten oxide layer and the layer of an organic amine-containing molecule, an electron transfers from the lone pair of electrons of the nitrogen atom in the amine structure of the amine-containing molecule, to the W5d orbital corresponding to the spectral protrusion.

This assumption is supported by reports made of interface energy level alignments, similar to the interface energy level alignment between the tungsten oxide layer and the α-NPD layer illustrated in FIG. 27, at interfaces formed between both α-NPD and F8BT and a vapor deposition film of molybdenum oxide, which has a physical property similar to tungsten oxide, as described above (see Non-Patent Literature 2, 6, and 7).

In the organic EL display panel pertaining to an aspect of the present invention, the excellent efficiency of the hole injection layer for hole injection into the functional layer can be explained according to the interface energy level alignment as described above. That is, an interface energy level alignment occurs between the hole injection layer composed of tungsten oxide that has the occupied energy level near the Fermi surface and the adjacent functional layer. As a result, the binding energy at the point at which the occupied energy level near the Fermi surface begins to rise and the binding energy of the HOMO of the functional layer become substantially equal. The injection of holes takes place between such energy levels having the interface energy level alignment formed therebetween. Therefore, the hole injection barrier between the hole injection layer and the functional layer of the present invention is nearly nonexistent.

The cause behind formation of the occupied energy level near the Fermi surface is a structure similar to an oxygen vacancy, and it is highly unlikely for tungsten oxide that is completely free of such a structure to actually exist. For example, it can be reasonably assumed that, even in such tungsten oxide as used to prepare the above-described samples B and C, which does not exhibit the spectral protrusion near the Fermi surface in the photoelectron spectroscopy spectrum, structures similar to an oxygen vacancy exist, however minimal they may be in number.

Figure 28A:
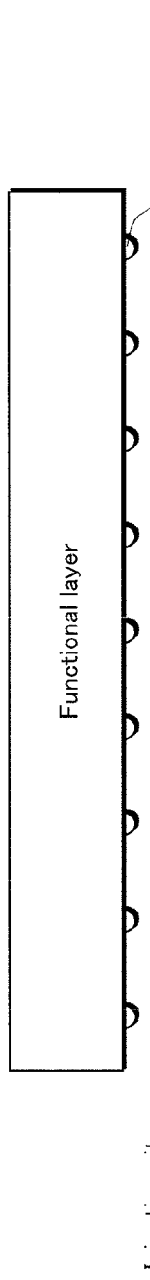
FIGS. 28A and 28B are diagrams for explanation of effects yielded by injection sites of a hole injection layer and a functional layer.
Figure 28B:
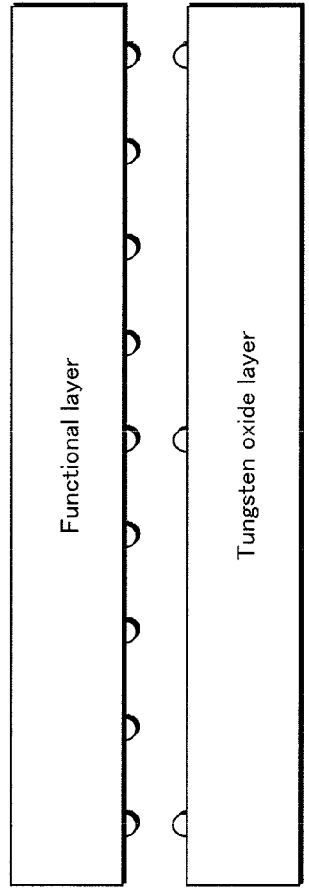

With respect to this point, explanation is now provided, with reference to FIGS. 28A and 28B, of the reason for which the hole-only device HOD-A and the organic EL element BPD-A, both having the hole injection layer which corresponds to the tungsten oxide layer 12 of the sample A, exhibit the superb low driving voltage observed in the above experiments.

To bring about the interaction between the HOMO of the organic molecule composing the functional layer and the occupied energy level near the Fermi surface of the tungsten oxide layer when disposing the tungsten oxide layer on the functional layer, the following condition needs to be fulfilled. Namely, at the interface between the layers, a portion of the organic molecule where the electron density of the HOMO of the organic molecule is high and a structure similar to an oxygen vacancy on the surface of the tungsten oxide layer (illustrated as "injection site x" in the figures) must approach (i.e. contact) each other to within a distance at which the interaction is triggered. The portion of the organic molecule (illustrated as "injection site y" in the figures) is, for instance, a nitrogen atom in the amine structure of an organic amine-containing molecule.

However, in a tungsten oxide layer as incorporated in the samples B and C, the number density of the injection site x, if any, is extremely small, as illustrated in FIG. 28B. Accordingly, the spectral protrusion near the Fermi surface does not appear in the UPS spectra thereof. Thus, the possibility of the injection site y and the injection site x coming into contact is extremely low. Since the injection of holes takes place where the injection site x and the injection site y come into contact, it is clear that hole injection efficiency in samples B and C is extremely low.

In contrast to this, as illustrated in FIG. 28A, an abundance of injection sites y exists in the tungsten oxide layer which exhibits the spectral protrusion near the Fermi surface, as for example in the above-described sample A. Thus, there is a high possibility of the injection sites y and the injection sites x coming into contact, thereby providing a high hole injection efficiency from the hole injection layer to the functional layer.

To further substantiate the analysis made thus far, the energy diagram at the interface with the α-NPD layer was also measured, as in FIG. 27, for the tungsten oxide layer formed under film forming conditions C, i.e. the tungsten oxide layer in which no protrusion near the Fermi surface could be confirmed.

Figure 29:
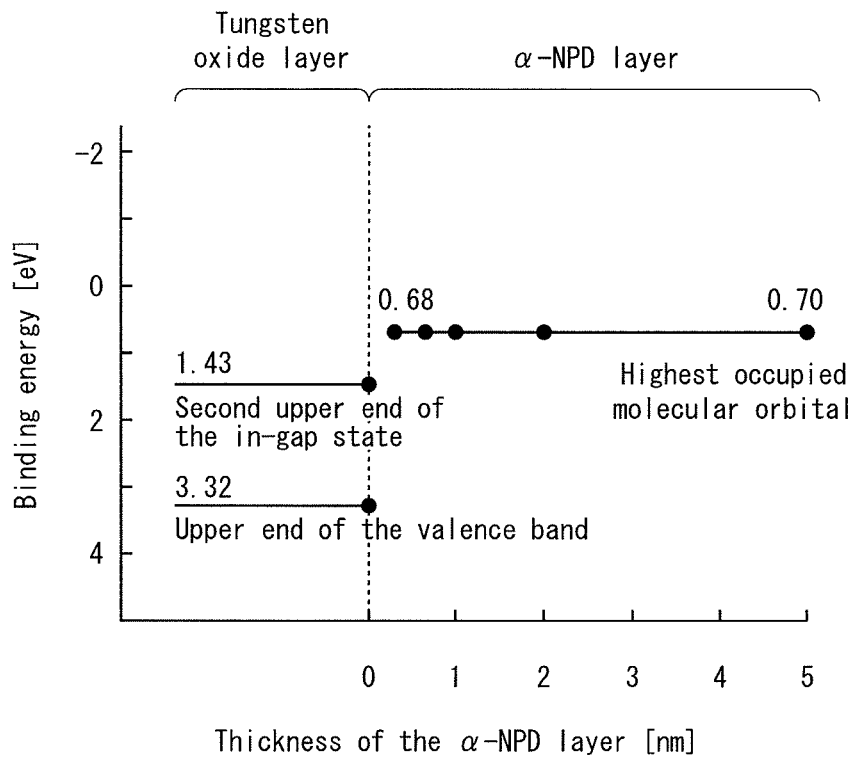
FIG. 29 is a diagram illustrating an energetic state at an interface between the tungsten oxide layer formed under film forming conditions C and the α-NPD layer.

FIG. 29 shows the results. As described above, the upper end of the in-gap state of the tungsten oxide layer, which corresponds to the spectral protrusion near the Fermi surface, could not be confirmed at all. As a candidate for another energy level used in hole injection, FIG. 29 shows the point at which a structure different from the spectral protrusion ((z) in FIG. 22) rises (the "second upper end of the in-gap state"), this point being observed at a higher binding energy than the location of the spectral protrusion near the Fermi surface in the UPS spectrum. FIG. 29 also shows the upper end of the valence band.

However, the highest occupied molecular orbital of the α-NPD in FIG. 29 completely differs from FIG. 27 and approaches neither the second upper end of the in-gap state nor the upper end of the valence band. In other words, interface energy level alignment does not occur at all. This means that the second in-gap state and the valence band both hardly interact with the highest occupied molecular orbital of the α-NPD. Even if holes are injected from the second upper end of the in-gap state to the highest occupied molecular orbital of the α-NPD, the injection barrier is 0.75 eV, an extremely large value compared to FIG. 27, in which the injection barrier is nearly zero.

It is considered that this difference in the injection barrier greatly affects the driving voltage and the light-emitting efficiency of the hole-only devices 1B and the organic EL elements 1 formed under the above film forming conditions. Specifically, the differences in characteristics between the hole-only devices 1B and the organic EL elements 1 formed under film forming conditions A, B, and C strongly suggest that the organic EL display panel 110 according to an aspect of the present invention has excellent hole injection efficiency from the hole injection layer to the functional layer.

To summarize the above analysis, the excellent hole injection efficiency of the organic EL display panel 110 according to an aspect of the present invention can be explained as follows.

First, a hole injection layer composed of tungsten oxide exhibits, in the photoelectron spectroscopy spectrum thereof, a spectral protrusion near the Fermi surface. This means that a considerable number of structures similar to an oxygen vacancy, as well as occupied energy levels near the Fermi surface deriving from the structures, exist along the surface of the hole injection layer.

The occupied energy level near the Fermi surface, the existence of which is indicated by the spectral protrusion near the Fermi surface, pulls an electron off from the organic molecule composing the functional layer adjacent to the hole injection layer. As a result, the occupied energy level near the Fermi surface establishes an interface energy level alignment with the HOMO of the organic molecule.

As such, if a considerable number of structures similar to an oxygen vacancy is found along the surface of the hole injection layer, the probability increases of contact between the occupied energy level near the Fermi surface and a portion of the HOMO with a high electron density in the organic molecule. Thus, the interface energy level alignment occurs efficiently, whereby the tungsten oxide layer exhibits excellent hole injection efficiency from the hole injection layer to the functional layer.

(Analysis of Hole injection Efficiency from Anode to Hole injection Layer)

The following describes the Schottky ohmic contact formed between the anode and the hole injection layer composed of tungsten oxide according to an aspect of the present invention. The stability of this contact (as dependent on the material and surface conditions of the anode) is also described.

1. Hole Injection Barrier Between Anode and Hole Injection Layer

FIGS. 30 through 33 are energy diagrams near the interface between the anode and the functional layer in a conventional organic EL element, in which the anode in the functional layer are directly laminated together. Here, α-NPD was used as the functional layer. The binding energy along the vertical axis in the figures indicates absolute values, with the Fermi level of the anode at the origin.

Figure 30:
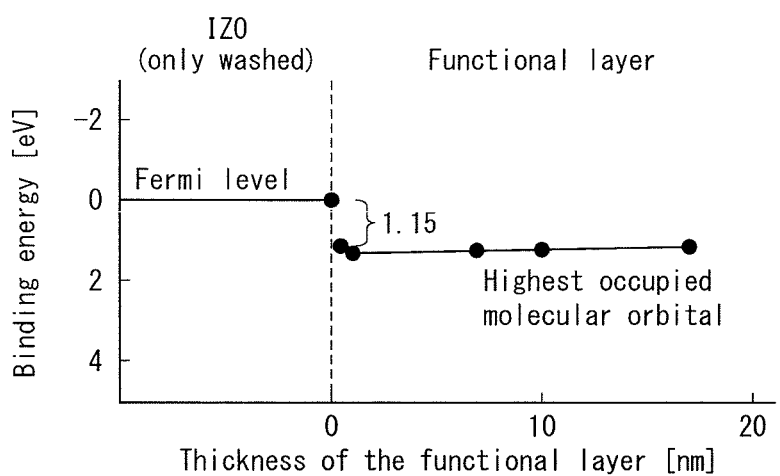
FIG. 30 is a diagram illustrating an energetic state at an interface between the functional layer and an IZO anode cleaned with pure water.
Figure 31:
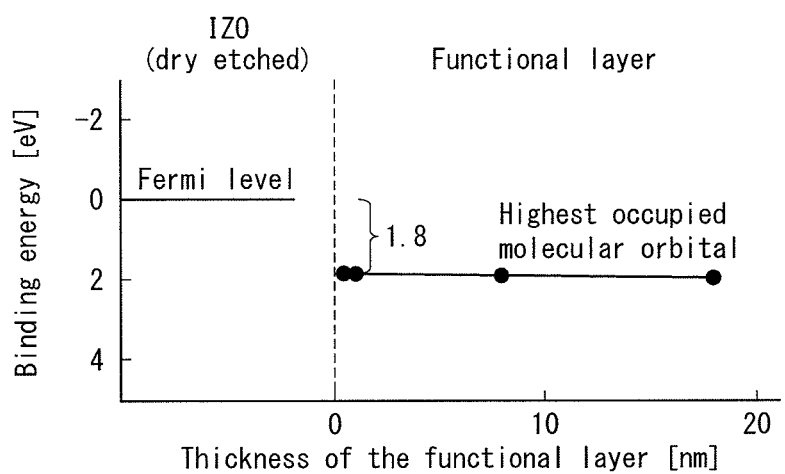
FIG. 31 is a diagram illustrating an energetic state at an interface between the functional layer and an IZO anode cleaned with pure water and subsequently dry etched.

When the anode is formed from IZO, as in FIGS. 30 and 31, the hole injection barrier between the Fermi level of the anode and the HOMO of the functional layer was quite large, exceeding 1 eV both when the surface of the anode was cleaned only with pure water, as in FIG. 30, and when dry etching was performed on the surface of the anode after cleaning with pure water, as in FIG. 31. The magnitude of the hole injection barrier has also been shown to vary greatly depending on differences in how the IZO surface is processed.

Figure 32:
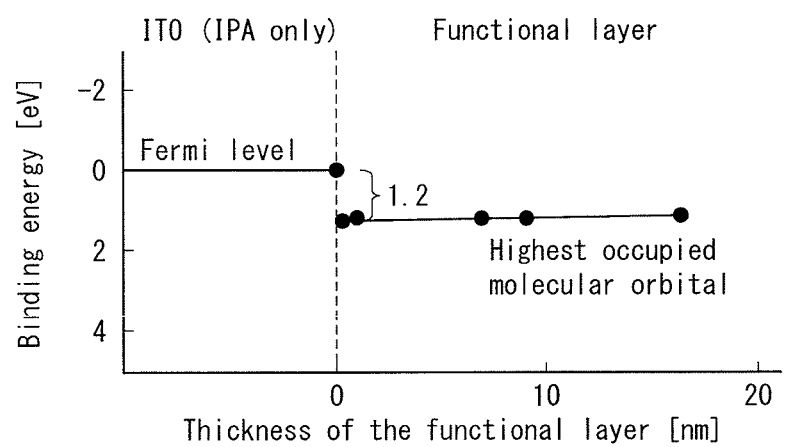
FIG. 32 is a diagram illustrating an energetic state at an interface between the functional layer and an ITO anode cleaned with IPA.
Figure 33:
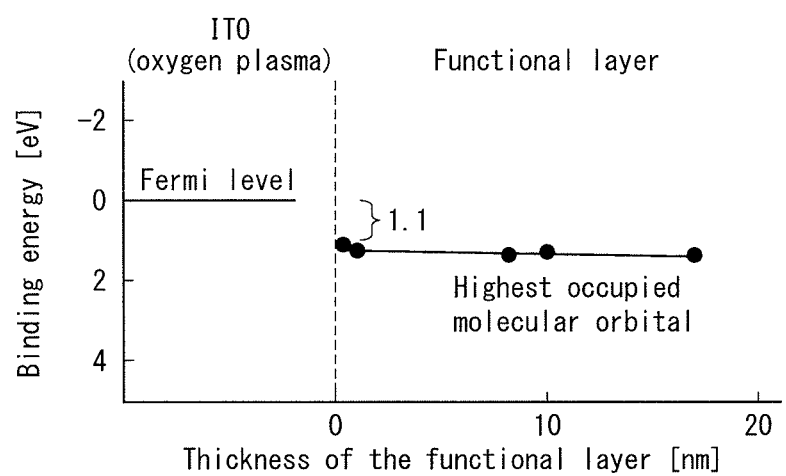
FIG. 33 is a diagram illustrating an energetic state at an interface between the functional layer and an ITO anode cleaned with IPA and subsequently subject to oxygen plasma treatment.

Also when the anode is formed from ITO, as in FIGS. 32 and 33, it is clear that a very high hole injection barrier exists both when the surface of the anode is only cleaned with IPA (isopropanol), as in FIG. 32, and when the surface of the anode is further treated with oxygen plasma after cleaning with IPA, as in FIG. 33.

As illustrated in FIGS. 30 through 33, in a conventional organic EL element, the hole injection barrier between the anode and the functional layer varies greatly depending on the type of anode material and on the surface conditions of the anode. Moreover, the barrier itself is large, thus clearly pointing to the potential for improvement with regards to driving voltage.

On the other hand, FIGS. 34 through 38 are energy diagrams near the interface between an anode and a hole injection layer when the anode is laminated with the hole injection layer composed of tungsten oxide of the present invention.

Figure 34:
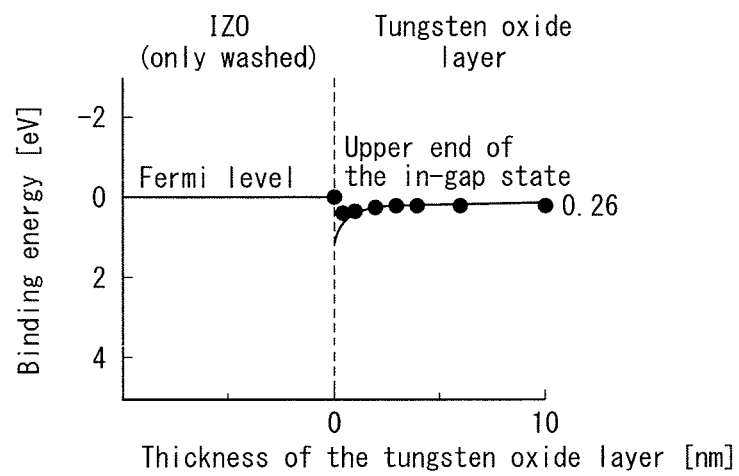
FIG. 34 is a diagram illustrating an energetic state at an interface between the hole injection layer of the present invention and an IZO anode cleaned with pure water.
Figure 35:
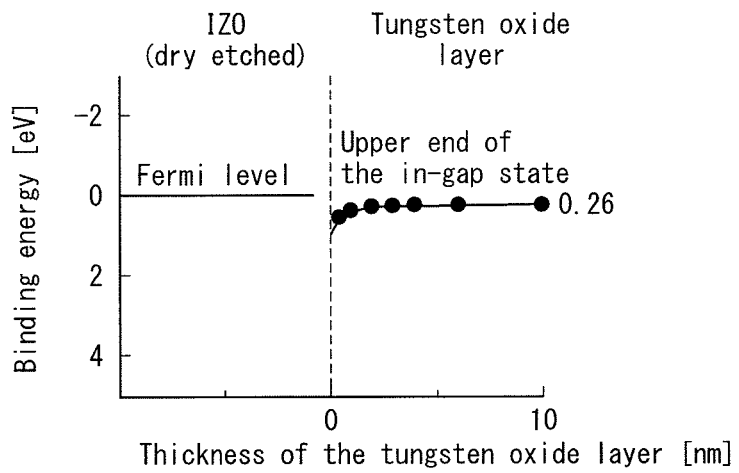
FIG. 35 is a diagram illustrating an energetic state at an interface between the hole injection layer of the present invention and an IZO anode cleaned with pure water and subsequently dry etched.

FIGS. 34 and 35 show the case of forming the anode from IZO. Like FIGS. 30 and 31, the surface of the anode was only cleaned with pure water in FIG. 34, whereas dry etching was performed on the surface of the anode after cleaning with pure water in FIG. 35. The hole injection layer of the present invention was then laminated on the anodes manufactured in this way.

Figure 36:
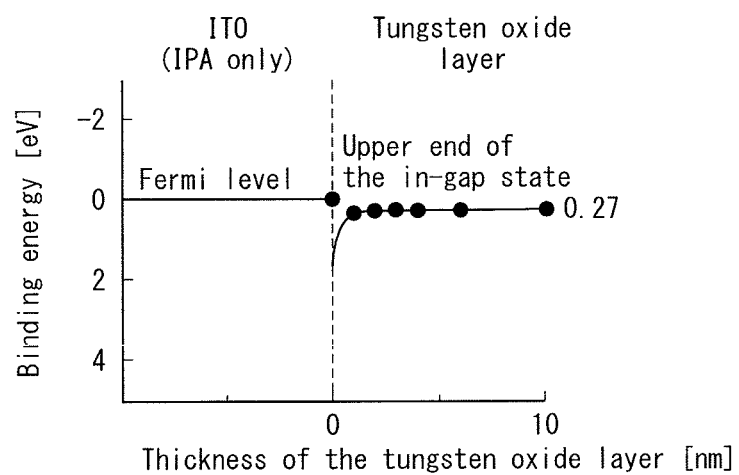
FIG. 36 is a diagram illustrating an energetic state at an interface between the hole injection layer of the present invention and an ITO anode cleaned with IPA.
Figure 37:
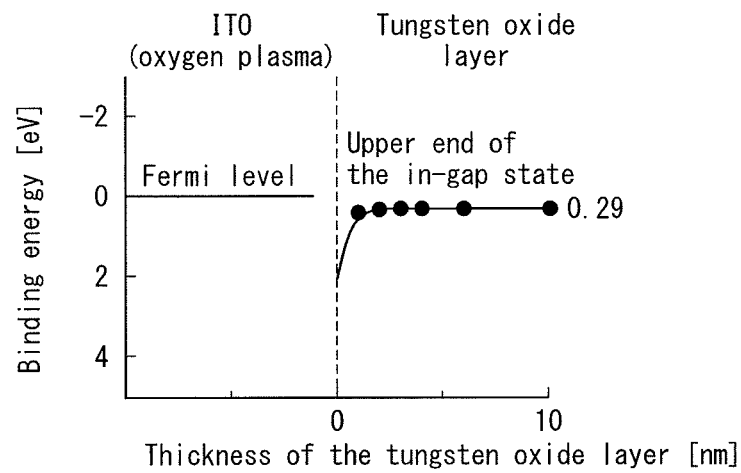
FIG. 37 is a diagram illustrating an energetic state at an interface between the hole injection layer of the present invention and an ITO anode cleaned with IPA and subsequently subject to oxygen plasma treatment.

FIGS. 36 and 37 show the case of forming the anode from ITO. Like FIGS. 32 and 33, the surface of the anode was only cleaned with IPA in FIG. 36, whereas the anode was treated with oxygen plasma after cleaning with IPA in FIG. 37. The hole injection layer of the present invention was then laminated on the anodes manufactured in this way.

Figure 38:
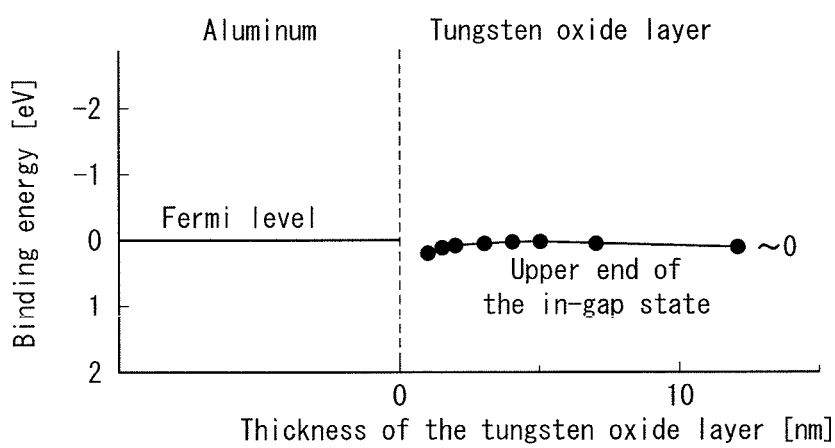
FIG. 38 is a diagram illustrating an energetic state at an interface between the hole injection layer according to an aspect of the present invention and an aluminum anode.

Furthermore, FIG. 38 shows the case of forming the anode from Al. After forming the anode, the hole injection layer of the present invention was layered thereon without the anode being exposed to the atmosphere, so as to prevent the surface from undergoing natural oxidation.

The following conclusions can be drawn from the results shown in FIGS. 34 through 38.

First, in every one of FIGS. 34 through 38, when the thickness of the hole injection layer is less than 2 nm, the binding energy at the upper end of the in-gap state, which is the position at which the occupied energy level near the Fermi surface begins to rise, has a relatively sharp inclination. At a thickness of 2 nm or greater, however, the binding energy is nearly constant. The value of the binding energy upon becoming nearly constant is extremely close to the Fermi level of the anode, the difference being within a range of ±0.3 eV. In other words, in all of FIGS. 34 through 38, the width of the Schottky barrier between the anode and the hole injection layer of the present invention is approximately 2 nm, meaning that excellent Schottky ohmic contact is achieved.

Furthermore, for the IZO anodes in FIGS. 34 and 35, as well as the ITO anodes in FIGS. 36 and 37, the difference in binding energy between the Fermi level of the anode and the upper end of the in-gap state when the thickness of the hole injection layer is 2 nm or greater does not depend on the surface conditions of the anode, but rather is nearly the same value (at most a difference of 0.02 eV).

The following conclusions can therefore be drawn. First of all, for all of the anode materials IZO, ITO, and Al, if the thickness of the hole injection layer according to an aspect of the present invention is 2 nm or greater, the anode and the hole injection layer are in Schottky ohmic contact. Furthermore, if the surface conditions of the anode have at least undergone one of the above treatments, then this contact is not only preserved well, but the degree of contact (the above difference in binding energy) does not depend on differences in surface conditions of the anode, thereby maintaining an extremely stable, constant state.

Based on these results, using the hole injection layer composed of tungsten oxide of the present invention promises excellent hole injection efficiency from the anodes to the hole injection layer without the need for a variety of procedures to maintain the work function and the surface conditions of the anode stable. In other words, no special care need be taken to carefully select the anode material, or to maintain the surface conditions of the anode strictly constant immediately before formation of the hole injection layer.

To summarize the above considerations, the hole injection layer composed of tungsten oxide according to an aspect of the present invention includes an occupied energy level near the Fermi surface, and the energy level acts to achieve Schottky ohmic contact with the anode with almost no influence from the work function or surface conditions of the anode. Specifically, at a location that is 2 nm from the surface of the anode towards the hole injection layer, the difference in binding energy between the Fermi level of the anode and the occupied energy level falls within a range of ±0.3 eV. As a result, the hole injection barrier between the anode and the hole injection layer is greatly reduced.

Due to the action of the occupied energy level, as described above, the hole injection barrier between the hole injection layer of the present invention and the functional layer is extremely small. Accordingly, holes can be injected from the anode to the hole injection layer as well as from the hole injection layer to the functional layer with nearly no barrier.

Reducing the hole injection barrier in this way between not only the hole injection layer in the functional layer, but also between the anode and the hole injection layer, allows for an even better low driving voltage for the EL element. Furthermore, improving the hole injection efficiency reduces the burden on the EL element during driving thereof, thereby promising an increase in the operating lifetime of the EL element.

2. Confirmation of Stability of the Schottky Ohmic Contact

As described above, when the thickness of the hole injection layer composed of tungsten oxide of the present invention is 2 nm or greater, a stable Schottky ohmic contact forms between the hole injection layer and the anode. This has also been confirmed based on characteristics of the EL element.

First, using the above-described hole-only devices 1B, the degree of the dependency on the film thickness, of the hole injection efficiency from the anode to the hole injection layer, was assessed for the hole injection layer according to an aspect of the present invention.

The hole injection layer in the hole-only device 1B was formed under the above film forming conditions A, with a thickness in a range between 5 nm and 30 nm. For comparison, an element in which the hole injection layer was omitted, i.e. an element in which the anode and the buffer layer were directly laminated together, was also manufactured (hereinafter referred to as a "film thickness of 0 nm"). The structures of other layers are the same as described in "(Regarding Improvements on EL Element Characteristics by UV Irradiation)".

Except for the element with a film thickness of 0 nm, the hole injection layer was formed under film forming conditions A in all of the hole-only devices 1B. Therefore, the hole injection efficiency from the hole injection layer to the buffer layer is assumed to be equivalent in all of the elements. Furthermore, the structures were identical except for the thickness of the hole injection layer. Accordingly, the main factors influencing the characteristics of the hole-only devices 1B are expected to be the thickness of the hole injection layer and the extent of formation of the Schottky ohmic contact between the anode and the hole injection layer.

First, the influence of the electric resistance of the hole injection layer might be considered. The resistance of the hole injection layer increases in proportion to the thickness of the hole injection layer. The resistivity of the hole injection layer under film forming conditions A, however, is $\frac{1}{100}$ or less of that of the buffer layer and the light-emitting layer 6B, as was confirmed by another experiment. Therefore, differences in resistance due to differences in the thickness of the hole injection layer make nearly no contribution to the characteristics of the hole-only devices 1B.

Accordingly, except for the element with the film thickness of 0 nm, the hole-only devices 1B should all have substantially the same characteristics as long as a stable Schottky ohmic contact is formed between the anode and the hole injection layer.

Hole-only devices 1B manufactured to have a hole injection layer with respective thicknesses of 0 nm, 5 nm, and 30 nm were connected to a direct current power supply, and voltage was applied thereto. Furthermore, by changing the applied voltage, an electric current value per unit surface area (electric current density) was calculated for different voltages. Hereinafter, the expression "driving voltage" refers to the voltage applied when the current density value is 10 mA/cm².

Table 9 shows the driving voltage for each of the hole-only devices 1B.

TABLE 9

| Thickness of Hole Injection Layer [nm] | Driving Voltage [V] |
| --- | --- |
| 0 | 30.0 |
| 5 | 20.1 |
| 30 | 20.2 |

The driving voltage for the element with a film thickness of 0 nm is quite high. This is considered to be because a large hole injection barrier forms between the anode and the buffer layer, due to the absence of the hole injection layer according to an aspect of the present invention. On the other hand, in the elements 1B with respective film thicknesses of 5 nm and 30 nm, the driving voltage is kept low. Furthermore, the driving voltage is nearly equal for both elements, thus clearly not depending on film thickness. Based on this table, it can be concluded that when the thickness of the hole injection layer is at least 5 nm, a nearly constant Schottky ohmic contact is formed between the anode and the hole injection layer of the present invention, which achieves excellent hole injection efficiency from the anode to the hole injection layer.

Next, the degree of the dependency on the film thickness, of the hole injection efficiency from the anode to the hole injection layer, was assessed for the hole injection layer of the present invention in the organic EL elements 1 as well. The thickness of the hole injection layer was in a range between 2 nm and 30 nm.

Since the structure of the organic EL elements 1 was the same except for the thickness of the hole injection layer, the elements should all have approximately the same characteristics as long as a stable Schottky ohmic contact is formed between the anode and the hole injection layer.

Organic EL elements 1 manufactured to have a hole injection layer with respective thicknesses of 2 nm, 5 nm, 15 nm, 20 nm, and 30 nm were connected to a direct current power supply, and voltage was applied thereto. Furthermore, by changing the applied voltage, an electric current value per unit surface area (electric current density) of the elements 1 was calculated for different voltages. Hereinafter, the expression "driving voltage" refers to the voltage applied when the current density value is 10 mA/cm².

Table 10 shows the driving voltage for each of the organic EL elements 1.

TABLE 10

| Thickness of Hole Injection Layer [nm] | Driving Voltage [V] |
| --- | --- |
| 2 | 8.6 |
| 5 | 8.4 |
| 15 | 8.7 |
| 20 | 8.7 |
| 30 | 8.4 |

Each of the driving voltages is a good, low value. Taking into consideration variations in the thickness of each layer that naturally occur during manufacturing of the elements, these driving voltages can be concluded not to depend on the thickness of the layers and to be sufficiently equivalent. Therefore, as with the hole-only devices 1B, it can be assumed that a nearly constant Schottky ohmic contact forms between the anode and the hole injection layer of the present invention in the organic EL elements 1 as well when the thickness of the hole injection layer is 2 nm or greater.

Next, the relationship between the thickness of the hole injection layer of the present invention and the operating lifetime of the EL element was assessed using organic EL elements 1.

The organic EL elements 1 were manufactured with the same structure as in Table 10, with the thickness of the hole injection layer being in a range between 2 nm and 30 nm. For comparison, an element 1 with a film thickness of 0 nm, i.e. an element without a hole injection layer, was also manufactured.

Since the structure of the EL elements 1 was the same except for the thickness of the hole injection layer, the elements are expected to have substantially the same lifetime as long as a stable Schottky ohmic contact is formed between the anode and the hole injection layer.

EL elements 1 respectively manufactured to have hole injection layers with a thickness of 0 nm, 2 nm, 5 nm, and 30 nm were connected to a direct current power supply and were driven at a constant current with a current density of 10 mA/cm$^2$. Changes in the luminance of the emitted light in accordance with driving time were measured.

For each element 1, Table 11 shows the time from the start of driving for the luminance to decrease to 60%.

TABLE 11

|  | Thickness of Hole Injection Layer [nm] | | | |
| --- | --- | --- | --- | --- |
|  | 0 | 2 | 5 | 30 |
| Time for Decrease in Luminance [hours] | 100 | 150 | 150 | 170 |

From this table, it is clear that the luminance of the element 1 with a film thickness of 0 nm decreases quickly, i.e. that the lifetime is short. This is considered to be because a large hole injection barrier forms between the anode and the buffer layer, due to the absence of the hole injection layer according to an aspect of the present invention. It thus becomes necessary to apply a high driving voltage in order to maintain constant current, increasing the burden on the element 1 and thereby greatly affecting the lifetime.

On the other hand, in the elements with respective film thicknesses of 2 nm, 5 nm, and 30 nm, the decrease in luminance is lower than the element 1 with a film thickness of 0 nm, i.e. the lifetime is longer. This is considered to be because the hole injection layer of the present invention effectively reduces the hole injection barrier, thereby reducing the necessary driving voltage and lessening the burden on the elements 1.

The results were good for the elements 1 with respective film thicknesses of 2 nm, 5 nm, 30 nm, which all had an approximately equivalent decrease in luminance. Accordingly, it can be inferred that if the thickness of the hole injection layer is 2 nm or greater, a nearly constant Schottky ohmic contact forms between the anode and the hole injection layer of the present invention, and therefore that any element 1 with a hole injection layer that is at least 2 nm thick will have an equivalent driving voltage and an equivalent lifetime.

The above experiments confirm, based on characteristics of the EL element, that when the thickness of the hole injection layer composed of tungsten oxide according of the present invention is 2 nm or greater, a stable Schottky ohmic contact forms between the hole injection layer and the anode.

Also, regarding the elements 1 used in Table 5 and FIGS. 17 through 20, the inventors confirmed formation of Schottky ohmic contact of the present invention between the anode and the hole injection layer, regardless of the film forming conditions for the hole injection layer. The formation of the Schottky ohmic contact results from surface treatment performed on the ITO anode. Details are provided below.

Like the method used in FIG. 27, repeating the cycle of forming the hole injection layer, under the above film forming conditions, on an ITO anode treated as above and performing UPS measurement confirmed the existence of a spectral protrusion near the Fermi surface for hole injection layers having a thickness within approximately 2 nm, regardless of the film forming condition, and confirmed the formation of Schottky ohmic contact with the anode. As the film thickness increased, however, the presence of a spectral protrusion near the Fermi surface depended on the film forming conditions, as in FIG. 23.

This is considered to be due to that, before formation of the hole injection layer, argon ion sputtering was performed on the surface of the ITO anode to clean the ITO anode and oxygen vacancies formed on the surface of the ITO anode.

In other words, oxygen vacancies form on the surface of the ITO anode, making it easier for oxygen atoms in the tungsten oxide to be pulled towards the ITO immediately after the start of formation of the hole injection layer. This results in the formation of numerous structures similar to an oxygen vacancy in the hole injection layer only near the interface. The Schottky ohmic contact of the present invention thus forms between the anode and the hole injection layer.

Once the thickness of the hole injection layer reaches several nanometers immediately after the start of formation of the hole injection layer, the layer proceeds to form uniformly with the properties determined by the film forming conditions. Therefore, the characteristics of the elements in Table 5 and in FIGS. 17 through 20, in which the hole injection layer has a thickness of 30 nm, depend on the film forming conditions.

(Analysis of the Auxiliary Wiring, Schottky Ohmic Contact Between the Electron Injection Layer and the Hole Injection Layer)

Thus far, from the perspective of analyzing the anode of the hole injection layer and the organic EL element, carriers have been represented as holes, and current has been considered as flowing only from the anode to the hole injection layer. The Schottky ohmic contact between the electrode, such as the anode, and the hole injection layer according to an aspect the present invention is not limited to when current flows only from the electrode to the hole injection layer.

As described above, the occupied energy level near the Fermi surface is produced within a structure similar to an oxygen vacancy by an electron in the 5d orbital of a tungsten atom not bound with an oxygen atom. Unlike electrons in the valence band or electrons of organic molecules, these carriers can move relatively freely. In other words, the occupied energy level near the Fermi surface is a donor energy level or a metallic energy level of an n-type semiconductor in which electrons flow easily. Accordingly, electrons can be easily exchanged with the electrode in both directions ("electrons" being replaceable by "holes"). It is precisely this ease of exchange that allows for Schottky ohmic contact. With a separate experiment, the inventors confirmed that electrons flow ohmically in both directions in a double layered structure composed of the hole injection layer according to an aspect of the present invention and each of ITO, IZO, Al, and Ba.

The above Schottky ohmic contact between the electrode and the hole injection layer according to an aspect of the present invention of course also forms between the auxiliary wiring and the hole injection layer, as well as between the hole injection layer and the electron injection layer. Carriers can therefore easily be exchanged between these layers. As a result, although located between the auxiliary wiring and the electron injection layer, the hole injection layer according to an aspect of the present invention does not block the injection of electrons from the hole injection layer to the electron injection layer nor from the auxiliary wiring to the hole injection layer. With respect to this point, the hole injection layer according to an aspect of the present invention differs greatly from a hole injection layer formed, for example, from copper phthalocyanine, PEDOT, or the like, in which injection of electrons from the auxiliary wiring is difficult.

As compared to when the auxiliary wiring and the electron injection layer are directly connected, the resistance of the connecting portion does increase due to the hole injection layer according to an aspect of the present invention being located between the auxiliary wiring and the electron injection layer. The resistivity of the hole injection layer according to an aspect of the present invention, however, is sufficiently low as compared to a typical functional layer composed of an organic substance. Furthermore, the thickness of the layer is at most several dozen nanometers in a typical organic EL element. Therefore, the contribution to resistance made by the hole injection layer according to an aspect of the present invention is extremely small as compared to the resistance of the entire organic EL display panel, which includes the light-emitting cells and the wiring portions. Accordingly, the interposition of the hole injection layer according to an aspect of the present invention in the connecting portion does not cause a substantial increase in the resistance of the wiring portion. An organic EL display panel adopting the hole injection layer according to an aspect of the present invention therefore does not require a step to prevent formation of the hole injection layer on the auxiliary wiring.

In addition, since adherents have been satisfactorily removed from the surface of the hole injection layer by the UV irradiation according to the present invention, adherents, which can be a cause of high resistivity, are prevented from being embedded between the hole injection layer and the electron injection layer in the connecting portion. This ensures a low resistance with stability.

In the present embodiment, the electron injection layer is layered onto the hole injection layer according to an aspect of the present invention in the connecting portion, yet the electron injection layer in the connecting portion is not absolutely necessary, and may be omitted. In this case, the hole injection layer and the common electrode are in direct Schottky ohmic contact, which again does not lead to an increase in the resistance of the wiring portion.

After forming the light-emitting layers, an electron transport layer composed mainly of organic material or inorganic material may be formed to be continuous on the light-emitting cells and the connecting portions. In this case, the hole injection layer according to an aspect of the present invention and the electron transport layer are adjacent in the connecting portions. As described above, the hole injection layer according to an aspect of the present invention has the characteristics of an n-type semiconductor or a metal due to an occupied energy level near the Fermi surface. Therefore, a so-called p-n junction does not occur at the interface with the electron transport layer, thus yielding an interface with a small energy barrier at which it is relatively easy to inject electrons to the electron transport layer from the hole injection layer according to an aspect of the present invention. With respect to this point as well, the hole injection layer according to an aspect of the present invention differs greatly from a hole injection layer formed, for example, from copper phthalocyanine, PEDOT, or the like, in which the exchange of electrons with the electron transport layer is difficult.

Note that in the organic EL display panel 110 of Embodiment 1, the anode 20 (first electrode) provided on the substrate 10 and the auxiliary wiring 30 are provided in parallel with the hole injection layer 40 therebetween. Since the anode 20 and the auxiliary wiring 30 are separated by several dozen micrometers, the problem does not arise of an anode 20 and auxiliary wiring 30 with opposite polarities causing a short circuit across the hole injection layer 40.

Embodiment 2

<Overall Structure of Organic EL Display Panel>

Figure 39A:
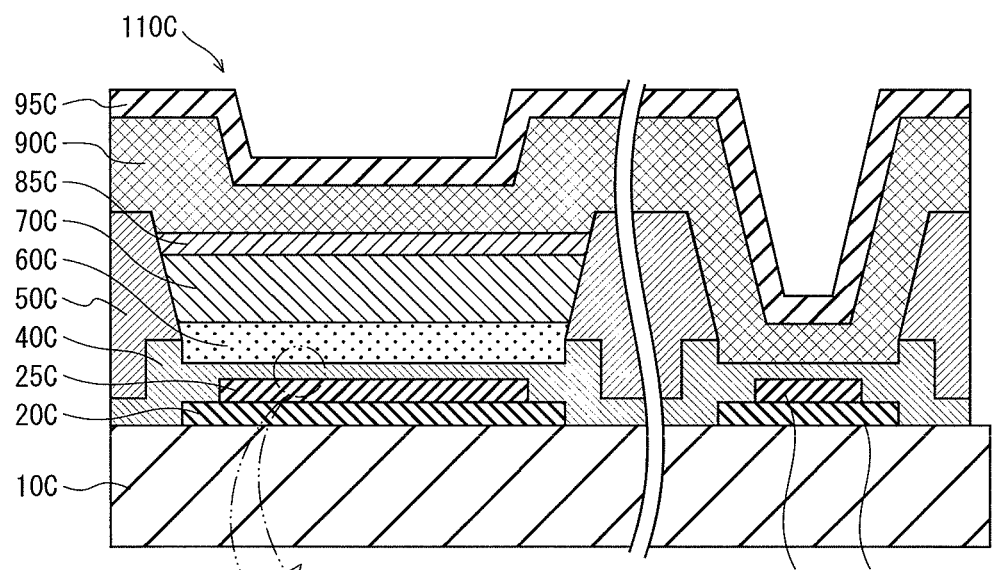
FIG. 39A is a cross-section diagram schematically showing the structure of an organic EL panel according to Embodiment 2.
Figure 39B:
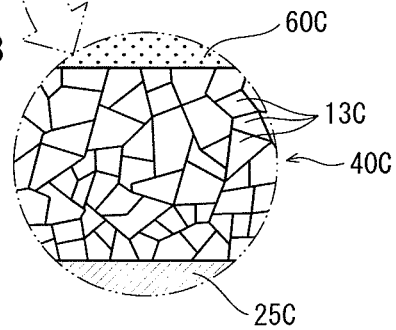
FIG. 39B is a partially expanded view near the hole injection layer.

FIG. 39A is a schematic cross-sectional view illustrating the structure of an organic EL display panel 110C according to the present embodiment. FIG. 39B is a partially expanded view near a hole injection layer 40C.

The organic EL display panel 110C is an application type display panel in which the functional layer is, for example, applied by a wet process. The hole injection layer 40C and a variety of functional layers that have a variety of functions and include organic material are layered together and placed between a pair of electrodes consisting of an anode 20C and a cathode 90C.

Specifically, the organic EL display panel 110C includes a substrate 10C having the following layered on the main side thereof in the following order: anodes 20C, ITO layers 25C, the hole injection layer 40C, buffer layers 60C, light-emitting layers 70C, electron injection layers 85C, the cathode 90C, and a sealing layer 95C. Furthermore, auxiliary wirings 30C are formed respectively at a distance from the anodes 20C on the main side of the substrate 10C. The ITO layer 25C, the hole injection layer 40C, the cathode 90C, and the sealing layer 95C are also layered on each auxiliary wiring 30C. The following description focuses on the differences from the organic EL display panel 110.

(Anode/Auxiliary Wiring)

The anodes 20C are provided in plurality in a matrix, with one anode 20C for each pixel, whereas the auxiliary wirings 30C are provided along the anodes 20C for each row of pixels.

(ITO Layer)

The ITO (indium tin oxide) layer 25C is provided between each anode 20C and the hole injection layer 40C and has the function of ensuring a good bond between the layers. In the organic EL display panel 110C, the ITO layers 25C and the anodes 20C are separate, but the ITO layers 25C may be considered part of the anodes 20C.

The ITO layer 25C is also provided between the auxiliary wiring 30C and the hole injection layer 40C. In the organic EL display panel 110C, the ITO layers 25C and the auxiliary wirings 30C are separate, but the ITO layers 25C may be considered part of the auxiliary wirings 30C.

(Hole Injection Layer)

Like the hole injection layer 40 in Embodiment 1, the hole injection layer 40C is a tungsten oxide layer formed under predetermined film forming conditions and having a thickness of at least 2 nm (in the present example, 30 nm). As a result, in the light-emitting cell (to the left of the wavy line in FIG. 39A indicating omission), the hole injection layer 40C and the buffer layer 60C establish an interface energy level alignment, with the ITO layers 25C and the hole injection layers 40C in Schottky ohmic contact. Furthermore, in the wiring portion (to the right of the wavy line in FIG. 39A indicating omission), the ITO layers 25C and the hole injection layer 40C, as well as the hole injection layer 40C and the cathode 90C, are in Schottky ohmic contact. In greater detail, these Schottky ohmic contacts mean that the Fermi level of the ITO layer 25C and the cathode 90C differs from the lowest binding energy of the occupied energy level near the Fermi surface of the hole injection layer 40C by within ±0.3 eV at a position that is 2 nm away from the surface of the ITO layer 25C or the cathode 90C towards the hole injection layer 40C. As a result, in the organic EL display panel 110C, the hole injection barrier between the ITO layer 25C and the hole injection layer 40C, as well as between the hole injection layer 40C and the buffer layer 60C, is moderated in the light-emitting cell as compared to a conventional structure. Furthermore, carriers are easily exchanged between the ITO layer 25C and the hole injection layer 40C, as well as between the hole injection layer 40C and the cathode 90C, in the wiring portion, thereby allowing for a good, low driving voltage.

In the composition formula WOx denoting the composition of the tungsten oxide constituting the hole injection layer 40 C, x is a real number existing within a range of approximately $2 < x < 3$. While it is desirable for the hole injection layer 40C to be formed only from highly pure tungsten oxide, the inclusion of a slight degree of impurities is acceptable, provided that the amount does not exceed the amount of impurities that might normally be incorporated.

Details on these predetermined film forming conditions for the hole injection layer 40C are described below.

In Embodiment 2, since the tungsten oxide layer constituting the hole injection layer 40C is formed under the predetermined conditions, the hole injection layer 4A includes abundant tungsten oxide crystals 13C as illustrated in FIG. 39B. The particle diameter of each crystal 13C is on the order of nanometers. As an example, if the thickness of the hole injection layer 40C is approximately 30 nm, the particle diameter of the crystals 13C is approximately between 3 and 10 nm. Hereinafter, the crystals 13C whose particle diameter is on the order of nanometers are referred to as "nanocrystals 13C", and a layered structure composed of nanocrystals 13C is referred to as a "nanocrystal structure". Note that apart from the nanocrystal structure, the hole injection layer 40C may include an amorphous structure.

In a hole injection layer 40C with the above nanocrystal structure, the tungsten atoms constituting the tungsten oxide are distributed to include both atoms at the maximum valence and atoms at a valence less than the maximum valence. Typically, the tungsten oxide layer includes a structure similar to an oxygen vacancy. In tungsten oxide with a crystal structure that does not have a structure similar to an oxygen vacancy, the maximum valence of the tungsten is a valence of six. On the other hand, in tungsten oxide with a crystal structure that has a structure similar to an oxygen vacancy, the valence of the tungsten is less than the maximum. Furthermore, the structure similar to an oxygen vacancy is typically abundant along the crystal surface.

Accordingly, in the organic EL display panel 110C, in addition to moderating the hole injection barrier and making the carrier exchange easier in the light-emitting cell or in the wiring portion, it is desirable to further improve the efficiency of hole and electron conduction by distributing tungsten atoms with a valence of five throughout the hole injection layer 40C to create structures similar to an oxygen vacancy. Specifically, in the light-emitting cell, by providing the holes injection layer 40C composed of tungsten oxide with the nanocrystal structure, the holes provided from the ITO layer 25C to the hole injection layer 40C are conducted along oxygen vacancies existing along the crystal interface of the nanocrystal 13C. Therefore, the nanocrystal structure allows for an increase in the number of paths by which holes are conducted, thus leading to an improvement in hole conduction efficiency. In the wiring portion, the electrons provided from the ITO layer 25C to the holes injection layer 40C are easily conducted along oxygen vacancies existing along the crystal interface. Therefore, the holes injection layer in the wiring portion has almost no influence on the resistance of the entire wiring. This efficiently reduces the driving voltage of the organic EL display panel 110C.

Additionally, the tungsten oxide forming the hole injection layer 40C has high chemical resistance, i.e. the tungsten oxide does not easily undergo undesired chemical reactions. Therefore, even if the hole injection layer 40C comes into contact with solvents or the like used during processes performed after formation of the hole injection layer 40C, damage to the hole injection layer 40C due to dissolution, degradation, or a change of properties is reduced. Forming the hole injection layer 40C from a material with high chemical resistance thus prevents a reduction in the efficiency of conduction of electrons and holes from the hole injection layer 40C.

The hole injection layer 40C formed from tungsten oxide in the present embodiment includes both the case of formation only with a nanocrystal structure and the formation with both a nanocrystal structure and an amorphous structure. Furthermore, it is desirable that the nanocrystal structure be present throughout the hole injection layer 40C. However, in the light-emitting cell, holes can be efficiently conducted from below the hole injection layer 40C to above the hole injection layer 40C as long as grain boundaries are connected in at least one location in the light-emitting cell from the interface where the ITO layer 25C contacts with the hole injection layer 40C to the interface where the hole injection layer 40C contacts with the buffer layer 60C. Likewise, in the wiring portion, electrons can be efficiently conducted from below the hole injection layer 40C to above the hole injection layer 40C as long as grain boundaries are connected in at least one location in the wiring portion from the interface where the ITO layer 25C contacts with the hole injection layer 40C to the interface where the hole injection layer 40C contacts with the cathode 90C.

Note that examples have been reported on in the past of using a layer that includes tungsten oxide crystals as the hole injection layer. For example, Non-Patent Literature 1 suggests that crystallizing a tungsten oxide layer by annealing at 450° C. improves the hole conduction efficiency. However, Non-Patent Literature 1 does not disclose the conditions for forming a tungsten oxide layer with a large area, nor the effects that tungsten oxide formed on the substrate as a hole injection layer has on other layers in the substrate. Non-Patent Literature 1 therefore does not demonstrate the potential for practical mass-production of a large organic EL display panel. Furthermore, Non-Patent Literature 2 does not disclose purposely forming tungsten oxide nanocrystals having a structure similar to an oxygen vacancy in the hole injection layer. The hole injection layer according to an aspect of the present invention is formed from a tungsten oxide layer that is resistant to chemical reactions, is stable, and can withstand the mass production process of large organic EL panels. Furthermore, purposely incorporating structures similar to an oxygen vacancy in the tungsten oxide layer achieves excellent hole and electron conduction efficiency, another decisive difference from conventional technology.

(Electron Injection Layer, Cathode, and Sealing Layer)

The electron injection layer 85C has a function to inject electrons from the cathode 90C to the light-emitting layer 70C. It is desirable that the electron injection layer 85C be, for example, a 5-nm thick layer of barium, or a 1-nm thick layer of lithium fluoride, sodium fluoride, or a combination thereof.

The cathode 90C is, for example, composed of an ITO layer with a thickness of approximately 100 nm.

A direct current power supply is connected to the anodes 20C and to the auxiliary wirings 30C to supply power from an external source to the organic EL display panel 110C.

The sealing layer 95C has a function to seal the organic EL display panel 110C from being exposed to water or air. The sealing layer 95C is, for example, formed from a material such as SiN (Silicon nitride) or SiON (Silicon oxynitride). In the case where the organic EL element 1C is of the top emission type, the sealing layer 9 is preferably formed from a light-transmissive material.

<Method of Manufacturing Organic EL Display Panel>

The following describes an example of a method for manufacturing the entire organic EL display panel 110C, with reference to FIGS. 40 through 42.

Figure 40A:
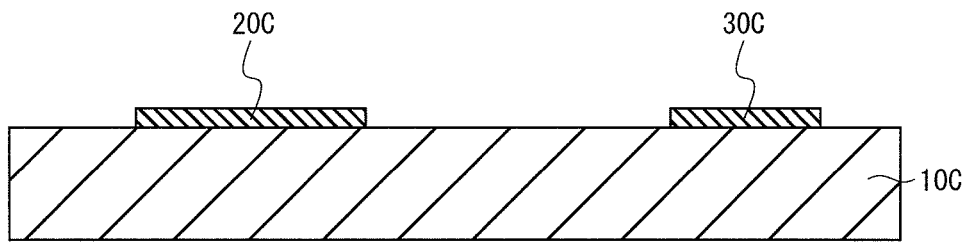
FIGS. 40A through 40C are process drawings illustrating a method of manufacturing an organic EL panel according to Embodiment 2.

First, a thin film of silver is formed by sputtering, for example, on the substrate 10C. The thin film is then patterned by, for example, photolithography to form the anodes 20C and the auxiliary wirings 30C in a matrix (FIG. 40A). Note that the thin film may be formed by another method such as vacuum deposition.

Figure 40B:
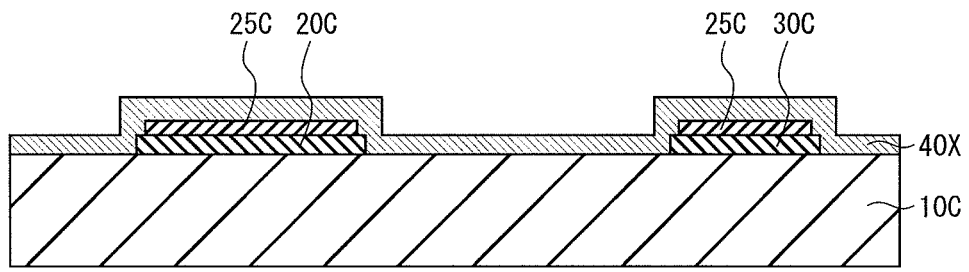

Next, an ITO thin film is formed by sputtering, for example, and is patterned by photolithography, for example, to form the ITO layer 25C on each anode 20C and auxiliary wiring 30C. A thin film 40X containing tungsten oxide is then formed under the predetermined film forming conditions described below (FIG. 40B).

Figure 40C:
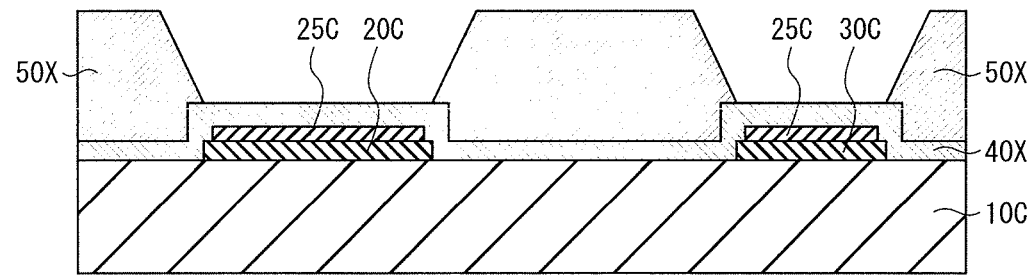

Subsequently, a bank material layer 50X is formed on the thin film 40X with bank material composed of organic material. A portion of the bank material layer 50X is removed to expose a portion of the thin film 40X (FIG. 40C). The bank material layer 50X is formed by application or by another method. The bank material layer 50X can be removed by patterning with a predetermined developer (a solution of tetramethylammonium hydroxide (TMAH) or the like).

Figure 41A:
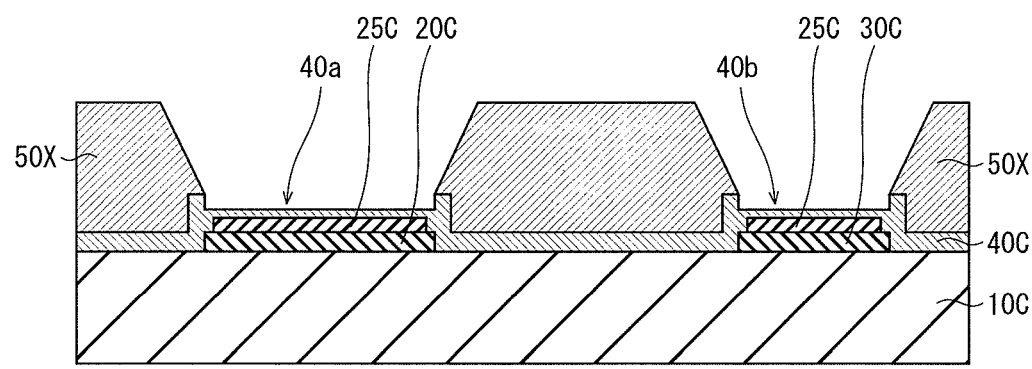
FIGS. 41A and 41B are process drawings illustrating a method of manufacturing an organic EL panel according to Embodiment 2.

While the tungsten oxide forming the thin film 40X has good chemical resistance, it has the property of slightly dissolving in TMAH solution. Therefore, washing off the bank residue remaining on the surface of the thin film 40X with the above developer causes the exposed portion of the thin film 40X to erode, leading to formation of a concave structure (FIG. 41A). As a result, the hole injection layer 40C includes a concavity 40a corresponding to the anode 20C and a concavity 40b corresponding to the auxiliary wiring 30C.

Figure 41B:
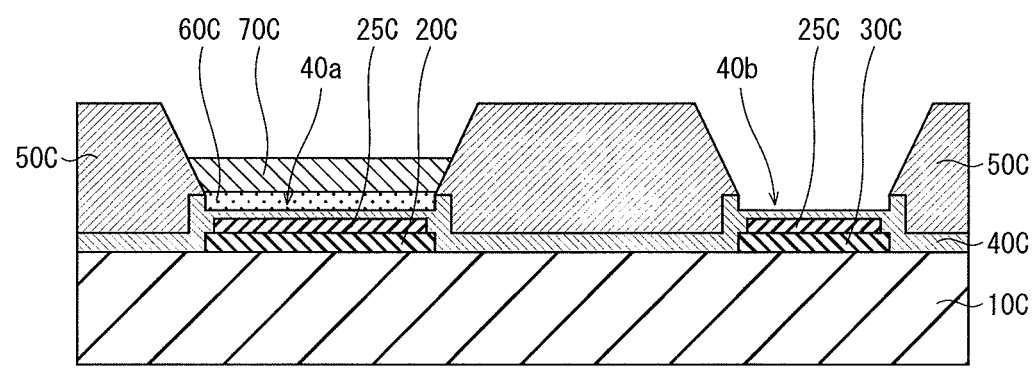

Next, repellency treatment is performed on the surface of the bank material layer 50X using fluorine plasma, for example, to form the banks 50C. Subsequently, an ink composition containing organic material is dripped, for example using the inkjet method, into a region corresponding to the anode 20C as defined by the banks 50C. The ink is then dried, thereby forming the buffer layer 60C and the light-emitting layer 70C (FIG. 41B). The buffer layer 60C and the light-emitting layer 70C are not formed in a region corresponding to the auxiliary wiring 30C as defined by the banks 50C. Note that ink may be dripped with a different method such as the dispenser method, the nozzle coating method, the spin coating method, intaglio printing, or relief printing.

Figure 42A:
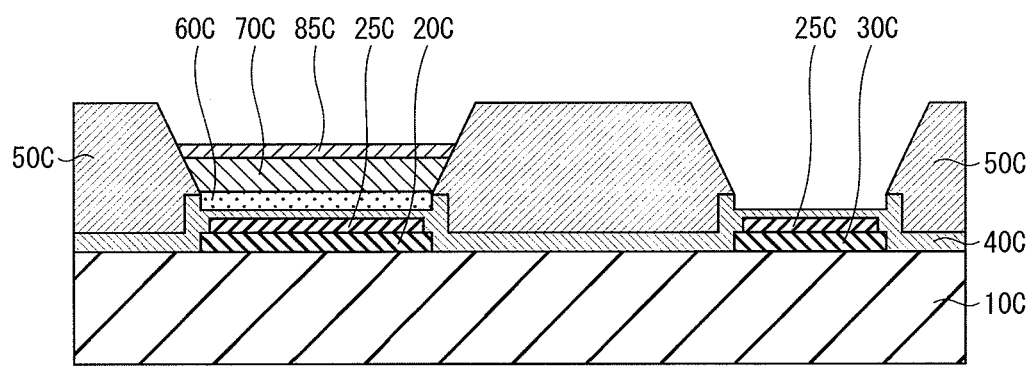
FIGS. 42A through 42C are process drawings illustrating a method of manufacturing an organic EL panel according to Embodiment 2.

Next, a thin film of barium constituting the electron injection layer 85C is formed on the light-emitting layer 70C with vacuum deposition, for example (FIG. 42A).

Figure 42B:
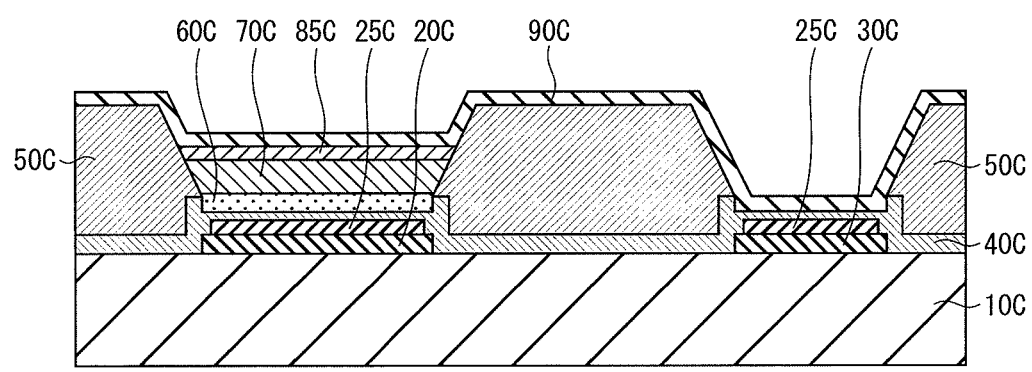

An ITO thin film constituting the cathode 90C is then formed across the entire surface by sputtering, for example (FIG. 42B).

Figure 42C:
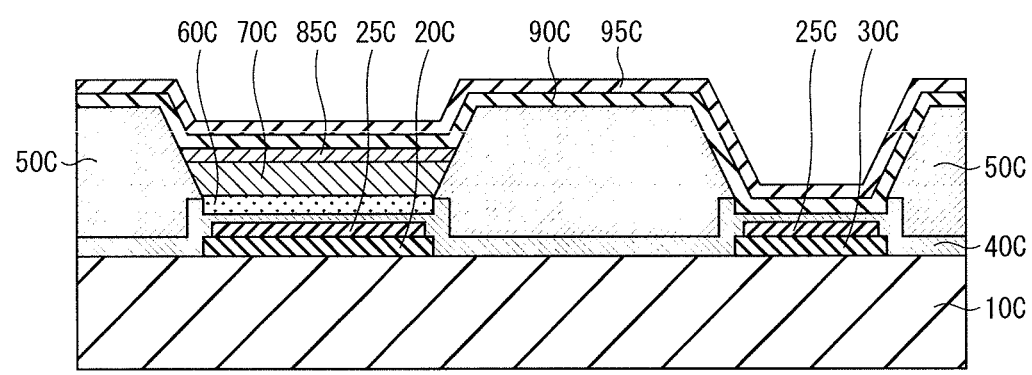

Next, on the cathode 90C, the sealing layer 95C is formed (FIG. 42C).

This completes the organic EL display panel 110C.

The following describes the film forming conditions for the hole injection layer 40C (thin film 40X). It is desirable that the hole injection layer 40C (thin film 40X) be formed with the reactive sputtering method. Specifically, metal tungsten is placed in the chamber as the sputtering target, with argon gas as the sputtering gas and oxygen gas as the reactive gas. Under these conditions, the argon is ionized by the application of high voltage and caused to bombard the sputtering target. The metal tungsten ejected as a result of the sputtering phenomenon reacts with the oxygen gas to produce tungsten oxide, thus forming the tungsten oxide layer on the ITO layer 25C.

Desirable film forming conditions are as follows. (1) The total pressure of gas in the chamber should be at least 2.3 Pa and at most 7.0 Pa. (2) The partial pressure of the oxygen gas with respect to the total pressure should be at least 50% and at most 70%. (3) The input power (input power density) per unit area of the target should be at least 1.5 W/cm$^2$ and at most 6.0 W/cm$^2$. (4) The value yielded by dividing the total pressure by the input power density should be larger than 0.7·Pa cm$^2$/W. The hole injection layer 40C composed of tungsten oxide having a nanocrystal structure is formed under these film forming conditions.

(Another Example of Steps from Formation of Anodes and Auxiliary Wiring to Formation of Banks)

Next, with reference to FIGS. 43A through 44C, another example of the process from the formation of anodes and auxiliary wiring to the formation of banks is described. Note that in this process, an example of a structure for forming a planarizing layer 17C on the surface of the substrate 10C is described.

Figure 43A:
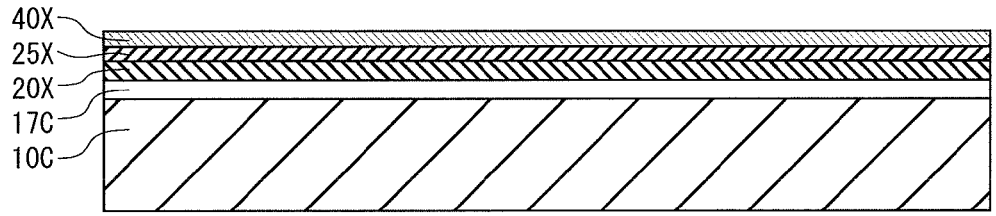
FIGS. 43A through 43D are process drawings illustrating a method of manufacturing an organic EL panel according to a modification of Embodiment 2.

First, a planarizing layer 17C is formed on the substrate 10C from an insulating resin material such as polyimide or acrylic. With the vapor deposition method, the following three layers are layered sequentially on the planarizing layer 17C: an Al alloy thin film 20X, an IZO thin film 25X, and a thin film (tungsten oxide film) 40X (FIG. 43A). ACL (aluminum-cobalt-lanthanum) material, for example, is used as the Al alloy material.

Figure 43B:
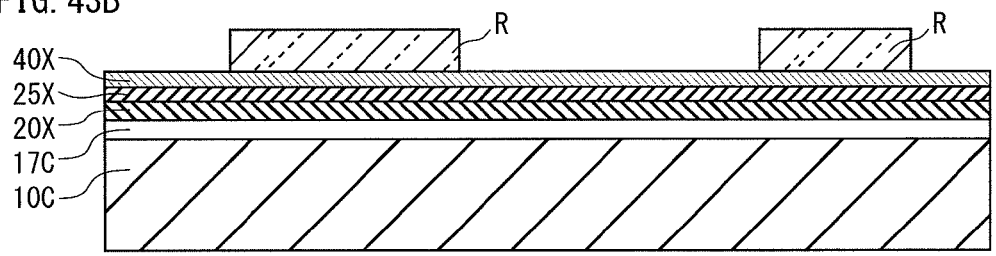

Next, a resist pattern R is formed by photolithography in the regions in which the three layers for the anode 20C, the IZO layer 25D, and the hole injection layer 40D are formed, as well as the regions in which the three layers for the auxiliary wiring 30C, the IZO layer 25D, and the hole injection layer 40D are formed (FIG. 43B).

Figure 43C:
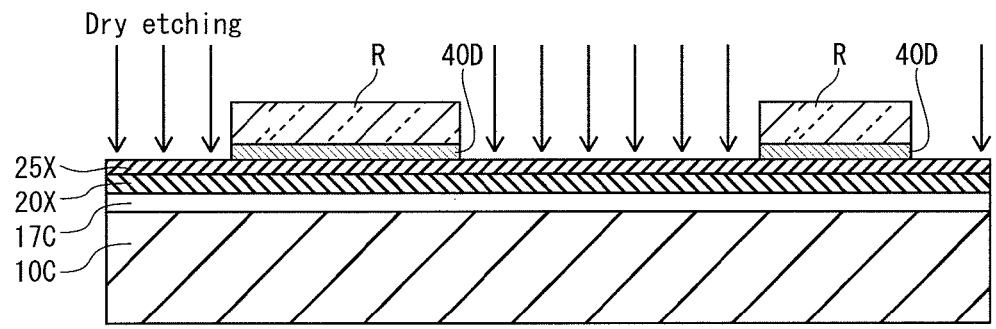

Next, patterning is performed by dry etching (D/E) of the regions of the thin film 40X not covered by the resist pattern R (FIG. 43C). During this dry etching, only the thin film 40X is selectively etched with either a mixture of fluorinated gas and $N_2$ gas, or a mixture of fluorinated gas and $O_2$ gas. The following is an example of specific setting conditions for the dry etching.

[Conditions for Dry Etching]
  Target of treatment: tungsten oxide film
  Etching gas: fluorine-containing gas ($SF_6$, $CF_4CHF_3$)
  Mixed gas: $O_2$, $N_2$
  Mixed gas ratio: $CF_4:O_2$=160:40
  Supplied power: Source 500 W, Bias 400 W
  Pressure: between 10 mTorr and 50 mTorr
  Etching temperature: room temperature Performing the above dry etching yields the hole injection layer 40D. Subsequently, asking is performed with $O_2$ gas to facilitate removal of the resist pattern during the following wet etching (W/E) process.

Figure 43D:
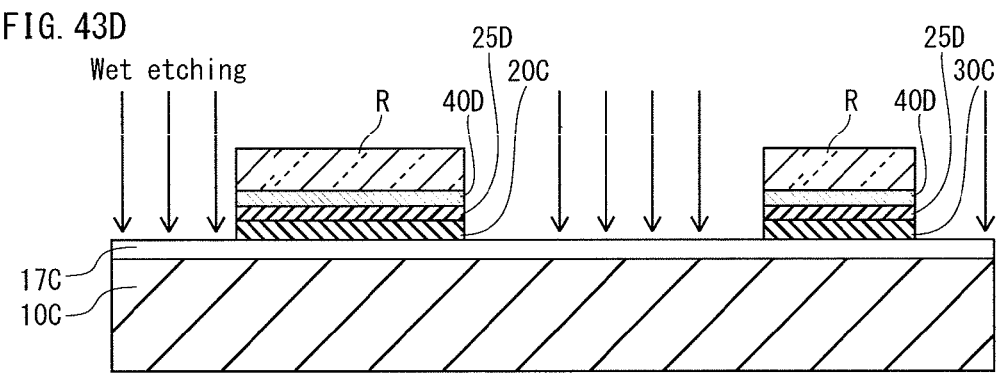

Via wet etching, the regions of the IZO thin film 25X and the Al alloy thin film 20X not covered by the resist pattern R are patterned (FIG. 43D). Using a mixed solution of containing nitric acid, phosphoric acid, acetic acid, and water as the etchant, wet etching is performed simultaneously on both the IZO thin film 25X and the Al alloy thin film 20X.

The following is an example of specific setting conditions for the wet etching.

[Conditions for Wet Etching]

Target of treatment: IZO thin film and Al alloy thin film

Etchant: mixed aqueous solution of nitric acid, phosphoric acid, and acetic acid Blend ratio of solvent: not specified (mixing is possible under typical conditions)

Etching temperature: lower than room temperature

Note that to perform the wet etching well, it is desirable that the IZO thin film 25X, which is the uppermost layer, be a thickness of 20 nm or less. This is because the amount of side etching grows large if the thickness exceeds 20 nm.

Instead of forming an IZO layer from an IZO thin film, an ITO layer may of course be formed from an ITO thin film.

Figure 44A:
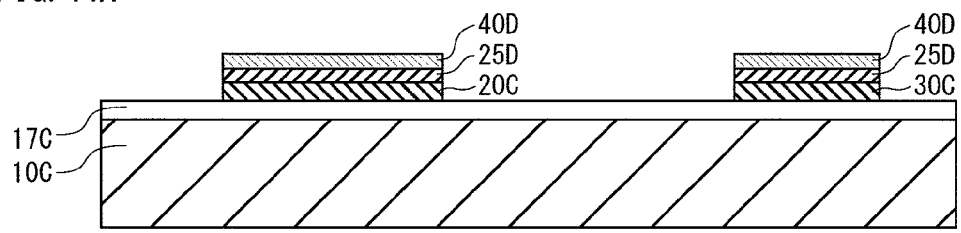
FIGS. 44A through 44C are process drawings illustrating a method of manufacturing an organic EL panel according to a modification of Embodiment 2.

The anode 20C and the IZO layer 25D, as well as the auxiliary wiring 30C and the IZO layer 25D, are formed through the above processes. Subsequently, the resist pattern R is removed through a resist removing step, yielding a patterned triple layer structure composed of the anode 20C, the IZO layer 25D, and the hole injection layer 40D and a pattern triple layer structure composed of the auxiliary wiring 30C, the IZO layer 25D, and the hole injection layer 40D (FIG. 44A). During this process, the hole injection layer 40D is formed in locations corresponding to the anode 20C and the IZO layer 25D as well as locations corresponding to the auxiliary wiring 30C and the IZO layer 25D.

Figure 44B:
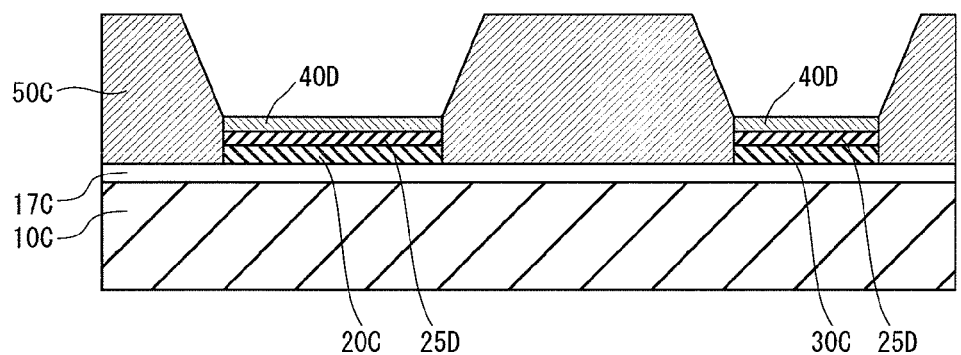

Next, the bank material layer 50X is formed on the exposed surface of the planarizing layer 17C (not shown in the figures) and is patterned to form the banks 50C (FIG. 44B).

Figure 44C:
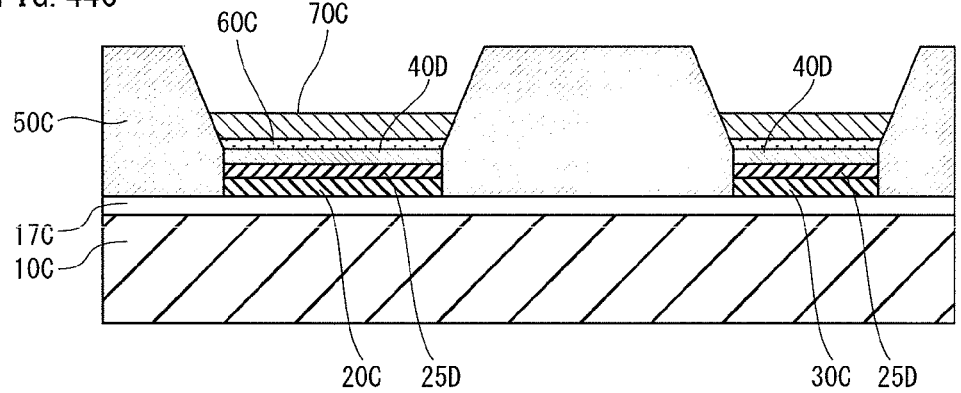

Note that with the above • described method, the buffer layers 60C and the light-emitting layers 70C can be formed by adjusting the predetermined ink, dripping the ink successively into regions partitioned by the banks 50 C, and drying the ink (FIG. 44C).

<Other Considerations>

While an organic EL display panel and organic EL display apparatus according to an aspect of the present invention have been concretely described, the above embodiments are merely examples for clearly illustrating the operations and advantageous effects of an aspect of the present invention. The present invention is in no way limited to the above embodiments. For example, the size and the material listed for each component are merely typical examples to facilitate comprehension; the present invention is in no way limited to these sizes and materials.

An organic EL display panel according to an aspect of the present invention may be either a top emission type panel or a bottom emission type panel.

Instead of the structure shown in FIGS. 1A and 1B, a top emission type panel may adopt the structure in which the pixel electrodes and the auxiliary wirings are only a metal film. In this case, the light-emitting cell is composed, for example, of the following in order from the substrate: pixel electrode (metal film)/hole injection layer/buffer layer/light-emitting layer/electron injection layer/common electrode (transparent conductive film). The connecting portion is composed, for example, of the following in order from the substrate: auxiliary wiring (metal film)/hole injection layer/electron injection layer/common electrode (transparent conductive film).

On the other hand, in a bottom emission type panel, the pixel electrodes and the auxiliary wirings are, for example, formed by a transparent conductive film, whereas the common electrode is formed by a metal film. The light-emitting cell is composed, for example, of the following in order from the substrate: pixel electrode (transparent conductive film)/hole injection layer/buffer layer/light-emitting layer/electron injection layer/common electrode (metal film). The connecting portion is composed, for example, of the following in order from the substrate: auxiliary wiring (transparent conductive film)/hole injection layer/electron injection layer/common electrode (metal film).

Furthermore, an aspect of the present invention may also be adopted in a double-sided emission type panel. In this case, the light-emitting cell is composed, for example, of the following in order from the substrate: pixel electrode (transparent conductive film)/hole injection layer/buffer layer/light-emitting layer/electron injection layer/common electrode (transparent conductive film). The connecting portion is composed, for example, of the following in order from the substrate: auxiliary wiring (transparent conductive film)/hole injection layer/electron injection layer/common electrode (transparent conductive film). A structure may also be adopted that partially provides a metal film as the auxiliary wiring.

In the above embodiments, the electron injection layer below the common electrode is not limited to being a metal layer. Either or both of an electron injection layer and an electron transport layer composed mainly of an organic material or an inorganic material may be adopted.

INDUSTRIAL APPLICABILITY

The organic EL element pertaining to the present invention is to be used as display elements for mobile phone displays and TVs, and as a light source for various applications. Regardless of the specific use thereof, the organic EL element of the present invention is applicable as an organic EL element having a wide range of luminous intensity from low luminous intensity to high luminous intensity for the use as a light source or the like, and which can be driven at a low voltage. The organic EL element of the present invention, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

REFERENCE SIGNS LIST 10, 10C substrate
20, 20C first electrode
30, 30C auxiliary wiring (wiring)
40, 40C hole injection layer (tungsten oxide layer)
45 aperture
50, 50C bank
70, 70C light-emitting layer (organic layer)
80 metal layer (electron injection layer)
90, 90C second electrode
100 organic EL display apparatus
110, 110C organic EL display panel

The invention claimed is:
1. An organic EL display panel comprising:
a substrate;
a first electrode on or in the substrate;
auxiliary wiring on or in the substrate at a distance from the first electrode;
a functional layer, including at least a light-emitting layer, above the first electrode;
a hole injection layer for injecting holes to the functional layer, the hole injection layer being between the first electrode and the functional layer; and a second electrode, above the functional layer, wherein
the hole injection layer and the second electrode are both formed to be continuous above the first electrode and above the auxiliary wiring,
the second electrode and the auxiliary wiring are electrically connected by the hole injection layer, and
the hole injection layer contains a tungsten oxide,
an UPS spectrum, obtained from a UPS measurement, having a protrusion appearing near a Fermi surface and within a region corresponding to a binding energy range lower than a top of a valence band,
the tungsten oxide contained in the hole injection layer satisfying a condition, determined from an XPS measurement, that a ratio in a number density of atoms other than tungsten atoms and oxygen atoms to the tungsten atoms does not exceed 0.83.

2. The organic EL display panel of claim 1, wherein the second electrode is a transparent electrode.

3. The organic EL display panel of claim 2, wherein the transparent electrode is made up from one of ITO and IZO.

4. The organic EL display panel of claim 1, wherein the second electrode has one of Al and Ag as a primary component.

5. The organic EL display panel of claim 1, further comprising:
a metal layer formed to be continuous above the first electrode and above the auxiliary wiring, wherein
above the first electrode, the metal layer is between the second electrode and the light-emitting layer, and above the auxiliary wiring, the metal layer is between the second electrode and the hole injection layer.

6. The organic EL display panel of claim 5, wherein the metal layer is an electron injection layer that, above the first electrode, injects electrons from the second electrode to the light-emitting layer.

7. The organic EL display panel of claim 6, wherein the metal layer includes Ba.

8. The organic EL display panel of claim 1, wherein the auxiliary wiring is made up from one of ITO and IZO.

9. The organic EL display panel of claim 1, wherein the hole injection layer above the auxiliary wiring has properties identical to the hole injection layer above the first electrode.

10. The organic EL display panel of claim 1, wherein at least above the auxiliary wiring, the hole injection layer is at least 4 nm thick.

11. The organic EL display panel of claim 1, further comprising:
a bank on the hole injection layer defining an aperture above the first electrode, wherein
the functional layer is formed in the aperture defined by the bank.

12. The organic EL display panel of claim 11, wherein the first electrode comprises a plurality of first electrodes, one per pixel, and
the aperture in the bank comprises a plurality of apertures formed in one-to-one correspondence with the first electrodes.

13. The organic EL display panel of claim 11, wherein the first electrode comprises a plurality of first electrodes, one per pixel, arranged in lines, and
the aperture in the bank comprises a plurality of apertures, one for each of the lines of the first electrodes.

14. The organic EL display panel of claim 1, wherein in the UPS spectrum, the protrusion appears within the bonding energy range that is from 1.8 eV to 3.6 eV lower than the top of the valance band.

15. The organic EL display panel of claim 1, wherein the ratio in the number density of the other atoms to the tungsten atoms does not exceed 0.62.

16. The organic EL display panel of claim 1, wherein the atoms other than tungsten atoms and oxygen atoms comprise carbon atoms.

17. The organic EL display panel of claim 1, wherein the hole injection layer is irradiated with ultraviolet light so that
the UPS spectrum obtained from the UPS measurement has the protrusion appearing near the Fermi surface and within the region corresponding to the binding energy range lower than the top of a valence band, and
the tungsten oxide contained in the hole injection layer satisfies the condition, as determined by the XPS measurement, that the ratio in the number density of atoms other than tungsten atoms and oxygen atoms to the tungsten atoms does not exceed 0.83.

18. An organic EL display apparatus having the organic EL display panel of claim 1.

19. An organic EL display panel comprising:
a substrate;
a first electrode on or in the substrate;
wiring on or in the substrate at a distance from the first electrode;
an organic layer, including organic material, above the first electrode;
a tungsten oxide layer, including a tungsten oxide, between the organic layer and the first electrode; and
a second electrode above the organic layer, wherein
the tungsten oxide layer and the second electrode are both formed to be continuous above the first electrode and above the wiring,
the second electrode and the wiring are electrically connected by the tungsten oxide layer,
an UPS spectrum of the tungsten oxide layer, obtained from a UPS measurement, has a protrusion appearing near a Fermi surface and within a region corresponding to a binding energy range lower than a top of a valence band, and
the tungsten oxide satisfies a condition, determined from an XPS measurement, that a ratio in a number density of atoms other than tungsten atoms and oxygen atoms to the tungsten atoms does not exceed 0.83.

20. An organic EL display apparatus having the organic EL display panel of claim 19.

21. An organic EL display panel comprising:
a substrate;
a first electrode on or in the substrate;
auxiliary wiring on or in the substrate at a distance from the first electrode;
a functional layer, including at least a light-emitting layer, above the first electrode;
a hole injection layer for injecting holes to the functional layer, the hole injection layer being between the first electrode and the functional layer; and
a second electrode, above the functional layer, wherein
the hole injection layer and the second electrode are both formed to be continuous above the first electrode and above the auxiliary wiring,
the second electrode and the auxiliary wiring are electrically connected by the hole injection layer, and the hole injection layer contains a tungsten oxide,
an UPS spectrum, obtained from a UPS measurement, having:
a protrusion appearing near a Fermi surface and within a region corresponding to a binding energy range lower than a top of a valence band; and
a peak appearing within a region corresponding to a binding energy range from 4.5 eV to 5.4 eV.

22. The organic EL display panel of claim 21, wherein in the UPS spectrum, the protrusion appears within the region corresponding to the binding energy range from 1.8 eV to 3.6 eV lower than the top of the valance band.

23. The organic EL display panel of claim 21, wherein the hole injection layer is irradiated with ultraviolet light so that
the UPS spectrum obtained from the UPS measurement has:
the protrusion appearing near the Fermi surface and within the region corresponding to the binding energy range lower than the top of a valence band; and
the peak appearing within the region corresponding to the binding energy range from 4.5 eV to 5.4 eV.

24. An organic EL display apparatus having the organic EL display panel of claim 21.

25. An organic EL display panel comprising:
a substrate;
a first electrode on or in the substrate;
wiring on or in the substrate at a distance from the first electrode;
an organic layer, including organic material, above the first electrode;
a tungsten oxide layer, including a tungsten oxide, between the organic layer and the first electrode; and
a second electrode above the organic layer, wherein
the tungsten oxide layer and the second electrode are both formed to be continuous above the first electrode and above the wiring,
the second electrode and the wiring are electrically connected by the tungsten oxide layer, and
an UPS spectrum of the tungsten oxide layer, obtained from a UPS measurement, has:
a protrusion appearing near a Fermi surface and within a region corresponding to a binding energy range lower than a top of a valence band; and
a peak appearing within a region corresponding to a binding energy range from 4.5 eV to 5.4 eV.

26. An organic EL display apparatus having the organic EL display panel of claim 25.

* * * * *